United States Patent
Schluessler et al.

(10) Patent No.: US 10,936,214 B2
(45) Date of Patent: *Mar. 2, 2021

(54) POWER MANAGEMENT OF MEMORY CHIPS BASED ON WORKING SET SIZE

(71) Applicant: Intel Corporation, Santa Clara, CA (US)

(72) Inventors: Travis T. Schluessler, Berthoud, CO (US); Prasoonkumar Surti, Folsom, CA (US); Aravindh V. Anantaraman, Folsom, CA (US); Abhishek R. Appu, El Dorado Hills, CA (US); Joydeep Ray, Folsom, CA (US); Altug Koker, El Dorado Hills, CA (US); Balaji Vembu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/441,338

(22) Filed: Jun. 14, 2019

(65) Prior Publication Data

US 2019/0377503 A1    Dec. 12, 2019

Related U.S. Application Data

(63) Continuation of application No. 15/482,971, filed on Apr. 10, 2017, now Pat. No. 10,365,843.

(51) Int. Cl.
*G06F 3/06* (2006.01)
*G06F 1/3234* (2019.01)
*G06F 1/3225* (2019.01)
*G11C 11/406* (2006.01)
*G11C 11/4074* (2006.01)

(52) U.S. Cl.
CPC .......... *G06F 3/0625* (2013.01); *G06F 1/3225* (2013.01); *G06F 1/3275* (2013.01); *G06F 3/065* (2013.01); *G06F 3/0673* (2013.01); *G11C 11/4074* (2013.01); *G11C 11/40615* (2013.01); *G11C 2211/4067* (2013.01)

(58) Field of Classification Search
CPC .................................................. G06F 1/3275
See application file for complete search history.

(56) References Cited

U.S. PATENT DOCUMENTS 8,959,515 B2    2/2015  Qin
10,365,843 B2 *  7/2019  Schluessler .......... G06F 1/3275
(Continued)

OTHER PUBLICATIONS

Nvida, "Nvidia Turing GPU Architecture; Graphics Reinvented," Whiepaper, 2018, 86 pages, WP-09183-001_v01, Nvidia, Santa Clara, CA.

(Continued)

*Primary Examiner* — Edward J Dudek, Jr.
(74) *Attorney, Agent, or Firm* — Spectrum IP Law Group LLC

(57) ABSTRACT

Briefly, in accordance with one or more embodiments, an apparatus comprises a memory comprising one or more physical memory chips, and a processor to implement a working set monitor to monitor a working set resident in the one or more physical memory chips. The working set monitor is to adjust a number of the physical memory chips that are powered on based on a size of the working set.

20 Claims, 35 Drawing Sheets

(56) References Cited

U.S. PATENT DOCUMENTS

| | | | |
|---|---|---|---|
| 2011/0029797 A1* | 2/2011 | Vaden | G06F 1/3275 713/324 |
| 2016/0062947 A1 | 3/2016 | Chetlur et al. | |
| 2018/0293011 A1 | 10/2018 | Schluessler et al. | |

OTHER PUBLICATIONS

Lindholm, et al., "Nvidia Tesla: A Unified Graphics and Computing Architecture," journal, Mar.-Apr. 2008, pp. 39-55, 0272-1732/08, IEEE Computer Society, Washington D.C.

Shane Cook, "CUDA Programming; A Developers Guide to Parallel Computing with GPUs," book, 2013, 591 pages, ISBN: 978-0-12-415933-4, Morgan Kaufmann, Waltham, MA.

Nicholas Wilt, "The CUDA Handbook: A Comprehensive Guide to GPU Programming," Jun. 10, 2013, 7 pages, ISBN 0134852745, Pearson Education, New York, NY.

Goodfellow, et al., "Adaptive Computation and Machine Learning Series," Book, Nov. 18, 2016, pp. 98-165, Chapter 5, The MIT Press, Cambridge, MA.

Ross, et al., "Intel Processor Graphics: Architecture & Programming," Power Point Presentation, Aug. 2015, 78 pages, Intel Corporation, Santa Clara, CA.

Shane Cook, "CUDA Programming," Book, 2012, pp. 37-52, Chapter 3, Elsevier Inc., Amsterdam Netherlands.

Nicholas Wilt, "The CUDA Handbook; A Comprehensive Guide to GPU Programming," Book, Jun. 22, 2013, pp. 41-57, Addison-Wesley Professional, Boston, MA.

Stephen Junking, "The Compute Architecture of Intel Processor Graphics Gen9," paper, Aug. 14, 2015, 22 pages, Version 1.0, Intel Corporation, Santa Clara, CA.

\* cited by examiner

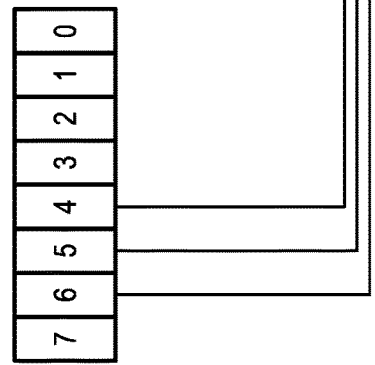
FIG. 17

GRAPHICS PROCESSOR COMMAND FORMAT
1900

GRAPHICS PROCESSOR COMMAND SEQUENCE
1910

POWER MANAGEMENT OF MEMORY CHIPS BASED ON WORKING SET SIZE

RELATED APPLICATIONS

This application is a continuation and claims priority under 35 U.S.C. § 120 of pending U.S. patent application Ser. No. 15/482,971, filed Apr. 10, 2017, entitled POWER MANAGEMENT OF MEMORY CHIPS BASED ON WORKING SET SIZE. The entire disclosure(s) of these documents are incorporated by reference herein for all purposes.

FIELD

Embodiments relate generally to data processing and more particularly to data processing via a general-purpose graphics processing unit. For example, some embodiments related to techniques to provide power management of memory chips based on working set size.

BACKGROUND

Memory capacities have been steadily increasing over the past few years, for example for dynamic random access memory (DRAM), and the trend is expected to continue. While the large capacity is used in bursts when applications are running, a large portion of the memory is unused for a large portion of time. The entire memory, however, is powered up all the time and is continuously refreshed. DRAM memories need to be refreshed periodically since they leak charge over time. If a large portion of memory is not being used, then the useless data in the unused portions of the memory is still being refreshed, which wastes both power and performance.

As integrated circuit fabrication technology improves, manufacturers are able to integrate additional functionality onto a single silicon substrate. As the number of the functions increases, so does the number of components on a single Integrated Circuit (IC) chip. Additional components add additional signal switching, in turn, generating more heat and/or consuming more power. The additional heat may damage components on the chip by, for example, thermal expansion. Also, the additional power consumption may limit usage locations and/or usage models for such devices, e.g., especially for devices that rely on battery power to function. Hence, efficient power management can have a direct impact on efficiency, longevity, as well as usage models for electronic devices.

Moreover, current parallel graphics data processing includes systems and methods developed to perform specific operations on graphics data such as, for example, linear interpolation, tessellation, rasterization, texture mapping, depth testing, etc. Traditionally, graphics processors used fixed function computational units to process graphics data; however, more recently, portions of graphics processors have been made programmable, enabling such processors to support a wider variety of operations for processing vertex and fragment data.

To further increase performance, graphics processors typically implement processing techniques such as pipelining that attempt to process, in parallel, as much graphics data as possible throughout the different parts of the graphics pipeline. Parallel graphics processors with single instruction, multiple thread (SIMT) architectures are designed to maximize the amount of parallel processing in the graphics pipeline. In an SIMT architecture, groups of parallel threads attempt to execute program instructions synchronously together as often as possible to increase processing efficiency. A general overview of software and hardware for SIMT architectures can be found in Shane Cook, *CUDA Programming*, Chapter 3, pages 37-51 (2013) and/or Nicholas Wilt, CUDA Handbook, *A Comprehensive Guide to GPU Programming*, Sections 2.6.2 to 3.1.2 (June 2013).

BRIEF DESCRIPTION OF THE DRAWINGS

So that the manner in which the above recited features of the present embodiments can be understood in detail, a more particular description of the embodiments, briefly summarized above, may be had by reference to embodiments, some of which are illustrated in the appended drawings. It is to be noted, however, that the appended drawings illustrate only typical embodiments and are therefore not to be considered limiting of its scope.

FIG. 17 is a block diagram illustrating a graphics processor instruction formats according to some embodiments.

DETAILED DESCRIPTION

In some embodiments, a graphics processing unit (GPU) is communicatively coupled to host/processor cores to accelerate graphics operations, machine-learning operations, pattern analysis operations, and various general purpose GPU (GPGPU) functions. The GPU may be communicatively coupled to the host processor/cores over a bus or another interconnect (e.g., a high-speed interconnect such as PCIe or NVLink). In other embodiments, the GPU may be integrated on the same package or chip as the cores and communicatively coupled to the cores over an internal processor bus/interconnect (i.e., internal to the package or chip). Regardless of the manner in which the GPU is connected, the processor cores may allocate work to the GPU in the form of sequences of commands/instructions contained in a work descriptor. The GPU then uses dedicated circuitry/logic for efficiently processing these commands/instructions.

In the following description, numerous specific details are set forth to provide a more thorough understanding. It will be apparent, however, to one of skill in the art that the embodiments described herein may be practiced without one or more of these specific details. In other instances, well-known features have not been described to avoid obscuring the details of the present embodiments.

System Overview

Figure 1:
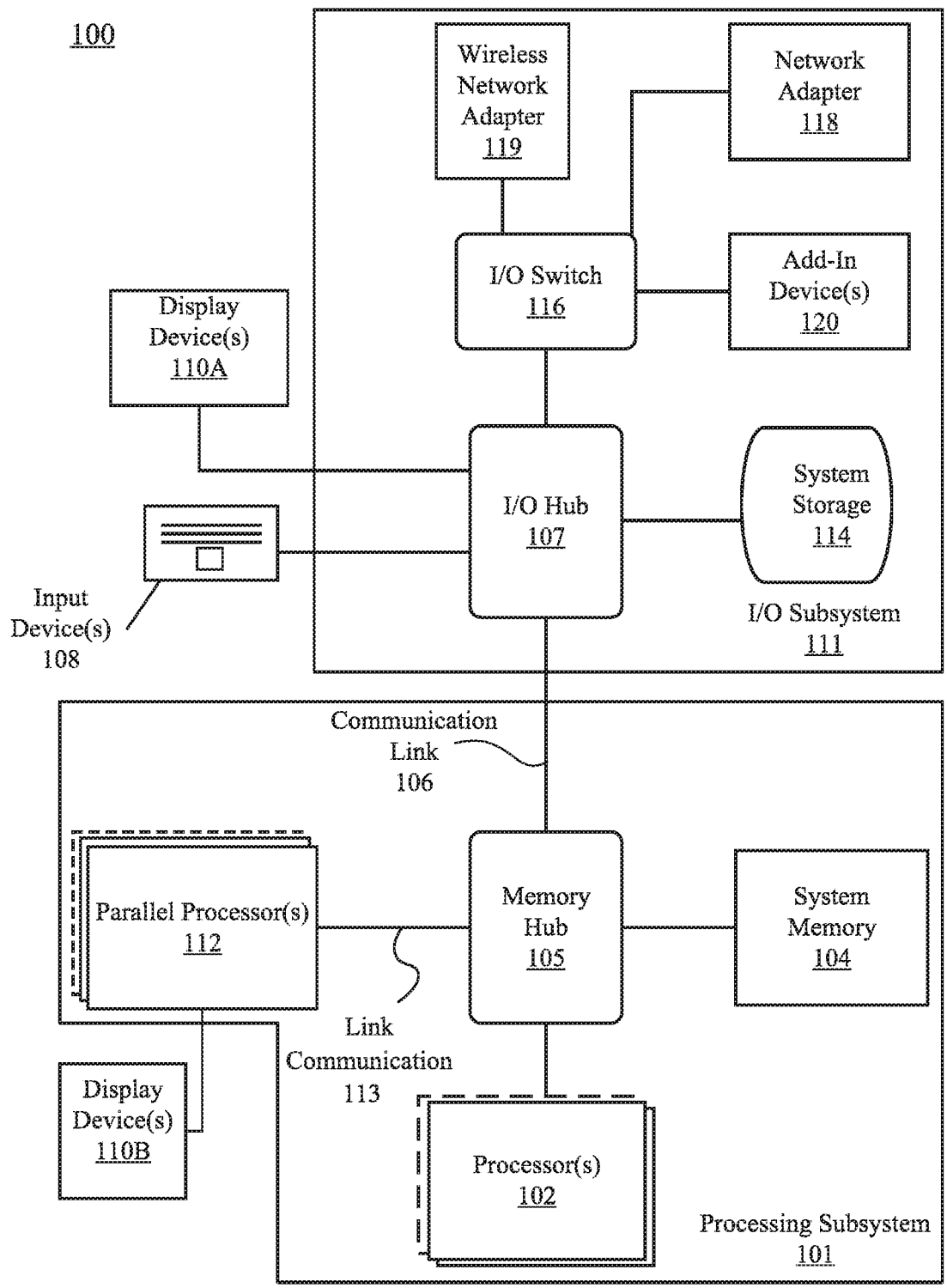
FIG. 1 is a block diagram illustrating a computer system configured to implement one or more aspects of the embodiments described herein.

FIG. 1 is a block diagram illustrating a computing system 100 configured to implement one or more aspects of the embodiments described herein. The computing system 100 includes a processing subsystem 101 having one or more processor(s) 102 and a system memory 104 communicating via an interconnection path that may include a memory hub 105. The memory hub 105 may be a separate component within a chipset component or may be integrated within the one or more processor(s) 102. The memory hub 105 couples with an I/O subsystem 111 via a communication link 106. The I/O subsystem 111 includes an I/O hub 107 that can enable the computing system 100 to receive input from one or more input device(s) 108. Additionally, the I/O hub 107 can enable a display controller, which may be included in the one or more processor(s) 102, to provide outputs to one or more display device(s) 110A. In one embodiment, the one or more display device(s) 110A coupled with the I/O hub 107 can include a local, internal, or embedded display device.

In one embodiment, the processing subsystem 101 includes one or more parallel processor(s) 112 coupled to memory hub 105 via a bus or other communication link 113. The communication link 113 may be one of any number of standards based communication link technologies or protocols, such as, but not limited to PCI Express, or may be a vendor specific communications interface or communications fabric. In one embodiment, the one or more parallel processor(s) 112 form a computationally focused parallel or vector processing system that an include a large number of processing cores and/or processing clusters, such as a many integrated core (MIC) processor. In one embodiment, the one or more parallel processor(s) 112 form a graphics processing subsystem that can output pixels to one of the one or more display device(s) 110A coupled via the I/O Hub 107. The one or more parallel processor(s) 112 can also include a display controller and display interface (not shown) to enable a direct connection to one or more display device(s) 110B.

Within the I/O subsystem 111, a system storage unit 114 can connect to the I/O hub 107 to provide a storage mechanism for the computing system 100. An I/O switch 116 can be used to provide an interface mechanism to enable connections between the I/O hub 107 and other components, such as a network adapter 118 and/or wireless network adapter 119 that may be integrated into the platform, and various other devices that can be added via one or more add-in device(s) 120. The network adapter 118 can be an Ethernet adapter or another wired network adapter. The wireless network adapter 119 can include one or more of a Wi-Fi, Bluetooth, near field communication (NFC), or other network device that includes one or more wireless radios.

The computing system 100 can include other components not explicitly shown, including USB or other port connections, optical storage drives, video capture devices, and the like, may also be connected to the I/O hub 107. Communication paths interconnecting the various components in FIG. 1 may be implemented using any suitable protocols, such as PCI (Peripheral Component Interconnect) based protocols (e.g., PCI-Express), or any other bus or point-to-point communication interfaces and/or protocol(s), such as the NVLink high-speed interconnect, or interconnect protocols known in the art.

In one embodiment, the one or more parallel processor(s) 112 incorporate circuitry optimized for graphics and video processing, including, for example, video output circuitry, and constitutes a graphics processing unit (GPU). In another embodiment, the one or more parallel processor(s) 112 incorporate circuitry optimized for general purpose processing, while preserving the underlying computational architecture, described in greater detail herein. In yet another embodiment, components of the computing system 100 may be integrated with one or more other system elements on a single integrated circuit. For example, the one or more parallel processor(s), 112 memory hub 105, processor(s) 102, and I/O hub 107 can be integrated into a system on chip (SoC) integrated circuit. Alternatively, the components of the computing system 100 can be integrated into a single package to form a system in package (SIP) configuration. In one embodiment, at least a portion of the components of the computing system 100 can be integrated into a multi-chip module (MCM), which can be interconnected with other multi-chip modules into a modular computing system.

It will be appreciated that the computing system 100 shown herein is illustrative and that variations and modifications are possible. The connection topology, including the number and arrangement of bridges, the number of processor(s) 102, and the number of parallel processor(s) 112, may be modified as desired. For instance, in some embodiments, system memory 104 is connected to the processor(s) 102 directly rather than through a bridge, while other devices communicate with system memory 104 via the memory hub 105 and the processor(s) 102. In other alternative topologies, the parallel processor(s) 112 are connected to the I/O hub 107 or directly to one of the one or more processor(s) 102, rather than to the memory hub 105. In other embodiments, the I/O hub 107 and memory hub 105 may be integrated into a single chip. Large embodiments may include two or more sets of processor(s) 102 attached via multiple sockets, which can couple with two or more instances of the parallel processor(s) 112. Some of the particular components shown herein are optional and may not be included in all implementations of the computing system 100. For example, any number of add-in cards or peripherals may be supported, or some components may be eliminated.

Figure 2A:
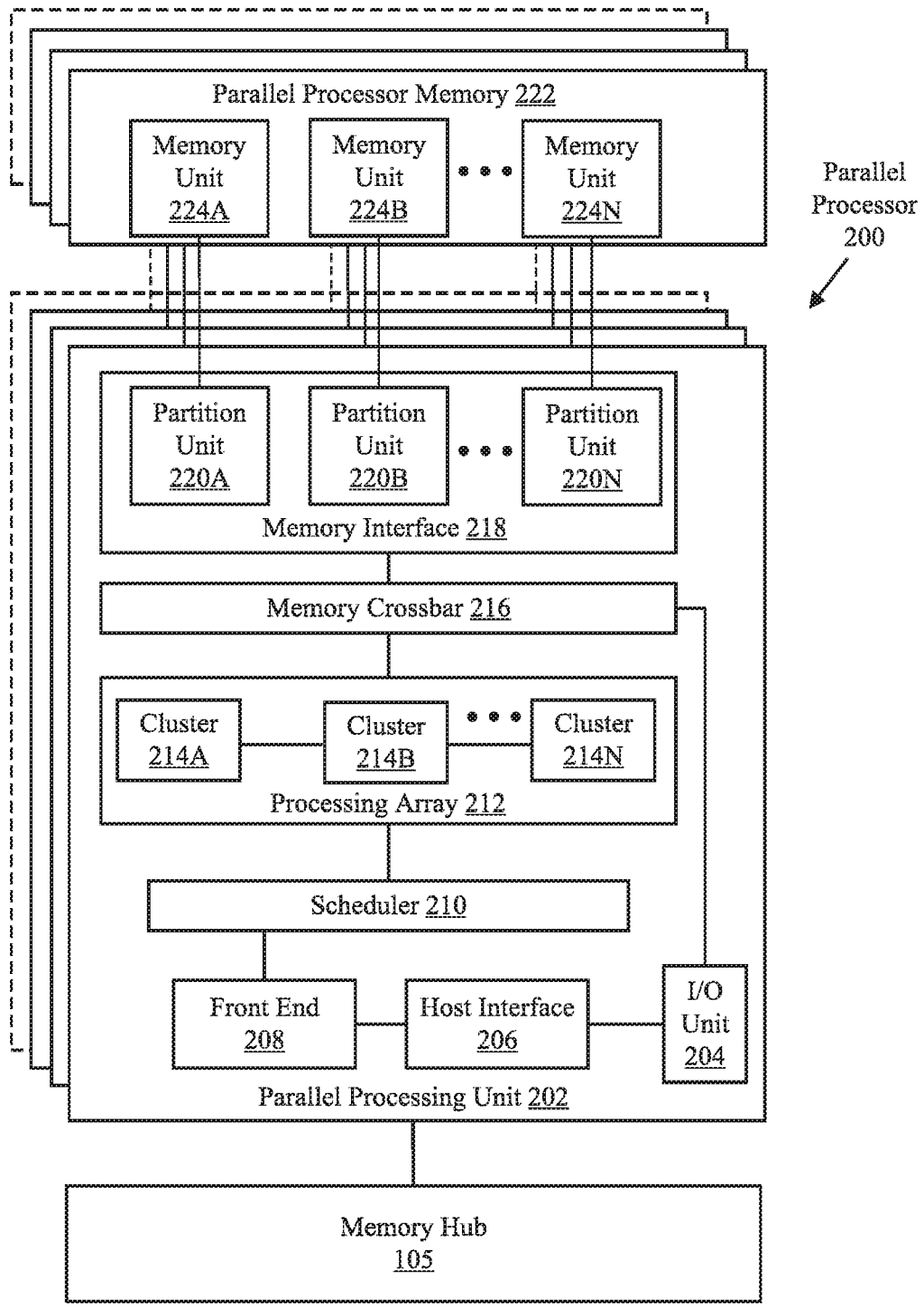
FIGS. 2A-2D illustrate a parallel processor components, according to an embodiment.

FIG. 2A illustrates a parallel processor 200, according to an embodiment. The various components of the parallel processor 200 may be implemented using one or more integrated circuit devices, such as programmable processors, application specific integrated circuits (ASICs), or field programmable gate arrays (FPGA). The illustrated parallel processor 200 is a variant of the one or more parallel processor(s) 112 shown in FIG. 1, according to an embodiment.

In one embodiment, the parallel processor 200 includes a parallel processing unit 202. The parallel processing unit includes an I/O unit 204 that enables communication with other devices, including other instances of the parallel processing unit 202. The I/O unit 204 may be directly connected to other devices. In one embodiment, the I/O unit 204 connects with other devices via the use of a hub or switch interface, such as memory hub 105. The connections between the memory hub 105 and the I/O unit 204 form a communication link 113. Within the parallel processing unit 202, the I/O unit 204 connects with a host interface 206 and a memory crossbar 216, where the host interface 206 receives commands directed to performing processing operations and the memory crossbar 216 receives commands directed to performing memory operations.

When the host interface 206 receives a command buffer via the I/O unit 204, the host interface 206 can direct work operations to perform those commands to a front end 208. In one embodiment, the front end 208 couples with a scheduler 210, which is configured to distribute commands or other work items to a processing cluster array 212. In one embodiment, the scheduler 210 ensures that the processing cluster array 212 is properly configured and in a valid state before tasks are distributed to the processing clusters of the processing cluster array 212.

The processing cluster array 212 can include up to "N" processing clusters (e.g., cluster 214A, cluster 214B, through cluster 214N). Each cluster 214A-214N of the processing cluster array 212 is capable of executing a large number (e.g., thousands) of concurrent threads, where each thread is an instance of a program.

In one embodiment, different clusters 214A-214N can be allocated for processing different types of programs or for performing different types of computations. The scheduler 210 can allocate work to the clusters 214A-214N of the processing cluster array 212 using various scheduling and/or work distribution algorithms, which may vary depending on the workload arising for each type of program or computation. The scheduling can be handled dynamically by the scheduler 210, or can be assisted in part by compiler logic during compilation of program logic configured for execution by the processing cluster array 212.

The processing cluster array 212 can be configured to perform various types of parallel processing operations. In one embodiment, the processing cluster array 212 is configured to perform general-purpose parallel compute operations. For example, the processing cluster array 212 can include logic to execute processing tasks including but not limited to, linear and nonlinear data transforms, filtering of video and/or audio data, and/or modeling operations (e.g., applying laws of physics to determine position, velocity and other attributes of objects).

In one embodiment, the processing cluster array 212 is configured to perform parallel graphics processing operations. In embodiments in which the parallel processor 200 is configured to perform graphics processing operations, the processing cluster array 212 can include additional logic to support the execution of such graphics processing operations, including, but not limited to texture sampling logic to perform texture operations, as well as tessellation logic and other vertex processing logic. Additionally, the processing cluster array 212 can be configured to execute graphics processing related shader programs such as, but not limited to vertex shaders, tessellation shaders, geometry shaders, and pixel shaders. The parallel processing unit 202 can transfer data from system memory via the I/O unit 204 for processing. During processing the transferred data can be stored to on-chip memory (e.g., parallel processor memory 222) during processing, then written back to system memory.

In one embodiment, when the parallel processing unit 202 is used to perform graphics processing, the scheduler 210 can be configured to divide the processing workload into approximately equal sized tasks, to better enable distribution of the graphics processing operations to multiple clusters 214A-214N of the processing cluster array 212. In some embodiments, portions of the processing cluster array 212 can be configured to perform different types of processing. For example, a first portion may be configured to perform vertex shading and topology generation, a second portion may be configured to perform tessellation and geometry shading, and a third portion may be configured to perform pixel shading or other screen space operations, to produce a rendered image for display. Intermediate data produced by one or more of the clusters 214A-214N may be stored in buffers to allow the intermediate data to be transmitted between clusters 214A-214N for further processing.

During operation, the processing cluster array 212 can receive processing tasks to be executed via the scheduler 210, which receives commands defining processing tasks from front end 208. For graphics processing operations, processing tasks can include indices of data to be processed, e.g., surface (patch) data, primitive data, vertex data, and/or pixel data, as well as state parameters and commands defining how the data is to be processed (e.g., what program is to be executed). The scheduler 210 may be configured to fetch the indices corresponding to the tasks or may receive the indices from the front end 208. The front end 208 can be configured to ensure the processing cluster array 212 is configured to a valid state before the workload specified by incoming command buffers (e.g., batch-buffers, push buffers, etc.) is initiated.

Each of the one or more instances of the parallel processing unit 202 can couple with parallel processor memory 222. The parallel processor memory 222 can be accessed via the memory crossbar 216, which can receive memory requests from the processing cluster array 212 as well as the I/O unit 204. The memory crossbar 216 can access the parallel processor memory 222 via a memory interface 218. The memory interface 218 can include multiple partition units (e.g., partition unit 220A, partition unit 220B, through partition unit 220N) that are each directly coupled to a portion (e.g., memory unit) of parallel processor memory 222. The number of partition units 220A-220N generally equals the number of memory units, such that a first partition unit 220A has a corresponding first memory unit 224A, a second partition unit 220B has a corresponding memory unit 224B, and an Nth partition unit 220N has a corresponding Nth memory unit 224N. In other embodiments, the number of partition units 220A-220N may not equal the number of memory devices.

In various embodiments, the memory units 224A-224N can include various types of memory devices, including dynamic random access memory (DRAM) or graphics random access memory, such as synchronous graphics random access memory (SGRAM), including graphics double data rate (GDDR) memory. In one embodiment, the memory units 224A-224N may also include 3D stacked memory, including but not limited to high bandwidth memory (HBM). Persons skilled in the art will appreciate that the specific implementation of the memory units 224A-224N can vary, and can be selected from one of various conventional designs. Render targets, such as frame buffers or texture maps may be stored across the memory units 224A-224N, allowing partition units 220A-220N to write portions of each render target in parallel to efficiently use the available bandwidth of parallel processor memory 222. In some embodiments, a local instance of the parallel processor memory 222 may be excluded in favor of a unified memory design that utilizes system memory in conjunction with local cache memory.

In one embodiment, any one of the clusters 214A-214N of the processing cluster array 212 can process data to be written to any of the memory units 224A-224N within parallel processor memory 222. The memory crossbar 216 can be configured to route the output of each cluster 214A-214N to the input of any partition unit 220A-220N or to another cluster 214A-214N for further processing. Each cluster 214A-214N can communicate with the memory interface 218 through the memory crossbar 216 to read from or write to various external memory devices. In one embodiment, the memory crossbar 216 has a connection to the memory interface 218 to communicate with the I/O unit 204, as well as a connection to a local instance of the parallel processor memory 222, enabling the processing units within the different processing clusters 214A-214N to communicate with system memory or other memory that is not local to the parallel processing unit 202. In one embodiment, the memory crossbar 216 can use virtual channels to separate traffic streams between the clusters 214A-214N and the partition units 220A-220N.

While a single instance of the parallel processing unit 202 is illustrated within the parallel processor 200, any number of instances of the parallel processing unit 202 can be included. For example, multiple instances of the parallel processing unit 202 can be provided on a single add-in card, or multiple add-in cards can be interconnected. The different instances of the parallel processing unit 202 can be configured to inter-operate even if the different instances have different numbers of processing cores, different amounts of local parallel processor memory, and/or other configuration differences. For example, and in one embodiment, some instances of the parallel processing unit 202 can include higher precision floating point units relative to other instances. Systems incorporating one or more instances of the parallel processing unit 202 or the parallel processor 200 can be implemented in a variety of configurations and form factors, including but not limited to desktop, laptop, or handheld personal computers, servers, workstations, game consoles, and/or embedded systems.

Figure 2B:
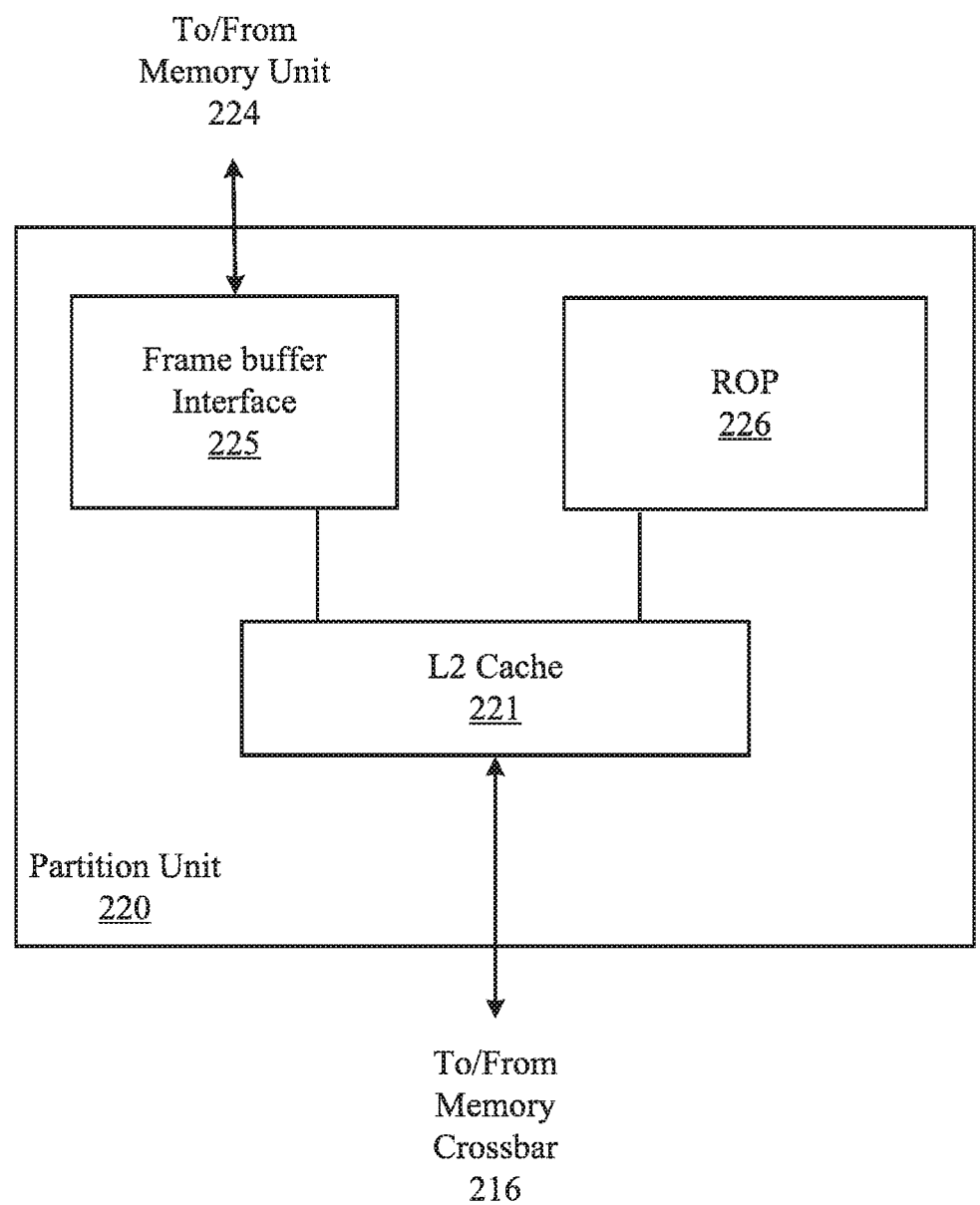

FIG. 2B is a block diagram of a partition unit 220, according to an embodiment. In one embodiment, the partition unit 220 is an instance of one of the partition units 220A-220N of FIG. 2A. As illustrated, the partition unit 220 includes an L2 cache 221, a frame buffer interface 225, and a ROP 226 (raster operations unit). The L2 cache 221 is a read/write cache that is configured to perform load and store operations received from the memory crossbar 216 and ROP 226. Read misses and urgent write-back requests are output by L2 cache 221 to frame buffer interface 225 for processing. Dirty updates can also be sent to the frame buffer via the frame buffer interface 225 for opportunistic processing. In one embodiment, the frame buffer interface 225 interfaces with one of the memory units in parallel processor memory, such as the memory units 224A-224N of FIG. 2 (e.g., within parallel processor memory 222).

In graphics applications, the ROP 226 is a processing unit that performs raster operations, such as stencil, z test, blending, and the like, and outputs pixel data as processed graphics data for storage in graphics memory. In some embodiments, ROP 226 may be configured to compress z or color data that is written to memory and decompress z or color data that is read from memory. In some embodiments, the ROP 226 is included within each processing cluster (e.g., cluster 214A-214N of FIG. 2) instead of within the partition unit 220. In such embodiment, read and write requests for pixel data are transmitted over the memory crossbar 216 instead of pixel fragment data.

The processed graphics data may be displayed on display device, such as one of the one or more display device(s) 110 of FIG. 1, routed for further processing by the processor(s) 102, or routed for further processing by one of the processing entities within the parallel processor 200 of FIG. 2A.

Figure 2C:
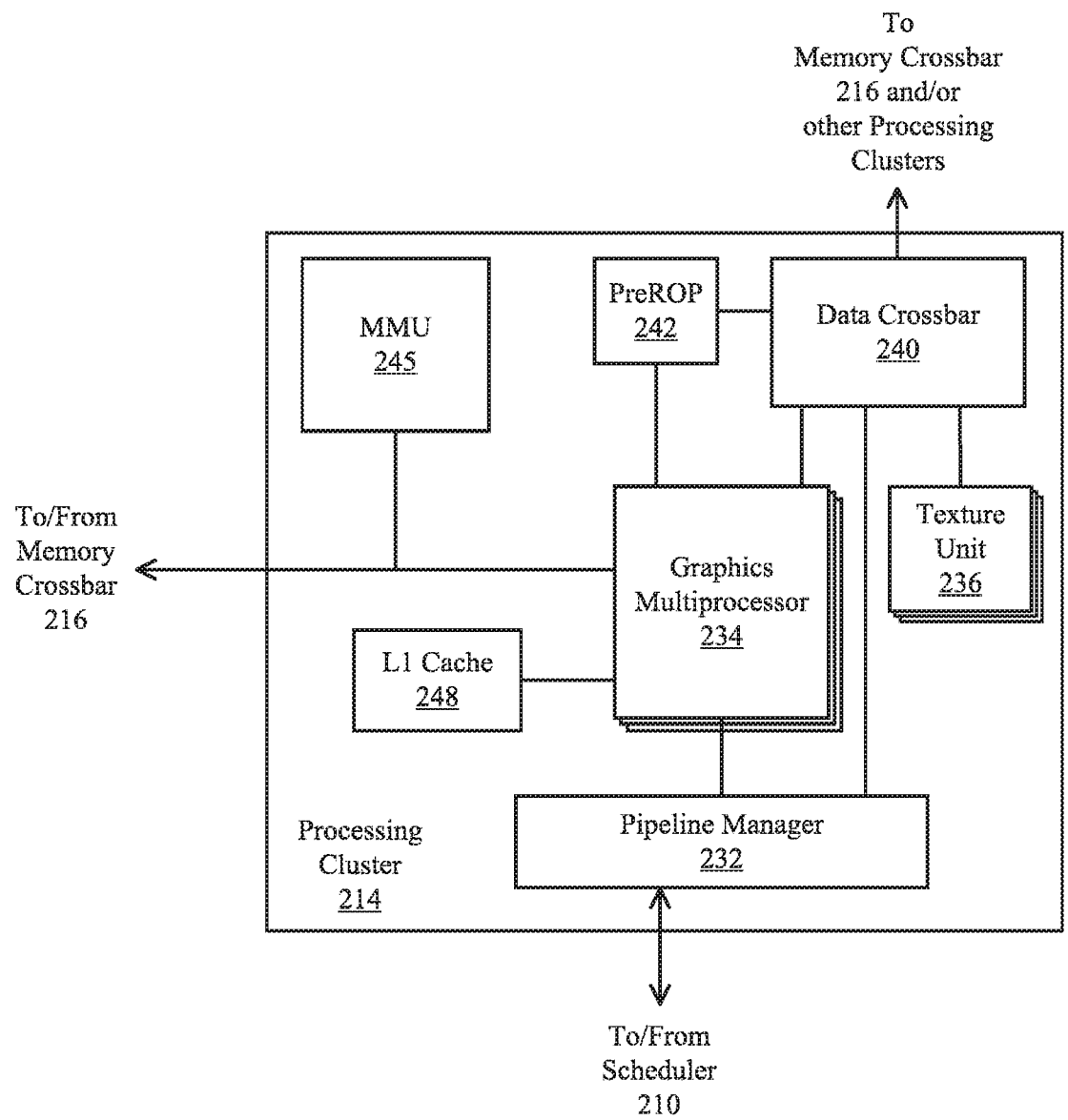

FIG. 2C is a block diagram of a processing cluster 214 within a parallel processing unit, according to an embodiment. In one embodiment, the processing cluster is an instance of one of the processing clusters 214A-214N of FIG. 2. The processing cluster 214 can be configured to execute many threads in parallel, where the term "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within each one of the processing clusters. Unlike a SIMD execution regime, where all processing engines typically execute identical instructions, SIMT execution allows different threads to more readily follow divergent execution paths through a given thread program. Persons skilled in the art will understand that a SIMD processing regime represents a functional subset of a SIMT processing regime.

Operation of the processing cluster 214 can be controlled via a pipeline manager 232 that distributes processing tasks to SIMT parallel processors. The pipeline manager 232 receives instructions from the scheduler 210 of FIG. 2 and manages execution of those instructions via a graphics multiprocessor 234 and/or a texture unit 236. The illustrated graphics multiprocessor 234 is an exemplary instance of an SIMT parallel processor. Various types of SIMT parallel processors of differing architectures, however, may be included within the processing cluster 214. One or more instances of the graphics multiprocessor 234 can be included within a processing cluster 214. The graphics multiprocessor 234 can process data and a data crossbar 240 can be used to distribute the processed data to one of multiple possible destinations, including other shader units. The pipeline manager 232 can facilitate the distribution of processed data by specifying destinations for processed data to be distributed vis the data crossbar 240.

Each graphics multiprocessor 234 within the processing cluster 214 can include an identical set of functional execution logic (e.g., arithmetic logic units, load-store units, etc.), which may be pipelined, allowing a new instruction to be issued before a previous instruction has finished. Any combination of functional execution logic may be provided. In one embodiment, the functional logic supports a variety of operations including integer and floating point arithmetic (e.g., addition and multiplication), comparison operations, Boolean operations (AND, OR, XOR), bit-shifting, and computation of various algebraic functions (e.g., planar interpolation, trigonometric, exponential, and logarithmic functions, etc.); and the same functional-unit hardware can be leveraged to perform different operations.

The series of instructions transmitted to the processing cluster 214 constitutes a thread, as previously defined herein, and the collection of a certain number of concurrently executing threads across the parallel processing engines (not shown) within an graphics multiprocessor 234 is referred to herein as a thread group. As used herein, a thread group refers to a group of threads concurrently executing the same program on different input data, with one thread of the group being assigned to a different processing engine within a graphics multiprocessor 234. A thread group may include fewer threads than the number of processing engines within the graphics multiprocessor 234, in which case some processing engines will be idle during cycles when that thread group is being processed. A thread group may also include more threads than the number of processing engines within the graphics multiprocessor 234, in which case processing will take place over consecutive clock cycles. Each graphics multiprocessor 234 can support up to G thread groups concurrently. Additionally, a plurality of related thread groups may be active (in different phases of execution) at the same time within a graphics multiprocessor 234.

In one embodiment, the graphics multiprocessor 234 includes an internal cache memory to perform load and store operations. In one embodiment, the graphics multiprocessor 234 can forego an internal cache and use a cache memory (e.g., L1 cache 308) within the processing cluster 214. Each graphics multiprocessor 234 also has access to L2 caches within the partition units (e.g., partition units 220A-220N of FIG. 2) that are shared among all processing clusters 214 and may be used to transfer data between threads. The graphics multiprocessor 234 may also access off-chip global memory, which can include one or more of local parallel processor memory and/or system memory. Any memory external to the parallel processing unit 202 may be used as global memory. Embodiments in which the processing cluster 214 includes multiple instances of the graphics multiprocessor 234 can share common instructions and data, which may be stored in the L1 cache 308.

Each processing cluster 214 may include an MMU 245 (memory management unit) that is configured to map virtual addresses into physical addresses. In other embodiments, one or more instances of the MMU 245 may reside within the memory interface 218 of FIG. 2. The MMU 245 includes a set of page table entries (PTEs) used to map a virtual address to a physical address of a tile (talk more about tiling) and optionally a cache line index. The MMU 245 may include address translation lookaside buffers (TLB) or caches that may reside within the graphics multiprocessor 234 or the L1 cache or processing cluster 214. The physical address is processed to distribute surface data access locality to allow efficient request interleaving among partition units. The cache line index may be used to determine whether or not a request for a cache line is a hit or miss.

In graphics and computing applications, a processing cluster 214 may be configured such that each graphics multiprocessor 234 is coupled to a texture unit 236 for performing texture mapping operations, e.g., determining texture sample positions, reading texture data, and filtering the texture data. Texture data is read from an internal texture L1 cache (not shown) or in some embodiments from the L1 cache within graphics multiprocessor 234 and is fetched from an L2 cache, local parallel processor memory, or system memory, as needed. Each graphics multiprocessor 234 outputs processed tasks to the data crossbar 240 to provide the processed task to another processing cluster 214 for further processing or to store the processed task in an L2 cache, local parallel processor memory, or system memory via the memory crossbar 216. A preROP 242 (pre-raster operations unit) is configured to receive data from graphics multiprocessor 234, direct data to ROP units, which may be located with partition units as described herein (e.g., partition units 220A-220N of FIG. 2). The preROP 242 unit can perform optimizations for color blending, organize pixel color data, and perform address translations.

It will be appreciated that the core architecture described herein is illustrative and that variations and modifications are possible. Any number of processing units, e.g., graphics multiprocessor 234, texture units 236, preROPs 242, etc., may be included within a processing cluster 214. Further, while only one processing cluster 214 is shown, a parallel processing unit as described herein may include any number of instances of the processing cluster 214. In one embodiment, each processing cluster 214 can be configured to operate independently of other processing clusters 214 using separate and distinct processing units, L1 caches, etc.

Figure 2D:
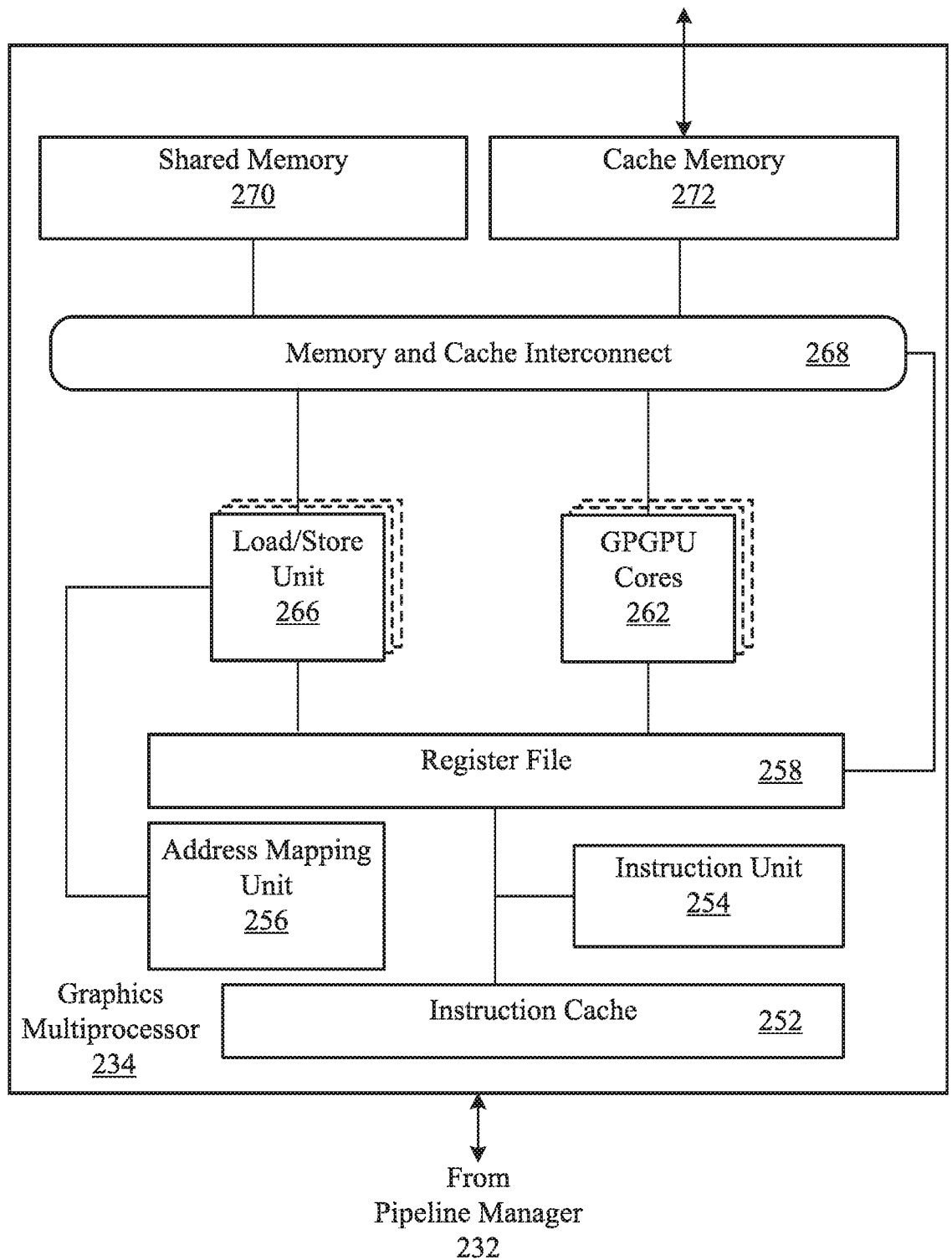

FIG. 2D shows a graphics multiprocessor 234, according to one embodiment. In such an embodiment, the graphics multiprocessor 234 couples with the pipeline manager 232 of the processing cluster 214. The graphics multiprocessor 234 has an execution pipeline including but not limited to an instruction cache 252, an instruction unit 254, an address mapping unit 256, a register file 258, one or more general purpose graphics processing unit (GPGPU) cores 262, and one or more load/store units 266. The GPGPU cores 262 and load/store units 266 are coupled with cache memory 272 and shared memory 270 via a memory and cache interconnect 268.

In one embodiment, the instruction cache 252 receives a stream of instructions to execute from the pipeline manager 232. The instructions are cached in the instruction cache 252 and dispatched for execution by the instruction unit 254. The instruction unit 254 can dispatch instructions as thread groups (e.g., warps), with each thread of the thread group assigned to a different execution unit within GPGPU core 262. An instruction can access any of a local, shared, or global address space by specifying an address within a unified address space. The address mapping unit 256 can be used to translate addresses in the unified address space into a distinct memory address that can be accessed by the load/store units 266.

The register file 258 provides a set of registers for the functional units of the graphics multiprocessor 324. The register file 258 provides temporary storage for operands connected to the data paths of the functional units (e.g., GPGPU cores 262, load/store units 266) of the graphics multiprocessor 324. In one embodiment, the register file 258 is divided between each of the functional units such that each functional unit is allocated a dedicated portion of the register file 258. In one embodiment, the register file 258 is divided between the different warps being executed by the graphics multiprocessor 324.

The GPGPU cores 262 can each include floating point units (FPUs) and/or integer arithmetic logic units (ALUs) that are used to execute instructions of the graphics multiprocessor 324. The GPGPU cores 262 can be similar in architecture or can differ in architecture, according to embodiments. For example, and in one embodiment, a first portion of the GPGPU cores 262 include a single precision FPU and an integer ALU while a second portion of the GPGPU cores include a double precision FPU. In one embodiment, the FPUs can implement the IEEE 754-2008 standard for floating point arithmetic or enable variable precision floating point arithmetic. The graphics multiprocessor 324 can additionally include one or more fixed function or special function units to perform specific functions such as copy rectangle or pixel blending operations. In one embodiment, one or more of the GPGPU cores can also include fixed or special function logic.

The memory and cache interconnect 268 is an interconnect network that connects each of the functional units of the graphics multiprocessor 324 to the register file 258 and to the shared memory 270. In one embodiment, the memory and cache interconnect 268 is a crossbar interconnect that allows the load/store unit 266 to implement load and store operations between the shared memory 270 and the register file 258. In one embodiment, the shared memory 270 can be used to enable communication between threads that execute on the functional units. The cache memory 272 can be used as a data cache for example, to cache texture data communicated between the functional units and the texture unit 236.

Figure 3A:
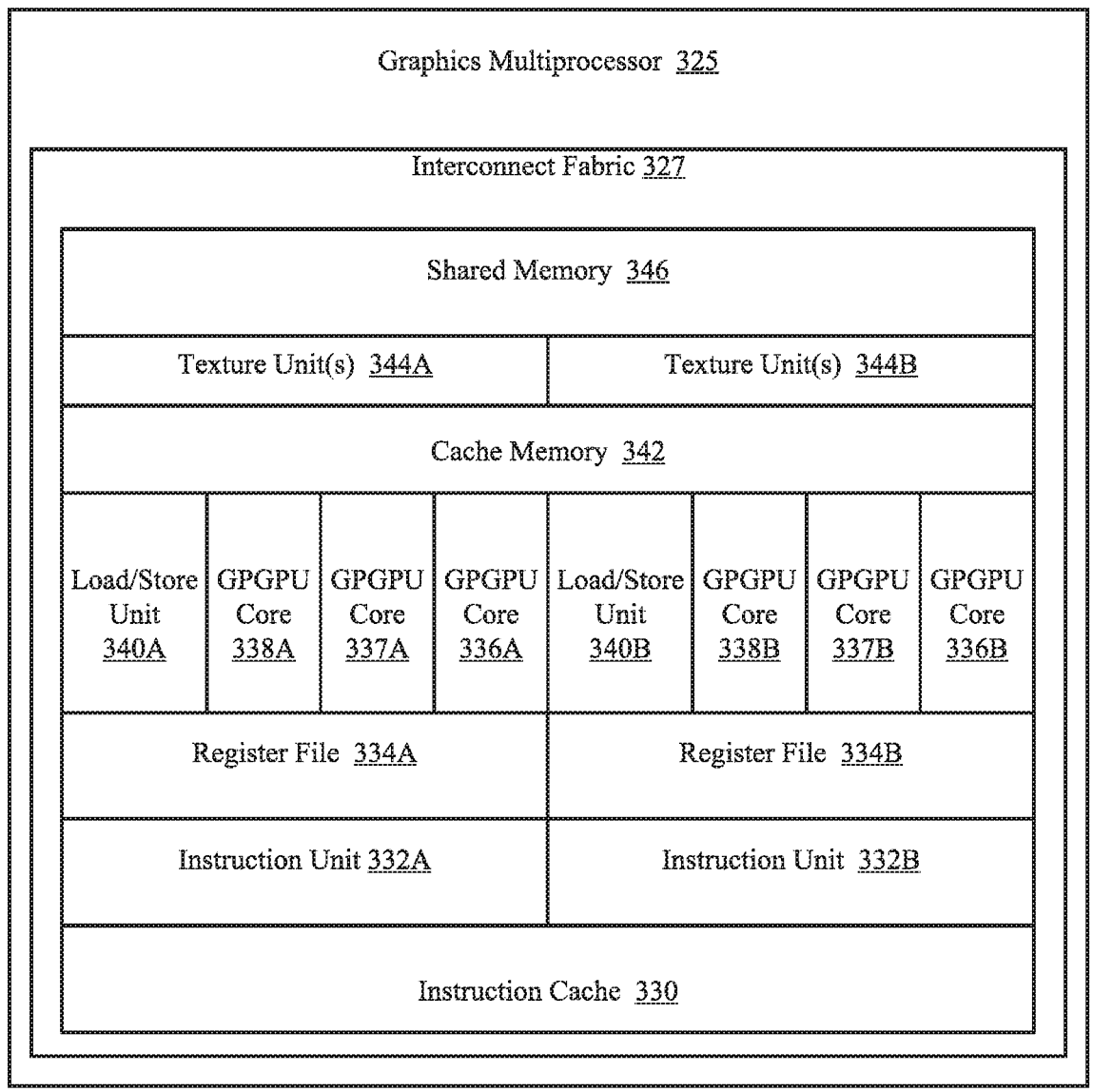
FIGS. 3A-3B are block diagrams of graphics multiprocessors, according to embodiments.
Figure 3B:
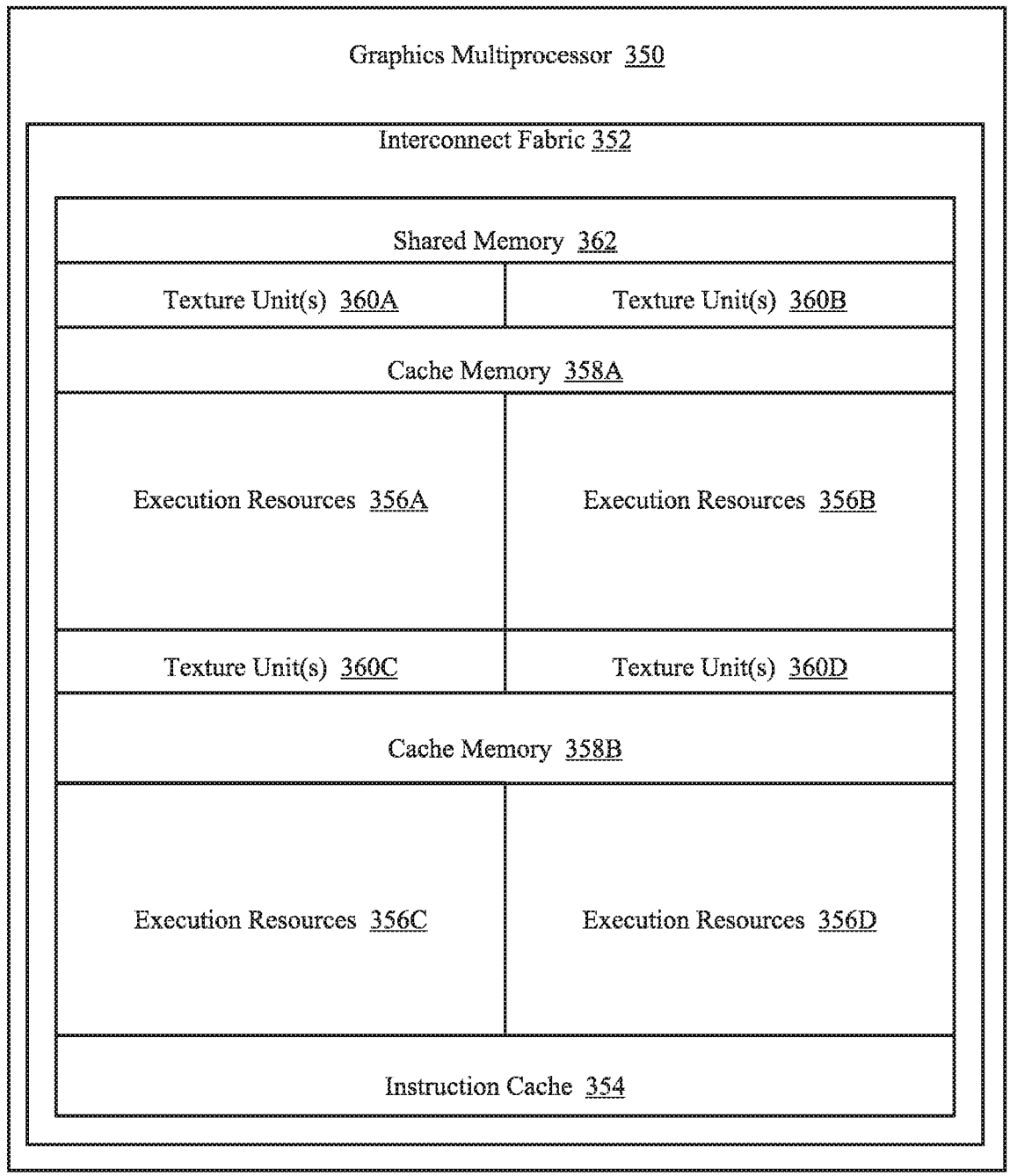

FIGS. 3A-3B illustrate additional graphics multiprocessors, according to embodiments. The illustrated graphics multiprocessors 325, 350 are variants of the graphics multiprocessor 234 of FIG. 2C. The illustrated graphics multiprocessors 325, 350 can be configured as a streaming multiprocessor (SM) capable of simultaneous execution of a large number of execution threads.

FIG. 3A shows a graphics multiprocessor 325 according to an additional embodiment. The graphics multiprocessor 325 includes multiple additional instances of execution resource units relative to the graphics multiprocessor 234 of FIG. 2D. For example, the graphics multiprocessor 325 can include multiple instances of the instruction unit 332A-332B, register file 334A-334B, and texture unit(s) 344A-344B. The graphics multiprocessor 325 also includes multiple sets of graphics or compute execution units (e.g., GPGPU core 336A-336B, GPGPU core 337A-337B, GPGPU core 338A-338B) and multiple sets of load/store units 340A-340B. In one embodiment, the execution resource units have a common instruction cache 330, texture and/or data cache memory 342, and shared memory 346. The various components can communicate via an interconnect fabric 327. In one embodiment, the interconnect fabric 327 includes one or more crossbar switches to enable communication between the various components of the graphics multiprocessor 325.

FIG. 3B shows a graphics multiprocessor 350 according to an additional embodiment. The graphics processor includes multiple sets of execution resources 356A-356D, where each set of execution resource includes multiple instruction units, register files, GPGPU cores, and load store units, as illustrated in FIG. 2D and FIG. 3A. The execution resources 356A-356D can work in concert with texture unit(s) 360A-360D for texture operations, while sharing an instruction cache 354, and shared memory 362. In one embodiment, the execution resources 356A-356D can share an instruction cache 354 and shared memory 362, as well as multiple instances of a texture and/or data cache memory 358A-358B. The various components can communicate via an interconnect fabric 352 similar to the interconnect fabric 327 of FIG. 3A.

Persons skilled in the art will understand that the architecture described in FIGS. 1, 2A-2D, and 3A-3B are descriptive and not limiting as to the scope of the present embodiments. Thus, the techniques described herein may be implemented on any properly configured processing unit, including, without limitation, one or more mobile application processors, one or more desktop or server central processing units (CPUs) including multi-core CPUs, one or more parallel processing units, such as the parallel processing unit 202 of FIG. 2, as well as one or more graphics processors or special purpose processing units, without departure from the scope of the embodiments described herein.

In some embodiments, a parallel processor or GPGPU as described herein is communicatively coupled to host/processor cores to accelerate graphics operations, machine-learning operations, pattern analysis operations, and various general purpose GPU (GPGPU) functions. The GPU may be communicatively coupled to the host processor/cores over a bus or other interconnect (e.g., a high-speed interconnect such as PCIe or NVLink). In other embodiments, the GPU may be integrated on the same package or chip as the cores and communicatively coupled to the cores over an internal processor bus/interconnect (i.e., internal to the package or chip). Regardless of the manner in which the GPU is connected, the processor cores may allocate work to the GPU in the form of sequences of commands/instructions contained in a work descriptor. The GPU then uses dedicated circuitry/logic for efficiently processing these commands/instructions.

Techniques for GPU to Host Processor Interconnection

Figure 4A:
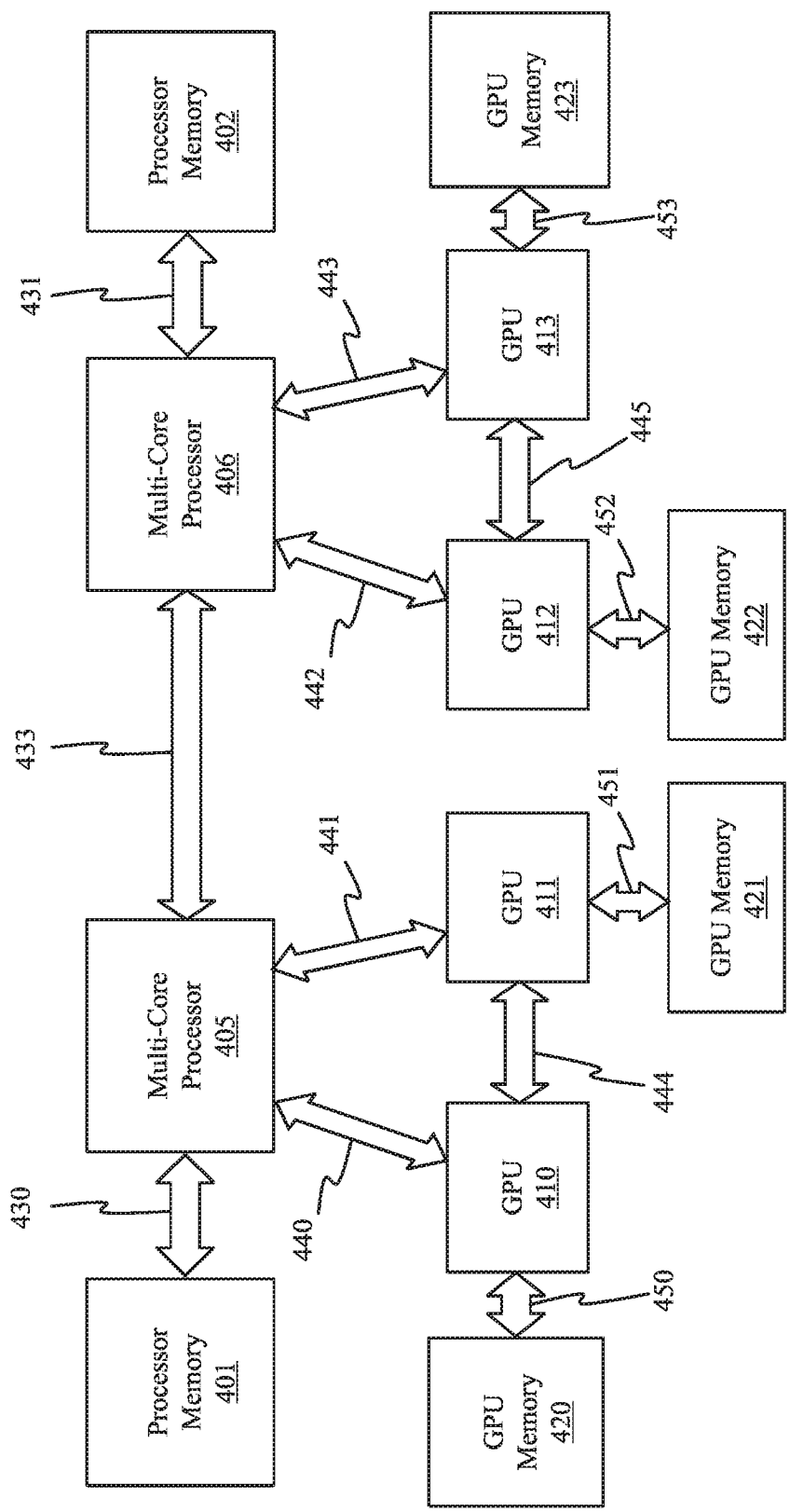
FIGS. 4A-4F illustrate an exemplary architecture in which a plurality of GPUs is communicatively coupled to a plurality of multi-core processors.

FIG. 4A illustrates an exemplary architecture in which a plurality of GPUs 410-413 are communicatively coupled to a plurality of multi-core processors 405-406 over high-speed links 440-443 (e.g., buses, point-to-point interconnects, etc.). In one embodiment, the high-speed links 440-443 support a communication throughput of 4 GB/s, 30 GB/s, 80 GB/s or higher, depending on the implementation. Various interconnect protocols may be used including, but not limited to, PCIe 4.0 or 5.0 and NVLink 2.0. The underlying principles of the invention, however, are not limited to any particular communication protocol or throughput.

In addition, in one embodiment, two or more of the GPUs 410-413 are interconnected over high-speed links 444-445, which may be implemented using the same or different protocols/links than those used for high-speed links 440-443. Similarly, two or more of the multi-core processors 405-406 may be connected over high-speed link 433 which may be symmetric multi-processor (SMP) buses operating at 20 GB/s, 30 GB/s, 120 GB/s or higher. Alternatively, all communication between the various system components shown in FIG. 4A may be accomplished using the same protocols/links (e.g., over a common interconnection fabric). As mentioned, however, the underlying principles of the invention are not limited to any particular type of interconnect technology.

In one embodiment, each multi-core processor 405-406 is communicatively coupled to a processor memory 401-402, via memory interconnects 430-431, respectively, and each GPU 410-413 is communicatively coupled to GPU memory 420-423 over GPU memory interconnects 450-453, respectively. The memory interconnects 430-431 and 450-453 may utilize the same or different memory access technologies. By way of example, and not limitation, the processor memories 401-402 and GPU memories 420-423 may be volatile memories such as dynamic random access memories (DRAMs) (including stacked DRAMs), Graphics DDR SDRAM (GDDR) (e.g., GDDR5, GDDR6), or High Bandwidth Memory (HBM) and/or may be non-volatile memories such as 3D XPoint or Nano-Ram. In one embodiment, some portion of the memories may be volatile memory and another portion may be non-volatile memory (e.g., using a two-level memory (2LM) hierarchy).

As described below, although the various processors 405-406 and GPUs 410-413 may be physically coupled to a particular memory 401-402, 420-423, respectively, a unified memory architecture may be implemented in which the same virtual system address space (also referred to as the "effective address" space) is distributed among all of the various physical memories. For example, processor memories 401-402 may each comprise 64 GB of the system memory address space and GPU memories 420-423 may each comprise 32 GB of the system memory address space (resulting in a total of 256 GB addressable memory in this example).

Figure 4B:
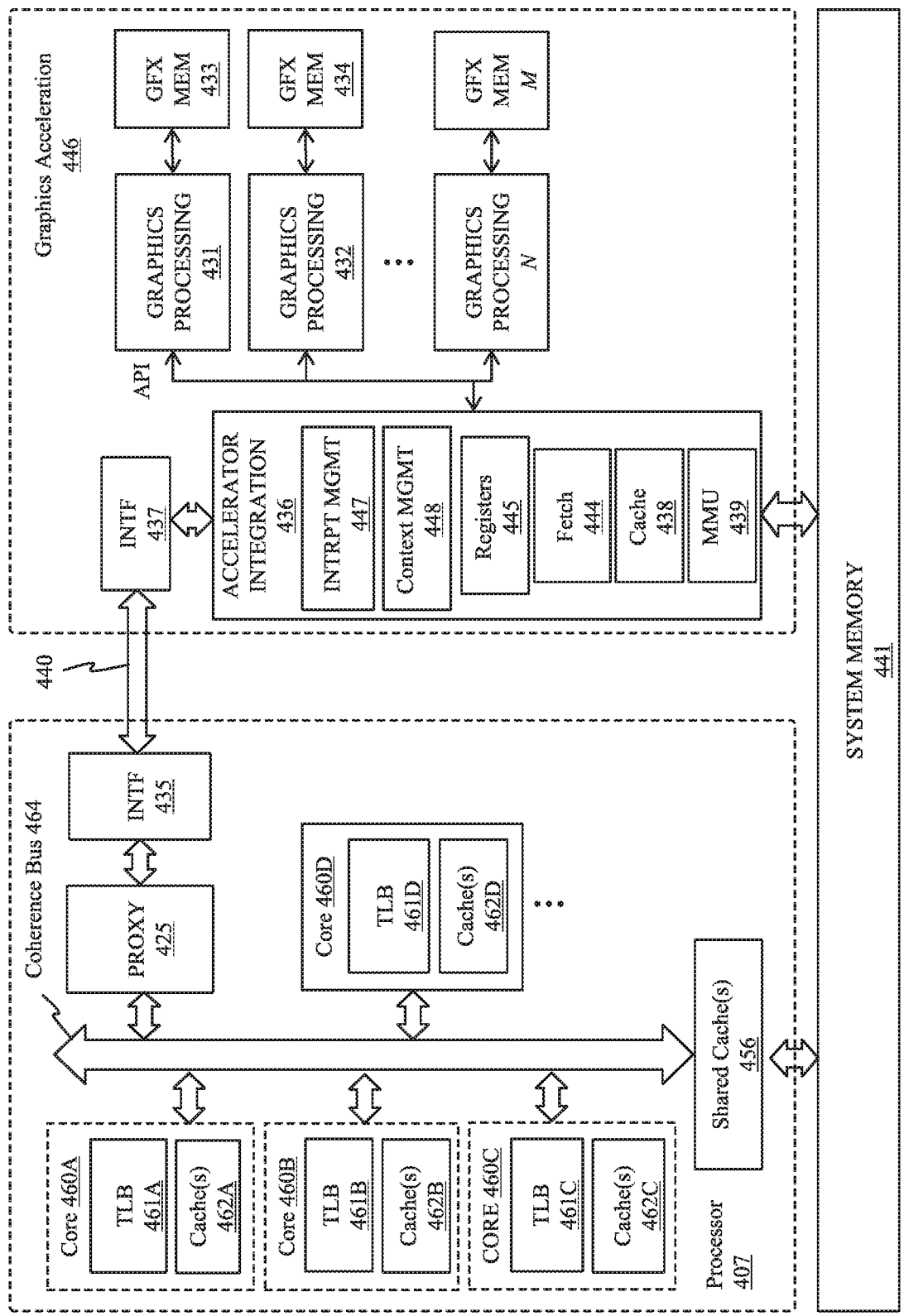

FIG. 4B illustrates additional details for an interconnection between a multi-core processor 407 and a graphics acceleration module 446 in accordance with one embodiment. The graphics acceleration module 446 may include one or more GPU chips integrated on a line card which is coupled to the processor 407 via the high-speed link 440. Alternatively, the graphics acceleration module 446 may be integrated on the same package or chip as the processor 407.

The illustrated processor 407 includes a plurality of cores 460A-460D, each with a translation lookaside buffer 461A-461D and one or more caches 462A-462D. The cores may include various other components for executing instructions and processing data which are not illustrated to avoid obscuring the underlying principles of the invention (e.g., instruction fetch units, branch prediction units, decoders, execution units, reorder buffers, etc.). The caches 462A-462D may comprise level 1 (L1) and level 2 (L2) caches. In addition, one or more shared caches 426 may be included in the caching hierarchy and shared by sets of the cores 460A-460D. For example, one embodiment of the processor 407 includes 24 cores, each with its own L1 cache, twelve shared L2 caches, and twelve shared L3 caches. In this embodiment, one of the L2 and L3 caches are shared by two adjacent cores. The processor 407 and the graphics accelerator integration module 446 connect with system memory 441, which may include processor memories 401-402.

Coherency is maintained for data and instructions stored in the various caches 462A-462D, 456 and system memory 441 via inter-core communication over a coherence bus 464. For example, each cache may have cache coherency logic/circuitry associated therewith to communicate to over the coherence bus 464 in response to detected reads or writes to particular cache lines. In one implementation, a cache snooping protocol is implemented over the coherence bus 464 to snoop cache accesses. Cache snooping/coherency techniques are well understood by those of skill in the art and will not be described in detail here to avoid obscuring the underlying principles of the invention.

In one embodiment, a proxy circuit 425 communicatively couples the graphics acceleration module 446 to the coherence bus 464, allowing the graphics acceleration module 446 to participate in the cache coherence protocol as a peer of the cores. In particular, an interface 435 provides connectivity to the proxy circuit 425 over high-speed link 440 (e.g., a PCIe bus, NVLink, etc.) and an interface 437 connects the graphics acceleration module 446 to the link 440.

In one implementation, an accelerator integration circuit 436 provides cache management, memory access, context management, and interrupt management services on behalf of a plurality of graphics processing engines 431, 432, N of the graphics acceleration module 446. The graphics processing engines 431, 432, N may each comprise a separate graphics processing unit (GPU). Alternatively, the graphics processing engines 431, 432, N may comprise different types of graphics processing engines within a GPU such as graphics execution units, media processing engines (e.g., video encoders/decoders), samplers, and blit engines. In other words, the graphics acceleration module may be a GPU with a plurality of graphics processing engines 431-432, N or the graphics processing engines 431-432, N may be individual GPUs integrated on a common package, line card, or chip.

In one embodiment, the accelerator integration circuit 436 includes a memory management unit (MMU) 439 for performing various memory management functions such as virtual-to-physical memory translations (also referred to as effective-to-real memory translations) and memory access protocols for accessing system memory 441. The MMU 439 may also include a translation lookaside buffer (TLB) (not shown) for caching the virtual/effective to physical/real address translations. In one implementation, a cache 438 stores commands and data for efficient access by the graphics processing engines 431-432, N. In one embodiment, the data stored in cache 438 and graphics memories 433-434, N is kept coherent with the core caches 462A-462D, 456 and system memory 411. As mentioned, this may be accomplished via proxy circuit 425 which takes part in the cache coherency mechanism on behalf of cache 438 and memories 433-434, N (e.g., sending updates to the cache 438 related to modifications/accesses of cache lines on processor caches 462A-462D, 456 and receiving updates from the cache 438).

A set of registers 445 store context data for threads executed by the graphics processing engines 431-432, N and a context management circuit 448 manages the thread contexts. For example, the context management circuit 448 may perform save and restore operations to save and restore contexts of the various threads during contexts switches (e.g., where a first thread is saved and a second thread is stored so that the second thread can be execute by a graphics processing engine). For example, on a context switch, the context management circuit 448 may store current register values to a designated region in memory (e.g., identified by a context pointer). It may then restore the register values when returning to the context. In one embodiment, an interrupt management circuit 447 receives and processes interrupts received from system devices.

In one implementation, virtual/effective addresses from a graphics processing engine 431 are translated to real/physical addresses in system memory 411 by the MMU 439. One embodiment of the accelerator integration circuit 436 supports multiple (e.g., 4, 8, 16) graphics accelerator modules 446 and/or other accelerator devices. The graphics accelerator module 446 may be dedicated to a single application executed on the processor 407 or may be shared between multiple applications. In one embodiment, a virtualized graphics execution environment is presented in which the resources of the graphics processing engines 431-432, N are shared with multiple applications or virtual machines (VMs). The resources may be subdivided into "slices" which are allocated to different VMs and/or applications based on the processing requirements and priorities associated with the VMs and/or applications.

Thus, the accelerator integration circuit acts as a bridge to the system for the graphics acceleration module 446 and provides address translation and system memory cache services. In addition, the accelerator integration circuit 436 may provide virtualization facilities for the host processor to manage virtualization of the graphics processing engines, interrupts, and memory management.

Because hardware resources of the graphics processing engines 431-432, N are mapped explicitly to the real address space seen by the host processor 407, any host processor can address these resources directly using an effective address value. One function of the accelerator integration circuit 436, in one embodiment, is the physical separation of the graphics processing engines 431-432, N so that they appear to the system as independent units.

As mentioned, in the illustrated embodiment, one or more graphics memories 433-434, M are coupled to each of the graphics processing engines 431-432, N, respectively. The graphics memories 433-434, M store instructions and data being processed by each of the graphics processing engines 431-432, N. The graphics memories 433-434, M may be volatile memories such as DRAMs (including stacked DRAMs), GDDR memory (e.g., GDDR5, GDDR6), or HBM, and/or may be non-volatile memories such as 3D XPoint or Nano-Ram.

In one embodiment, to reduce data traffic over link 440, biasing techniques are used to ensure that the data stored in graphics memories 433-434, M is data which will be used most frequently by the graphics processing engines 431-432, N and preferably not used by the cores 460A-460D (at least not frequently). Similarly, the biasing mechanism attempts to keep data needed by the cores (and preferably not the graphics processing engines 431-432, N) within the caches 462A-462D, 456 of the cores and system memory 411.

Figure 4C:
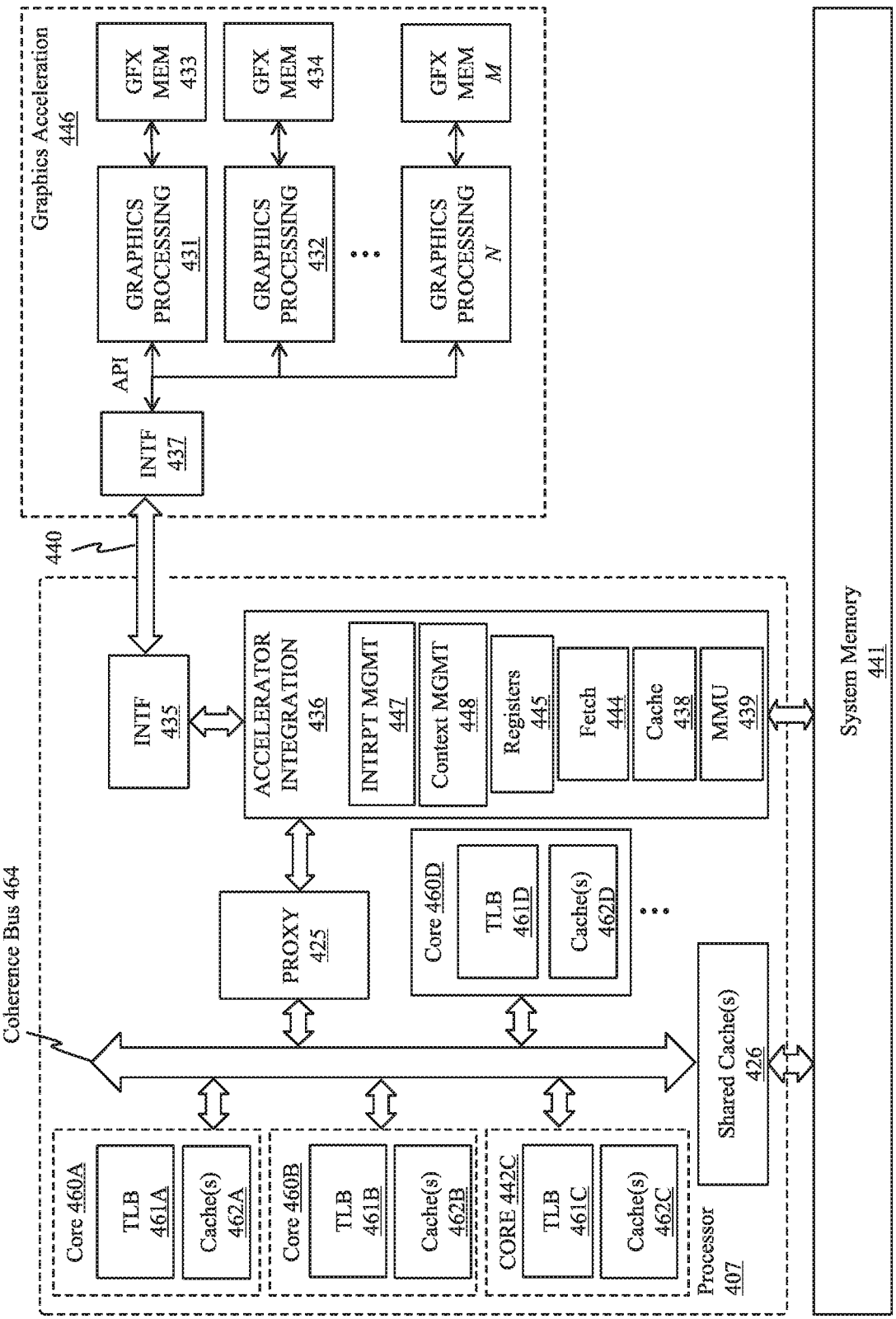

FIG. 4C illustrates another embodiment in which the accelerator integration circuit 436 is integrated within the processor 407. In this embodiment, the graphics processing engines 431-432, N communicate directly over the high-speed link 440 to the accelerator integration circuit 436 via interface 437 and interface 435 (which, again, may be utilize any form of bus or interface protocol). The accelerator integration circuit 436 may perform the same operations as those described with respect to FIG. 4B, but potentially at a higher throughput given its close proximity to the coherency bus 462 and caches 462A-462D, 426.

One embodiment supports different programming models including a dedicated-process programming model (no graphics acceleration module virtualization) and shared programming models (with virtualization). The latter may include programming models which are controlled by the accelerator integration circuit 436 and programming models which are controlled by the graphics acceleration module 446.

In one embodiment of the dedicated process model, graphics processing engines 431-432, N are dedicated to a single application or process under a single operating system. The single application can funnel other application requests to the graphics engines 431-432, N, providing virtualization within a VM/partition.

In the dedicated-process programming models, the graphics processing engines 431-432, N, may be shared by multiple VM/application partitions. The shared models require a system hypervisor to virtualize the graphics processing engines 431-432, N to allow access by each operating system. For single-partition systems without a hypervisor, the graphics processing engines 431-432, N are owned by the operating system. In both cases, the operating system can virtualize the graphics processing engines 431-432, N to provide access to each process or application.

For the shared programming model, the graphics acceleration module 446 or an individual graphics processing engine 431-432, N selects a process element using a process handle. In one embodiment, process elements are stored in system memory 411 and are addressable using the effective address to real address translation techniques described herein. The process handle may be an implementation-specific value provided to the host process when registering its context with the graphics processing engine 431-432, N (that is, calling system software to add the process element to the process element linked list). The lower 16-bits of the process handle may be the offset of the process element within the process element linked list.

Figure 4D:
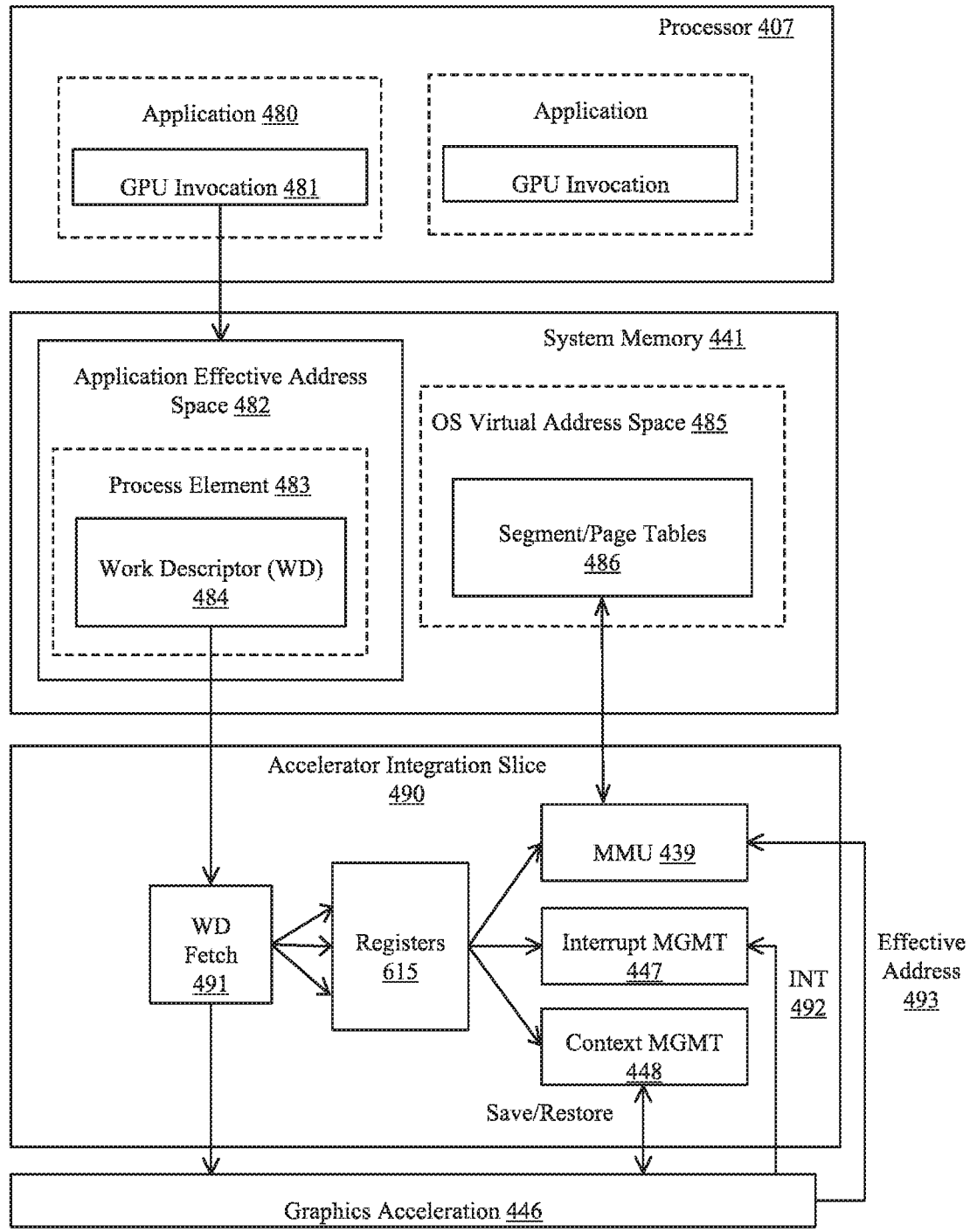

FIG. 4D illustrates an exemplary accelerator integration slice 490. As used herein, a "slice" comprises a specified portion of the processing resources of the accelerator integration circuit 436. Application effective address space 482 within system memory 411 stores process elements 483. In one embodiment, the process elements 483 are stored in response to GPU invocations 481 from applications 480 executed on the processor 407. A process element 483 contains the process state for the corresponding application 480. A work descriptor (WD) 484 contained in the process element 483 can be a single job requested by an application or may contain a pointer to a queue of jobs. In the latter case, the WD 484 is a pointer to the job request queue in the application's address space 482.

The graphics acceleration module 446 and/or the individual graphics processing engines 431-432, N can be shared by all or a subset of the processes in the system. Embodiments of the invention include an infrastructure for setting up the process state and sending a WD 484 to a graphics acceleration module 446 to start a job in a virtualized environment.

In one implementation, the dedicated-process programming model is implementation-specific. In this model, a single process owns the graphics acceleration module 446 or an individual graphics processing engine 431. Because the graphics acceleration module 446 is owned by a single process, the hypervisor initializes the accelerator integration circuit 436 for the owning partition and the operating system initializes the accelerator integration circuit 436 for the owning process at the time when the graphics acceleration module 446 is assigned.

In operation, a WD fetch unit 491 in the accelerator integration slice 490 fetches the next WD 484 which includes an indication of the work to be done by one of the graphics processing engines of the graphics acceleration module 446. Data from the WD 484 may be stored in registers 445 and used by the MMU 439, interrupt management circuit 447 and/or context management circuit 446 as illustrated. For example, one embodiment of the MMU 439 includes segment/page walk circuitry for accessing segment/page tables 486 within the OS virtual address space 485. The interrupt management circuit 447 may process interrupt events 492 received from the graphics acceleration module 446. When performing graphics operations, an effective address 493 generated by a graphics processing engine 431-432, N is translated to a real address by the MMU 439.

In one embodiment, the same set of registers 445 are duplicated for each graphics processing engine 431-432, N and/or graphics acceleration module 446 and may be initialized by the hypervisor or operating system. Each of these duplicated registers may be included in an accelerator integration slice 490. Exemplary registers that may be initialized by the hypervisor are shown in Table 1.

TABLE 1

Hypervisor Initialized Registers

| | |
|---|---|
| 1 | Slice Control Register |
| 2 | Real Address (RA) Scheduled Processes Area Pointer |
| 3 | Authority Mask Override Register |
| 4 | Interrupt Vector Table Entry Offset |
| 5 | Interrupt Vector Table Entry Limit |
| 6 | State Register |
| 7 | Logical Partition ID |
| 8 | Real address (RA) Hypervisor Accelerator Utilization Record Pointer |
| 9 | Storage Description Register |

Exemplary registers that may be initialized by the operating system are shown in Table 2.

TABLE 2

Operating System Initialized Registers

| | |
|---|---|
| 1 | Process and Thread Identification |
| 2 | Effective Address (EA) Context Save/Restore Pointer |
| 3 | Virtual Address (VA) Accelerator Utilization Record Pointer |
| 4 | Virtual Address (VA) Storage Segment Table Pointer |
| 5 | Authority Mask |
| 6 | Work descriptor |

In one embodiment, each WD 484 is specific to a particular graphics acceleration module 446 and/or graphics processing engine 431-432, N. It contains all the information a graphics processing engine 431-432, N requires to do its work or it can be a pointer to a memory location where the application has set up a command queue of work to be completed.

Figure 4E:
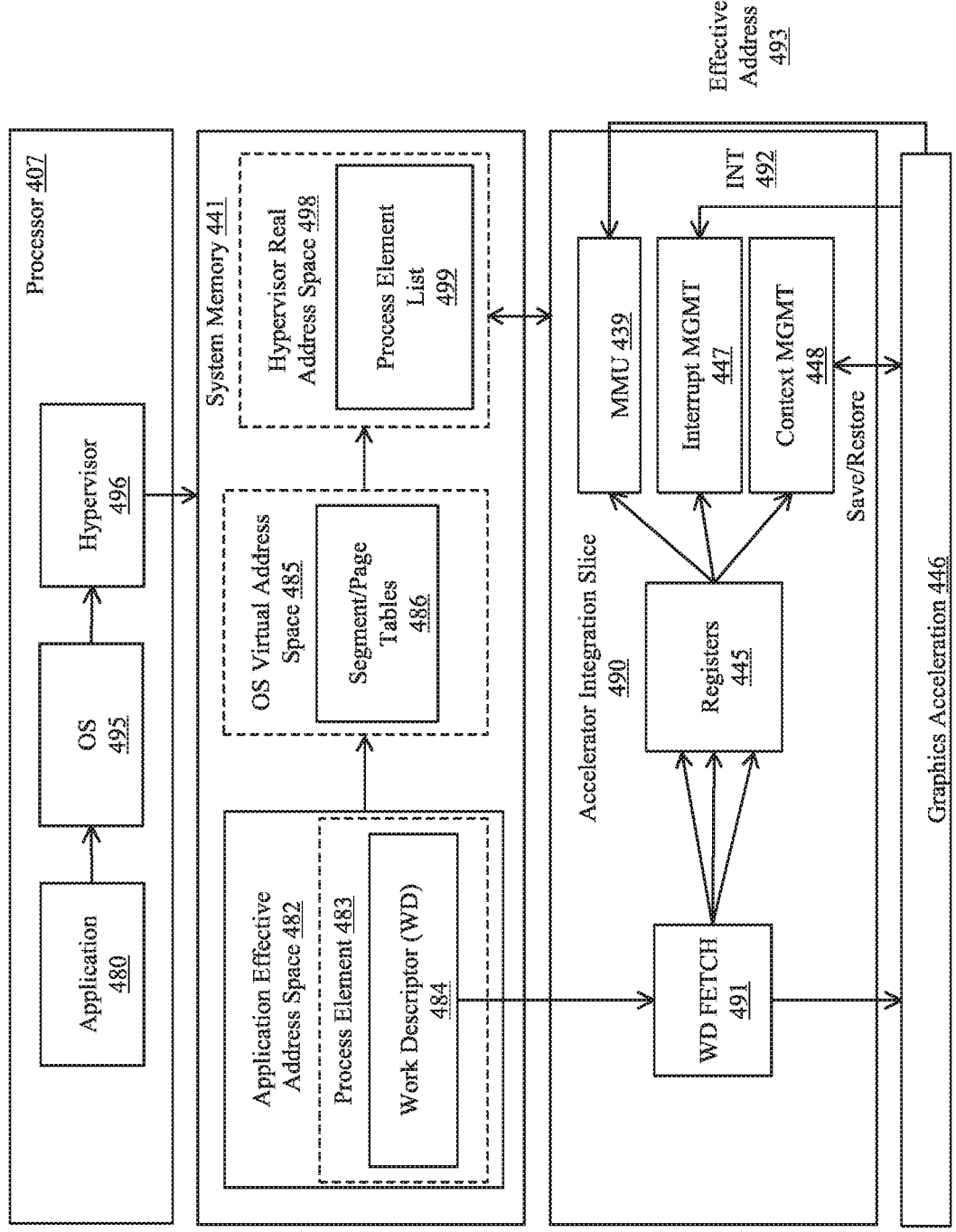

FIG. 4E illustrates additional details for one embodiment of a shared model. This embodiment includes a hypervisor real address space 498 in which a process element list 499 is stored. The hypervisor real address space 498 is accessible via a hypervisor 496 which virtualizes the graphics acceleration module engines for the operating system 495.

The shared programming models allow for all or a subset of processes from all or a subset of partitions in the system to use a graphics acceleration module 446. There are two programming models where the graphics acceleration module 446 is shared by multiple processes and partitions: time-sliced shared and graphics directed shared.

In this model, the system hypervisor 496 owns the graphics acceleration module 446 and makes its function available to all operating systems 495. For a graphics acceleration module 446 to support virtualization by the system hypervisor 496, the graphics acceleration module 446 may adhere to the following requirements: 1) An application's job request must be autonomous (that is, the state does not need to be maintained between jobs), or the graphics acceleration module 446 must provide a context save and restore mechanism. 2) An application's job request is guaranteed by the graphics acceleration module 446 to complete in a specified amount of time, including any translation faults, or the graphics acceleration module 446 provides the ability to preempt the processing of the job. 3) The graphics acceleration module 446 must be guaranteed fairness between processes when operating in the directed shared programming model.

In one embodiment, for the shared model, the application 480 is required to make an operating system 495 system call with a graphics acceleration module 446 type, a work descriptor (WD), an authority mask register (AMR) value, and a context save/restore area pointer (CSRP). The graphics acceleration module 446 type describes the targeted acceleration function for the system call. The graphics acceleration module 446 type may be a system-specific value. The WD is formatted specifically for the graphics acceleration module 446 and can be in the form of a graphics acceleration module 446 command, an effective address pointer to a user-defined structure, an effective address pointer to a queue of commands, or any other data structure to describe the work to be done by the graphics acceleration module 446. In one embodiment, the AMR value is the AMR state to use for the current process. The value passed to the operating system is similar to an application setting the AMR. If the accelerator integration circuit 436 and graphics acceleration module 446 implementations do not support a User Authority Mask Override Register (UAMOR), the operating system may apply the current UAMOR value to the AMR value before passing the AMR in the hypervisor call. The hypervisor 496 may optionally apply the current Authority Mask Override Register (AMOR) value before placing the AMR into the process element 483. In one embodiment, the CSRP is one of the registers 445 containing the effective address of an area in the application's address space 482 for the graphics acceleration module 446 to save and restore the context state. This pointer is optional if no state is required to be saved between jobs or when a job is preempted. The context save/restore area may be pinned system memory.

Upon receiving the system call, the operating system 495 may verify that the application 480 has registered and been given the authority to use the graphics acceleration module 446. The operating system 495 then calls the hypervisor 496 with the information shown in Table 3.

TABLE 3

OS to Hypervisor Call Parameters

| | |
|---|---|
| 1 | A work descriptor (WD) |
| 2 | An Authority Mask Register (AMR) value (potentially masked). |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | The virtual address of the storage segment table pointer (SSTP) |
| 7 | A logical interrupt service number (LISN) |

Upon receiving the hypervisor call, the hypervisor 496 verifies that the operating system 495 has registered and been given the authority to use the graphics acceleration module 446. The hypervisor 496 then puts the process element 483 into the process element linked list for the corresponding graphics acceleration module 446 type. The process element may include the information shown in Table 4.

TABLE 4

Process Element Information

| | |
|---|---|
| 1 | A work descriptor (WD) |
| 2 | An Authority Mask Register (AMR) value (potentially masked). |

TABLE 4-continued

Process Element Information

3 An effective address (EA) Context Save/Restore Area Pointer (CSRP)
4 A process ID (PID) and optional thread ID (TID)
5 A virtual address (VA) accelerator utilization record pointer (AURP)
6 The virtual address of the storage segment table pointer (SSTP)
7 A logical interrupt service number (LISN)
8 Interrupt vector table, derived from the hypervisor call parameters.
9 A state register (SR) value
10 A logical partition ID (LPID)
11 A real address (RA) hypervisor accelerator utilization record pointer
12 The Storage Descriptor Register (SDR)

In one embodiment, the hypervisor initializes a plurality of accelerator integration slice 490 registers 445.

Figure 4F:
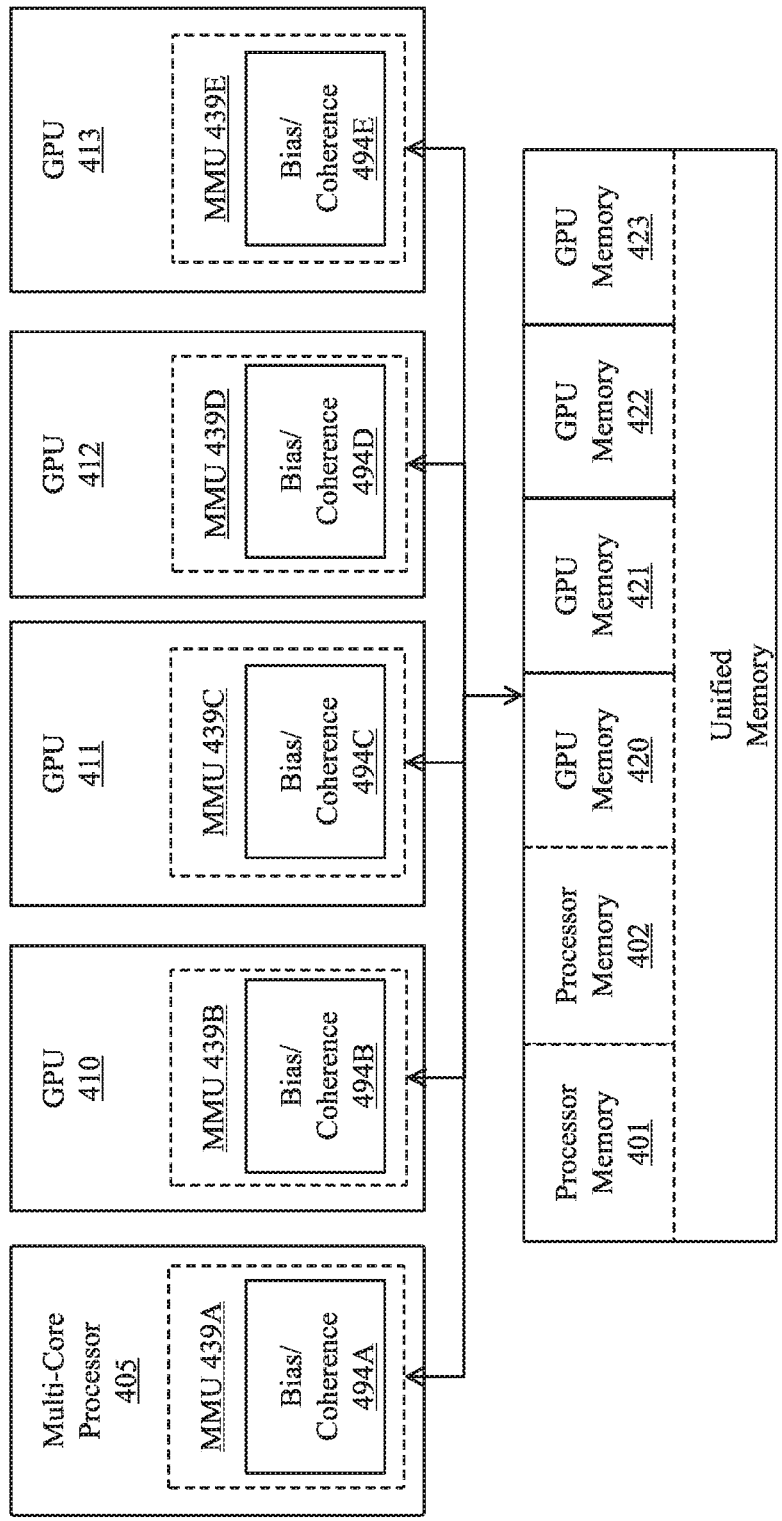

As illustrated in FIG. 4F, one embodiment of the invention employs a unified memory addressable via a common virtual memory address space used to access the physical processor memories 401-402 and GPU memories 420-423. In this implementation, operations executed on the GPUs 410-413 utilize the same virtual/effective memory address space to access the processors memories 401-402 and vice versa, thereby simplifying programmability. In one embodiment, a first portion of the virtual/effective address space is allocated to the processor memory 401, a second portion to the second processor memory 402, a third portion to the GPU memory 420, and so on. The entire virtual/effective memory space (sometimes referred to as the effective address space) is thereby distributed across each of the processor memories 401-402 and GPU memories 420-423, allowing any processor or GPU to access any physical memory with a virtual address mapped to that memory.

In one embodiment, bias/coherence management circuitry 494A-494E within one or more of the MMUs 439A-439E ensures cache coherence between the caches of the host processors (e.g., 405) and the GPUs 410-413 and also implements biasing techniques indicating the physical memories in which certain types of data should be stored. While multiple instances of bias/coherence management circuitry 494A-494E are illustrated in FIG. 4F, the bias/coherence circuitry may be implemented within the MMU of one or more host processors 405 and/or within the accelerator integration circuit 436.

One embodiment allows GPU-attached memory 420-423 to be mapped as part of system memory, and accessed using shared virtual memory (SVM) technology, but without suffering the typical performance drawbacks associated with full system cache coherence. The ability to GPU-attached memory 420-423 to be accessed as system memory without onerous cache coherence overhead provides a beneficial operating environment for GPU offload. This arrangement allows the host processor 405 software to setup operands and access computation results, without the overhead of tradition I/O DMA data copies. Such traditional copies involve driver calls, interrupts and memory mapped I/O (MMIO) accesses that are all inefficient relative to simple memory accesses. At the same time, the ability to access GPU attached memory 420-423 without cache coherence overheads can be critical to the execution time of an offloaded computation. In cases with substantial streaming write memory traffic, for example, cache coherence overhead can significantly reduce the effective write bandwidth seen by a GPU 410-413. The efficiency of operand setup, the efficiency of results access, and the efficiency of GPU computation all play a role in determining the effectiveness of GPU offload.

In one implementation, the selection of between GPU bias and host processor bias is driven by a bias tracker data structure. A bias table may be used, for example, which may be a page-granular structure (i.e., controlled at the granularity of a memory page) that includes 1 or 2 bits per GPU-attached memory page. The bias table may be implemented in a stolen memory range of one or more GPU-attached memories 420-423, with or without a bias cache in the GPU 410-413 (e.g., to cache frequently/recently used entries of the bias table). Alternatively, the entire bias table may be maintained within the GPU.

In one implementation, the bias table entry associated with each access to the GPU-attached memory 420-423 is accessed prior the actual access to the GPU memory, causing the following operations. First, local requests from the GPU 410-413 that find their page in GPU bias are forwarded directly to a corresponding GPU memory 420-423. Local requests from the GPU that find their page in host bias are forwarded to the processor 405 (e.g., over a high-speed link as discussed above). In one embodiment, requests from the processor 405 that find the requested page in host processor bias complete the request like a normal memory read. Alternatively, requests directed to a GPU-biased page may be forwarded to the GPU 410-413. The GPU may then transition the page to a host processor bias if it is not currently using the page.

The bias state of a page can be changed either by a software-based mechanism, a hardware-assisted software-based mechanism, or, for a limited set of cases, a purely hardware-based mechanism.

One mechanism for changing the bias state employs an API call (e.g. OpenCL), which, in turn, calls the GPU's device driver which, in turn, sends a message (or enqueues a command descriptor) to the GPU directing it to change the bias state and, for some transitions, perform a cache flushing operation in the host. The cache flushing operation is required for a transition from host processor 405 bias to GPU bias, but is not required for the opposite transition.

In one embodiment, cache coherency is maintained by temporarily rendering GPU-biased pages uncacheable by the host processor 405. In order to access these pages, the processor 405 may request access from the GPU 410 which may or may not grant access right away, depending on the implementation. Thus, to reduce communication between the processor 405 and GPU 410 it is beneficial to ensure that GPU-biased pages are those which are required by the GPU but not the host processor 405 and vice versa.

Graphics Processing Pipeline

Figure 5:
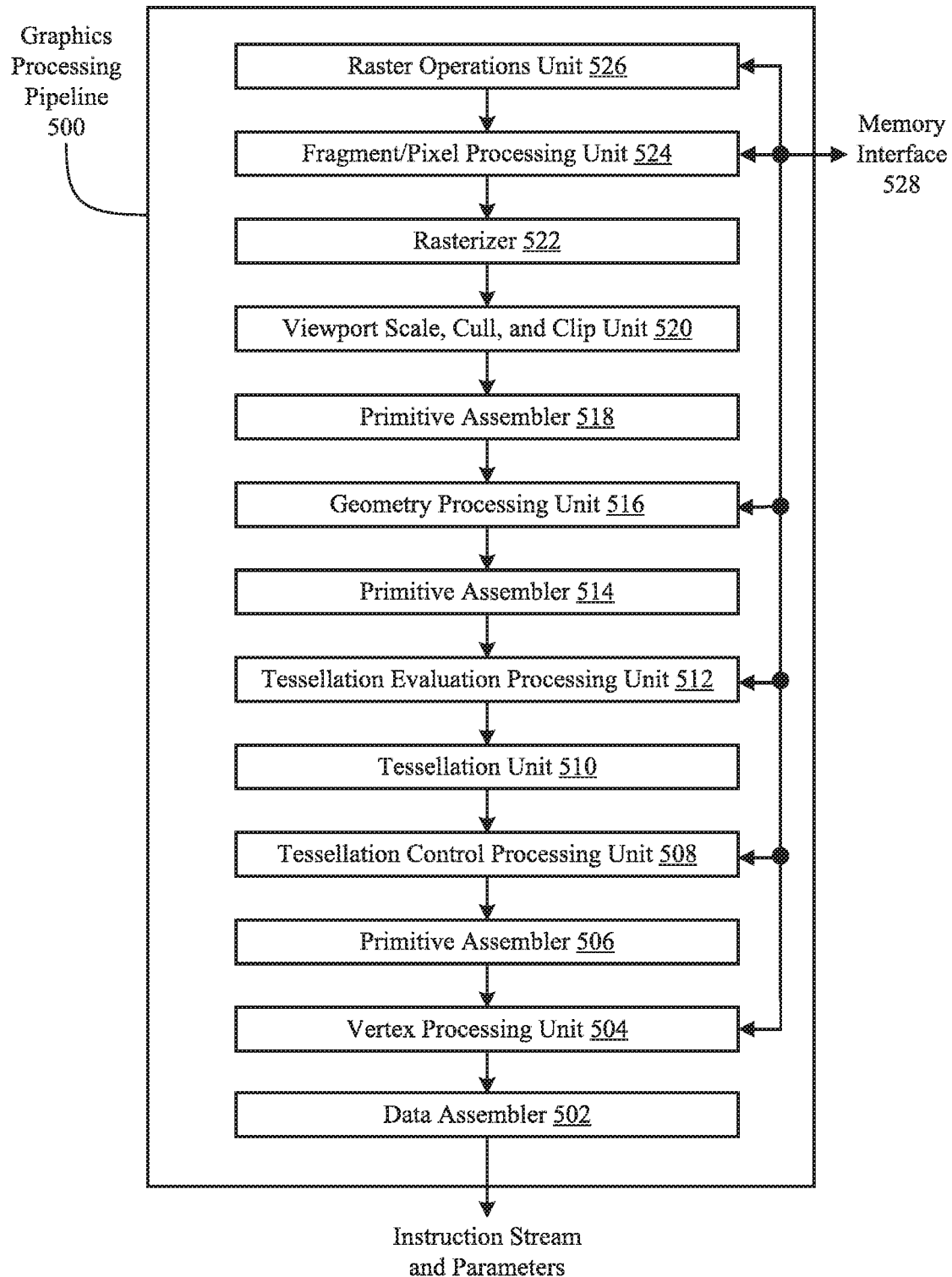
FIG. 5 is a conceptual diagram of a graphics processing pipeline, according to an embodiment.

FIG. 5 is a conceptual diagram of a graphics processing pipeline 500, according to an embodiment. In one embodiment, a graphics processor can implement the illustrated graphics processing pipeline 500. The graphics processor can be included within the parallel processing subsystems as described herein, such as the parallel processor 200 of FIG. 2, which, in one embodiment, is a variant of the parallel processor(s) 112 of FIG. 1. The various parallel processing systems can implement the graphics processing pipeline 500 via one or more instances of the parallel processing unit (e.g., parallel processing unit 202 of FIG. 2) as described herein. For example, a shader unit (e.g., graphics multiprocessor 234 of FIG. 3) may be configured to perform the functions of one or more of a vertex processing unit 504, a tessellation control processing unit 508, a tessellation evaluation processing unit 512, a geometry processing unit 516, and a fragment/pixel processing unit 524. The functions of data assembler 502, primitive assemblers 506, 514, 518, tessellation unit 510, rasterizer 522, and raster operations unit 526 may also be performed by other processing engines within a processing cluster (e.g., processing cluster 214 of FIG. 3) and a corresponding partition unit (e.g., partition unit 220A-220N of FIG. 2). Alternately, the graphics processing pipeline 500 may be implemented using dedicated processing units for one or more functions. In one embodiment, one or more portions of the graphics processing pipeline 500 can be performed in by a parallel processing logic within a general-purpose processor (e.g., CPU). In one embodiment, one or more portions of the graphics processing pipeline 500 can access on-chip memory (e.g., parallel processor memory 222 as in FIG. 2) via a memory interface 528, which may be an instance of the memory interface 218 of FIG. 2.

In one embodiment, the data assembler 502 is a processing unit that collects vertex data for high-order surfaces, primitives, etc., and outputs the vertex data, including the vertex attributes, to the vertex processing unit 504. The vertex processing unit 504 is a programmable execution unit that is configured to execute vertex shader programs, lighting and transforming vertex data as specified by the vertex shader programs. For example, vertex processing unit 504 may be programmed to transform the vertex data from an object-based coordinate representation (object space) to an alternatively based coordinate system such as world space or normalized device coordinates (NDC) space. Vertex processing unit 504 may read data that is stored in cache, local or system memory for use in processing the vertex data.

A first instance of a primitive assembler 506 receives vertex attributes from the vertex processing unit 504, reading stored vertex attributes as needed, and constructs graphics primitives for processing by tessellation control processing unit 508, where the graphics primitives include triangles, line segments, points, patches, and so forth, as supported by various graphics processing application programming interfaces (APIs).

The tessellation control processing unit 508 treats the input vertices as control points for a geometric patch and transforms these control points from the patch's input representation, often called the patch's basis, into a representation suitable for efficient surface evaluation by the tessellation evaluation processing unit 512. The tessellation control processing unit 508 also computes tessellation factors for edges of geometric patches. A tessellation factor applies to a single edge and quantifies a view-dependent level of detail associated with the edge. A tessellation unit 510 is configured to receive the tessellation factors for edges of a patch and to tessellate the patch into multiple geometric primitives such as line, triangle, or quadrilateral primitives, which are transmitted to a tessellation evaluation processing unit 512. The tessellation evaluation processing unit 512 operates on parameterized coordinates of the subdivided patch to generate a surface representation and vertex attributes for each vertex associated with the geometric primitives.

A second instance of a primitive assembler 514 receives vertex attributes from the tessellation evaluation processing unit 512, reading stored vertex attributes as needed, and constructs graphics primitives for processing by the geometry processing unit 516. The geometry processing unit 516 is a programmable execution unit that is configured to execute geometry shader programs, transforming graphics primitives received from primitive assembler 514 as specified by the geometry shader programs. For example, the geometry processing unit 516 may be programmed to subdivide the graphics primitives into one or more new graphics primitives and calculate parameters, such as plane equation coefficients, that are used to rasterize the new graphics primitives.

In some embodiments, the geometry processing unit 516 may also add or delete elements in the geometry stream. Geometry processing unit 516 outputs the parameters and vertices specifying new graphics primitives to primitive assembler 518, which receives the parameters and vertices from the geometry processing unit 516, reading stored vertex attributes, as needed, and constructs graphics primitives for processing by a viewport scale, cull, and clip unit 520. The geometry processing unit 516 may read data that is stored in parallel processor memory or system memory for use in processing the geometry data. The viewport scale, cull, and clip unit 520 performs clipping, culling, and viewport scaling and outputs processed graphics primitives to a rasterizer 522.

The rasterizer 522 scan converts the new graphics primitives and outputs fragment and coverage data to the fragment/pixel processing unit 524. Additionally, the rasterizer 522 may be configured to perform z culling and other z-based optimizations.

The fragment/pixel processing unit 524 is a programmable execution unit that is configured to execute fragment shader programs or pixel shader programs. The fragment/pixel processing unit 524 transforming fragments or pixels received from rasterizer 522, as specified by the fragment or pixel shader programs. For example, the fragment/pixel processing unit 524 may be programmed to perform operations such as perspective correction, texture mapping, shading, blending, and the like, to produce shaded fragments or pixels that are output to raster operations unit 526. The fragment/pixel processing unit 524 may read data that is stored in parallel processor memory or system memory for use in processing the fragment data. Fragment or pixel shader programs may be configured to shade at the sample, pixel, tile, or other granularity, depending on the programmed sampling rate.

The raster operations unit 526 is a processing unit that performs raster operations, such as stencil, z test, blending, and the like, and outputs pixel data as processed graphics data for storage in graphics memory. The processed graphics data may be stored in graphics memory, e.g., parallel processor memory 222 as in FIG. 2, and/or system memory 104 as in FIG. 1, for display on one of the one or more display device(s) 110 or for further processing by one of the one or more processor(s) 102 or parallel processor(s)112. In some embodiments, the raster operations unit 526 is configured to compress z or color data that is written to memory and decompress z or color data that is read from memory.

Power Management of Memory Chips

Figure 6A:
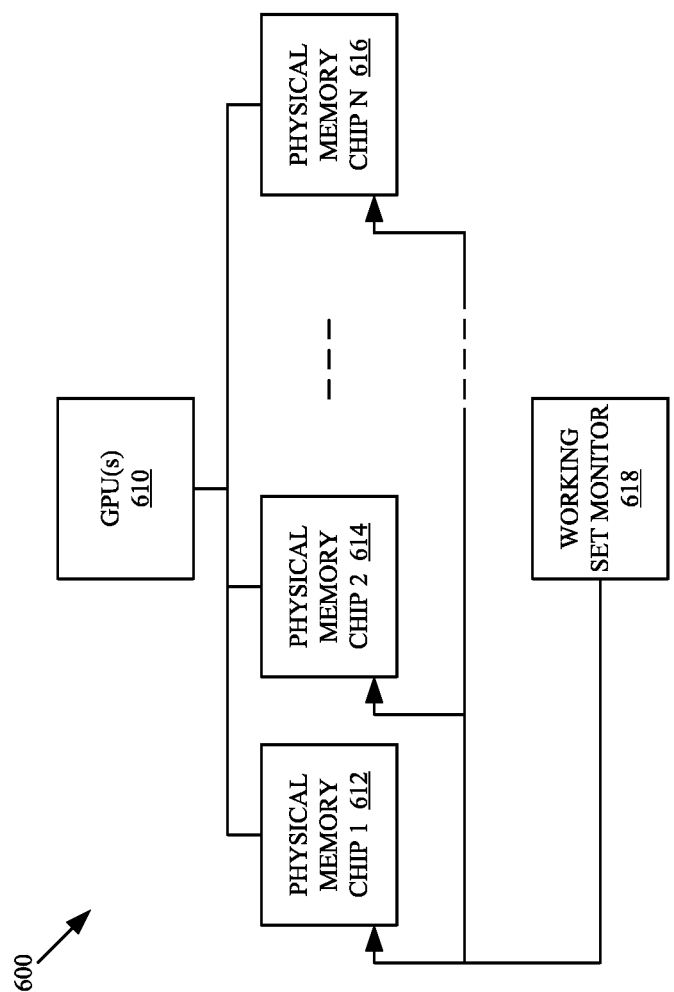
FIGS. 6A-6B are block diagrams of a system architecture to implement power management of memory chips using a working set monitor in accordance with one or more embodiments.
Figure 6B:
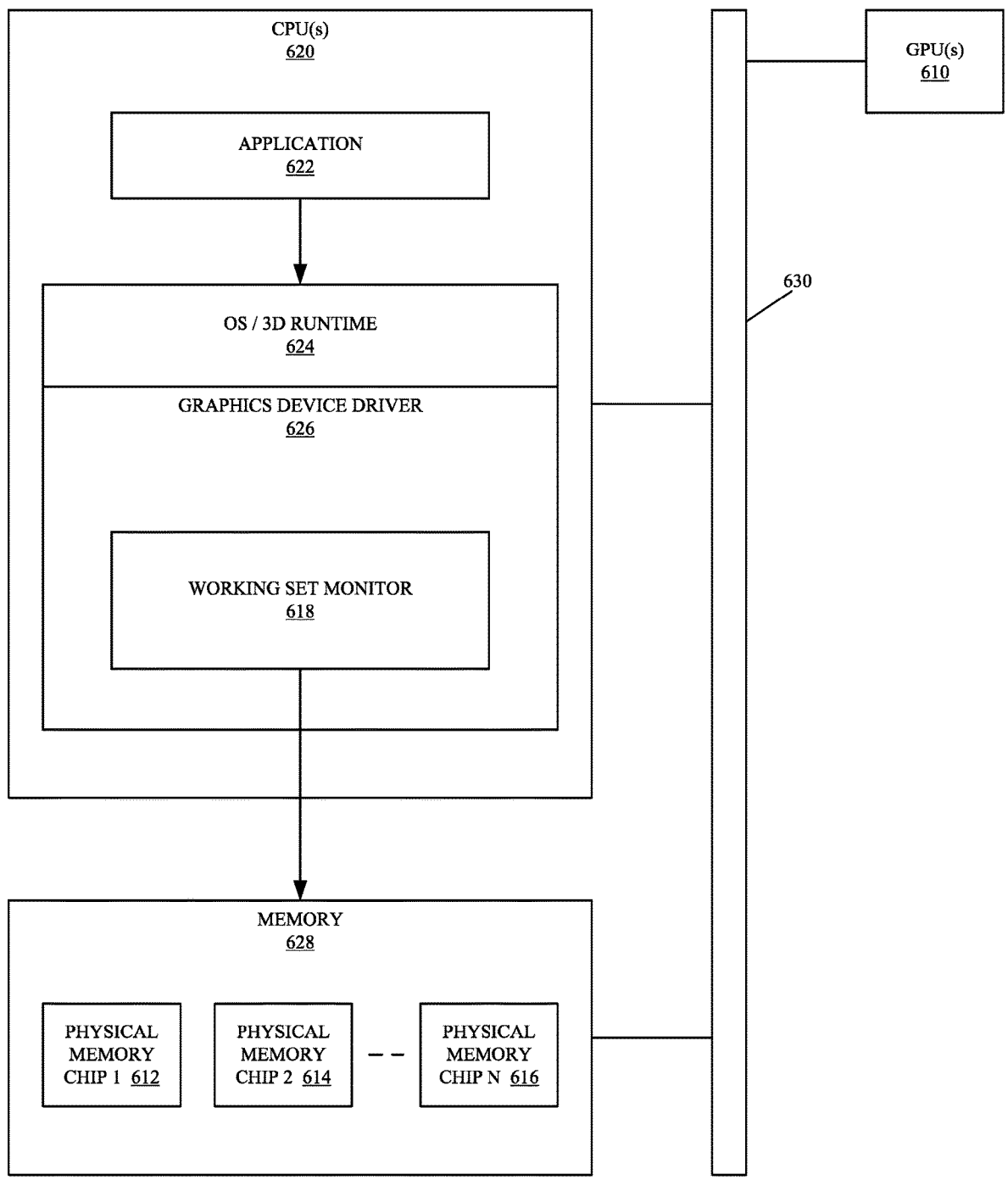

Referring now to FIGS. 6A-6B, block diagrams of a system architecture to implement power management of memory chips using a working set monitor in accordance with one or more embodiments will be discussed. In system architecture 600, one or more graphics processing units (GPUs) 610 may couple with one or more physical memory chips, including a first physical memory chip (Physical Memory Chip 1) 612, a second physical memory chip (Physical Memory Chip 2) 614, up to an Nth memory chip (Physical Memory Chip 3) 616. As shown in FIG. 6A, a working set monitor (WSM) 618 may couple with the physical memory chips to track the active memory working set. Working set monitor 618 may monitor the memory set, and unused memory ranks or channels, depending on the memory and its organization, may be placed into lower power modes, and the refresh to these unused memories may be disabled. In some embodiments, power to the memory devices, ranks or channels, may be completely shut off, and the power consumption of these devices may be reduced to zero or nearly zero. In one or more embodiments, working set monitor 618 tracks physical memory usage by applications. If the usage is less than the total available memory, then working set monitor 618 may shut down the physical memory chips that aren't needed, and also may power up chips as usage increases.

As shown in FIG. 6B, working set monitor (WSM) 618 may be part of a graphics device driver 626, and may track the physical memory chip usage of an application 622 running on one or more central processing units (CPUs) 620. Working set monitor 618 may communicate with application 622 via the operating system (OS) and/or three-dimensional (3D) runtime 624, and may monitor the memory 628 that comprises the one or more physical memory chips. The one or more CPUs 620 and/or one more GPUs 610 may coupe with memory 628 via a system bus 630 which also may comprise a crossbar switch, and memory 628 may comprise a shared memory or a unified memory, although the scope of the claimed subject matter is not limited in this respect.

If memory usage is less than total available memory, then working set monitor 618 may power down physical memory chips that are not needed. Alternatively, individual stacked on chip dies or ranks or channels or entire dual in-line memory modules (DIMMs) may be powered down as demand warrants, rather than individual chips being powered down, or combinations of thereof. Conversely, if memory usage will exceed the currently used number of memory chips, then working set monitor 618 will power up additional memory chips to accommodate the increased memory requirements.

In one embodiment, working set monitor 618 could evaluate the application memory requirements once, for example either when the application starts up, or during an explicit profiling pass. Working set monitor 618 would then power the required amount of physical memory chips based on this initial measurement and leave memory 628 configured at that level for the lifetime of application 622. In an alternate embodiment, working set monitor 618 may periodically re-evaluate memory usage, for example once per frame, once a minute, and so on, and change the amount of powered physical memory space as needed by the working set to be resident in the physical memory chips. Such an approach may involve a compaction process as shown in and described with respect to FIG. 7B, below.

The extent of powering down the physical memory devices may be flexible. For example, if working set monitor 618 is operating at a fine granularity, then the memory controller (not shown) for memory 628 will place the physical memory chips or devices in power down modes with faster exit times. If performance degradation associated with powering up unused memory is able to be sustained, then the memory controller may place unused memory in deep power down modes, including for example, but not necessarily, cutting off the power supply to unused physical memory chips or devices or ranks or channels. Working in concert with working set monitor 618, the memory controller also may employ a hierarchical scheme, starting off with the fastest exit power down mode and progressively placing unused memory devices, ranks, and/or channels into deeper and deeper power down modes. In one embodiment, the memory controller will place the unused rank and/or channels in power down mode and remove the clock to the unused ranks and/or channels. Since the data in the unused memory is not needed, there is no reason to refresh the unused ranks and/or channels. Based at least in part on the information from working set monitor 618, the memory controller internally may track which ranks and/or channels are unused and does not send any more refresh commands to these ranks and/or channels. Also, when transitioning to self-refresh modes, the memory controller does not place unused memory in self-refresh, saving any refresh power. Flow diagrams illustrating these operations including the operation of working set monitor 618 are shown in and described with respect to FIG. 7A and FIG. 7B, below.

Figure 7A:
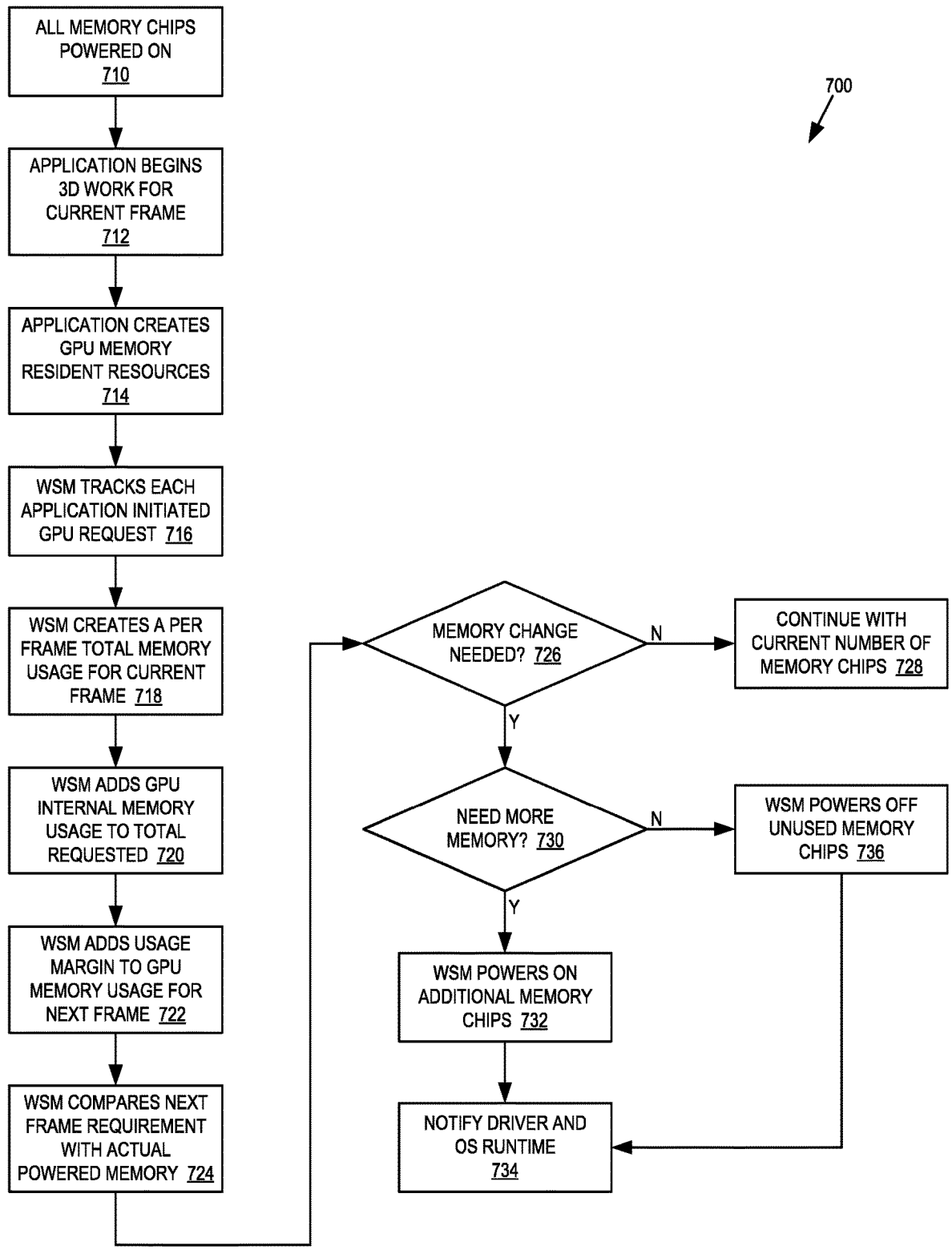
FIGS. 7A-7B are flow diagrams of memory size adjustment and shut down in accordance with one or more embodiments.
Figure 7B:
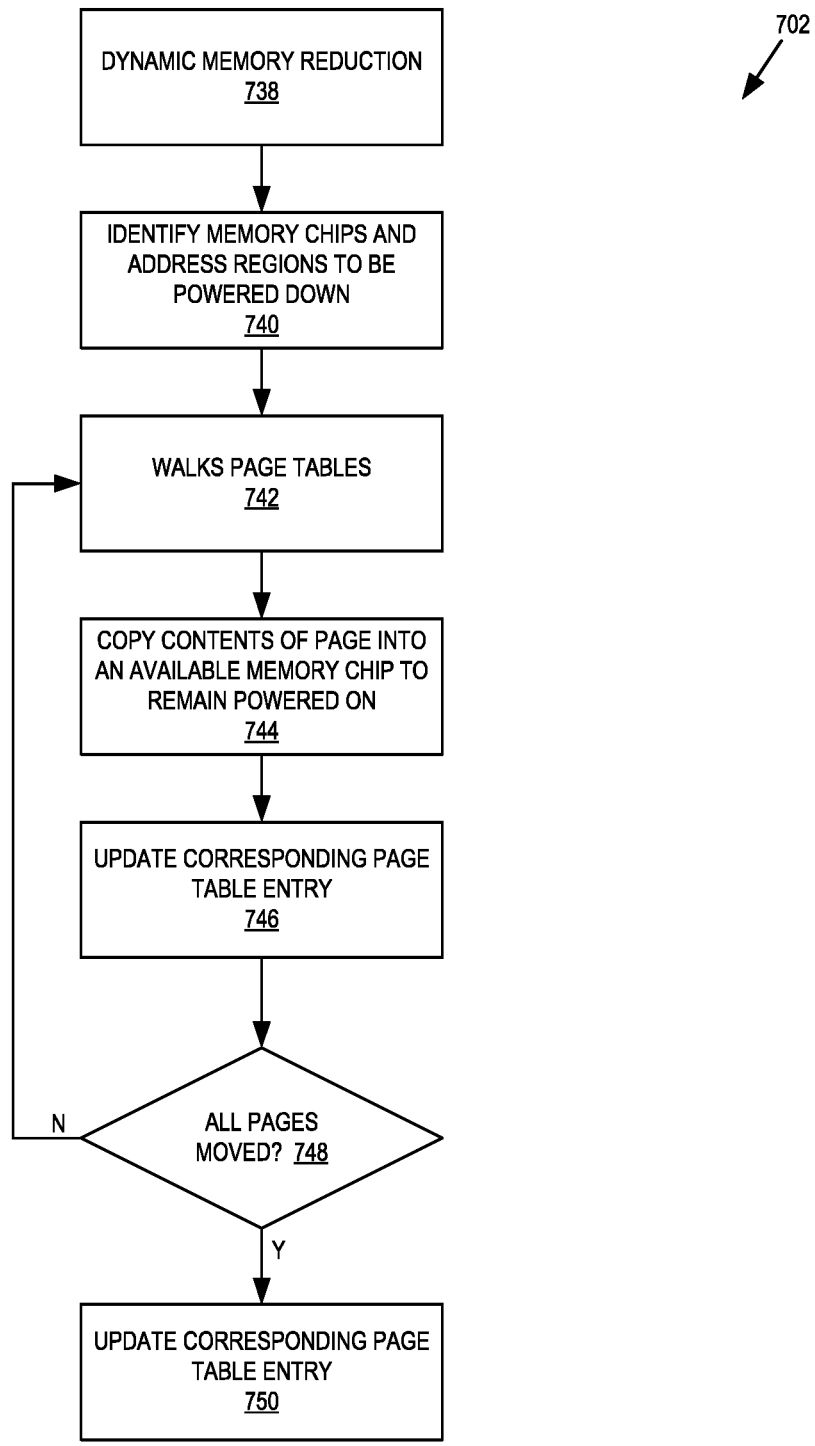

Referring now to FIGS. 7A-7B, flow diagrams of memory size adjustment and shut down in accordance with one or more embodiments will be discussed. Although FIG. 7A shows one particular order of method 700, it should be noted that method 700 also may include more or fewer blocks than shown, in various other orders, and the scope of the claimed subject matter is not limited in this respect. At block 710, the system may start operation will all memory chips powered on. At block 712, application 622 may begin 3D work for frame N. During a frame, application 622 may create GPU memory resident resources for textures, render targets, constant buffers, and so on. At block 716, working set monitor 618 may track each application initiated memory request. At block 718, working set monitor 618 creates a running, per frame total memory usage metric for the current frame, frame N. At block 720, working set monitor 618 add GPU internal memory usage to the total usage requested by application 622 to arrive at a total GPU memory usage for the current frame, frame N. At block 722, working set monitor 618 adds a usage margin, for example twenty percent (20%), to GPU memory usage to arrive at powered memory space requirement for the next frame, frame N+1.

At block 724, working set monitor 618 may compare the memory space requirement for the next frame with the actual powered memory space. A determination may be made at decision block 726 whether a memory change is needed based at least in part on the comparison made at block 724. If no change in the required memory is needed, then method 700 may continue at block 728 with the current number of powered on physical memory chips. If a change in the required memory is needed, then a determination may be made at decision block 730 whether more (or less) memory is needed. If more memory is needed in frame N+1 than the amount of memory provided by the number of memory chips that are currently powered on, then working set monitor 618 may power on one or more additional physical memory chips as needed to that the total amount of memory required in frame N+1 may be accommodated by the total number of powered on physical memory chips after the one or more additional physical memory chips are powered on. When the one or more additional physical memory chips are powered on and available for use, at block 734 working set monitor 618 notifies the graphics device driver 626 and/or OS/3D runtime 624 that the additional memory space, provided by the one or more additional physical memory chips that were powered on at block 732, is available for use.

In the event that a determination was made at decision block 730 that more memory is not needed, meaning under the logic of method 700 that less memory is needed, then at block 736 working set monitor 618 powers off one or more physical memory chips that will not be needed for frame N+1 and therefore will be unused. In one or more embodiments, working set monitor 618 may perform one or more profiling passes to create a memory usage profile for application 622 based on the observed usage of memory 628 by application 622. In some embodiments, a profile may be obtained from a remote location or server, for example from the developer of application 622, or may be installed the system when application 622 is installed, and the scope of the claimed subject matter is not limited in this respect.

Once a profile is obtained for a particular application 622, the profile may be utilized by control when one or more physical memory chips may be powered on or off. For example, working set monitor 618 may monitor the activity of application 622, and power on and/or power off one or more physical memory chips according to the profile. If the pass that resulted in one or more physical memory chips being turned off at block 736 was a profiling pass, and/or a first pass, then working set monitor 618 powers off unneeded memory chips at block 728, and working set monitor 618 may then notify graphics device driver 626 and/or OS/3D runtime 624 of the reduced memory usage at block 734. Since in this case the pass was a first pass and/or a first profiling pass, one or more physical memory blocks may be turned off if not needed as a result of the reduced memory usage. In one or more alternative embodiments, working set monitor 618 may dynamically monitor memory usage of application 622 during active execution of application 622, for example in real time or near real time. In such embodiments, deallocating memory may involve relocating data that may be stored on one or more physical memory chips that are to be powered down to one or more physical memory chips that are to remain powered on. A flow chart for such dynamic deallocating is shown in and described with respect to FIG. 7B, below.

FIG. 7B shows method 702 which may be implemented as part of method 700 where memory may be dynamically deallocated by working set monitor 618. Although FIG. 7B shows one particular order of method 702, it should be noted that method 702 also may include more or fewer blocks than shown, in various other orders, and the scope of the claimed subject matter is not limited in this respect. At block 738, working set monitor 618 may be configured to dynamically reduce available physical memory. At block 740, working set monitor 618 may identify physical memory chips and their corresponding address regions to be powered down based on the needed amount of physical memory needed for the next frame, frame N+1. At block 742, working set monitor 618 may walk the page tables, and at block 744 working set monitor 618 may copy the contents of a given page that has a physical residence in an address region of a physical memory chip that is to be powered down to an available memory region in physical memory chip that will remain on after the current power down operation. The contents of such pages are coped to the new location in a physical memory chip to remain powered on. At block 746, working set monitor 618 may update the corresponding page table entry for the copied contents.

A determination may be made at decision block 748 whether all pages residing on physical chips to be powered down have been moved to physical memory chips that will either be powered up or will remain powered on. If not all pages have been moved, then method 702 may continue at block 742 until all pages have been moved. Once a determination has been made that all pages to be moved have been moved, at block 750 working set monitor 618 may power down the physical memory chips to be powered off, and working set monitor 618 may notify the graphics device driver 626 and/or OS/3D runtime of the resulting newly available reduced addressable memory as the result of execution of method 702.

In one or more particular embodiments, power efficiency may be accomplished for graphics memory, such as graphics double data rate (GDDR) or high bandwidth memory (HBM), or the like, by moving all active surfaces being processed by CPU 620 and/or by GPU 610 to a certain set of memory channels. Memory that is connected to unused channels with surfaces in an image that are not currently accessed may be put into a self-refresh mode to save power. The basic principle of such embodiments may be as follows. The graphics device driver 626 or the OS/3D runtime 624 or real-time operating system (RTOS) and/or firmware running on CPU 620 or GPU 610 periodically may check all active pages, that is pages that are accessed, in memory 628. This check may be performed by checking the "Accessed" bit in the Page Table entries. If it is detected that only a subset of memory pages are being accessed, the RTOS "de-fragments" physical memory wherein the active pages are copied or swapped in to a small set of the physical memory chips such as physical memory chips 612 through physical memory chips 616. The inactive pages may be moved to other memory chips.

The graphics page table entries may be updated since the physical memory addresses are changed, but there is no change in the shader programs and/or surface states, and so on, since virtual addresses are unchanged. The physical memory chips with inactive or idle pages may be put in to self-refresh to save power. The page table entries of inactive pages may be set as "Invalid". As a result, when an access is made to one of those pages, a "Fault" happens. The fault is captured by graphics device driver 626 which signals the RTOS to take the memory chip out of self-refresh. This process of de-fragmentation and powering down of memory chips may be done periodically, for example once every few seconds, so that changes in the memory working set may be captured. Such an arrangement may operate to balance GPU load across the hardware resources of memory 628 more uniformly and hence achieve increased performance efficiency.

Power Components

Figure 8:
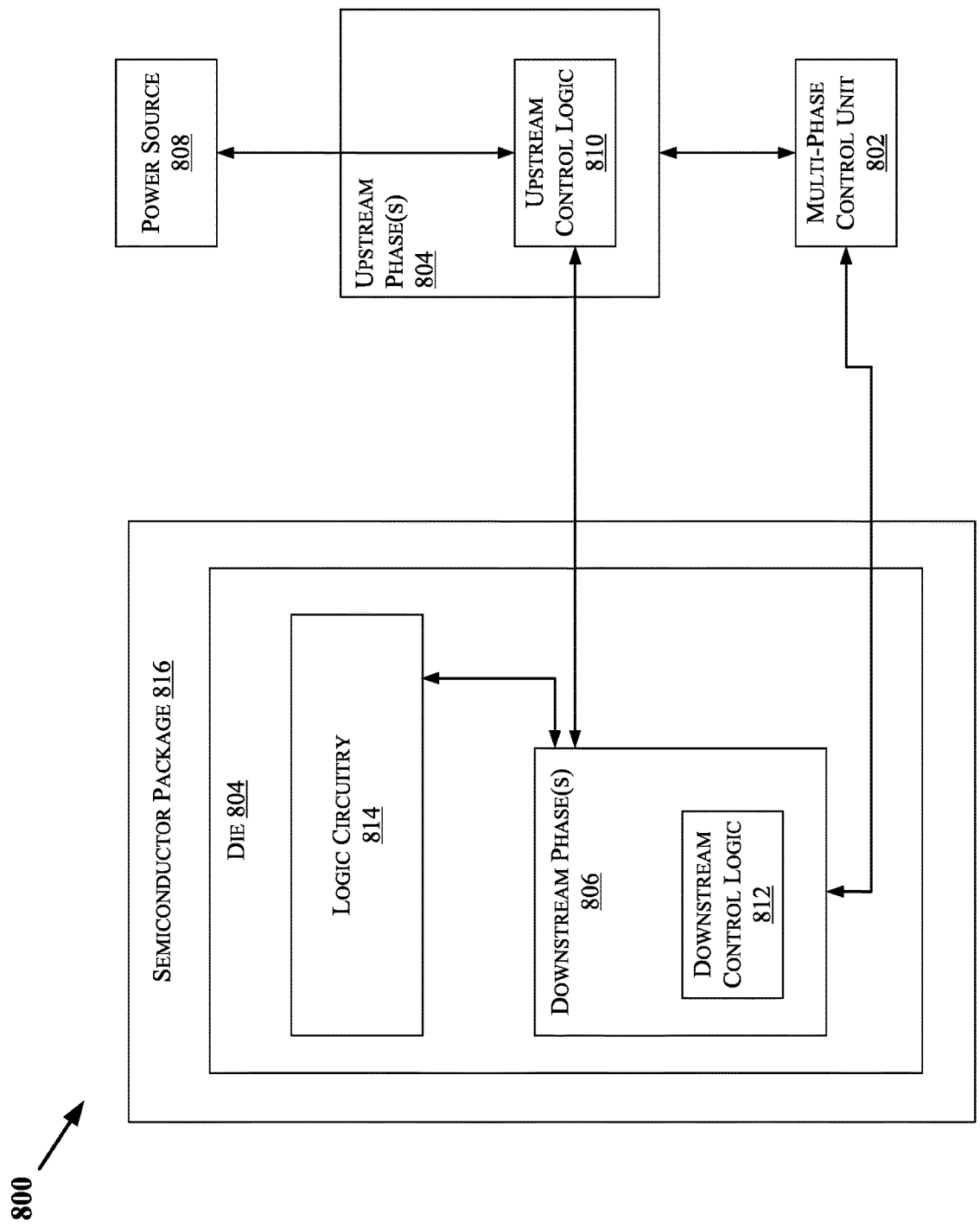
FIG. 8 is a block diagram of a switching regulator according to an embodiment.

FIG. 8 illustrates a block diagram of a switching regulator according to an embodiment. One or more switching regulators shown in FIG. 8 may be incorporated in various systems discussed herein to provide power to one or more Integrated Circuit (IC) chips. While a single phase of the current-parking switching regulator with a single inductor may be discussed with reference to FIG. 8, one or more of the multiple phases of the current-parking switching regulator may be implemented with a split inductor. Furthermore, a combination of one or more current-parking switching regulators (with or without a split inductor) may be used with one or more conventional electric power conversion devices to provide power to the load (e.g., logic circuitry 814).

More particularly, FIG. 8 illustrates a system 800 that includes a switching regulator (sometimes referred to as a current-parking switching regulator). The current-parking switching regulator may be a multi-phase switching regulator in various embodiments. The multi-phase control unit 802 is coupled to multiple phases, where each phase may include one or more upstream phases 804 and one or more downstream phases 806. As shown, an electrical power source 808 is coupled to upstream control logic 810 (which provides a current control mechanisms in each upstream phase). More than one upstream control logic may be used in various implementations. Each upstream phase may include an inductor (not shown) that is coupled to a respective downstream phase. In an embodiment, the upstream phases may each include one or more inductors. The multi-phase control unit 802 may configure any active upstream control logic 810, e.g., to generate a current through an inductor coupled between the upstream phases and the downstream phases. The downstream control logic 812 may be configured by the multi-phase control unit 802 to be ON, OFF, or switching to regulate the voltage level at the load (e.g., logic circuitry 814). In turn, the downstream control logic 812 may be configured by the multi-phase control unit 802 to maintain the voltage level at the load within a range based at least in part on V min (minimum voltage) and V max (maximum voltage) values.

In one embodiment, an inductor (coupled between a downstream phase and a respective upstream phase) may be positioned outside of a semiconductor package 816 that includes the load 814. Another inductor (not shown) may be positioned inside of the package 816, e.g., to reduce parasitic capacitance. In one embodiment, the inductor inside the package 816 may be a planar air-core inductor that is coupled to the logic circuitry 814 via one or more switching logic which include planar Metal-Oxide Semiconductor Field-Effect Transistors (MOSFETs). Furthermore, one or more of the components discussed herein (e.g., with reference to FIGS. 8, 9, and/or 10, including, for example, L3 cache, upstream control logic, and/or downstream control logic) may be provided in substrate layer(s) (e.g., between semiconductor packages), on an integrated circuit die, or outside of a semiconductor package (e.g., on a Printed Circuit Board (PCB)) in various embodiments.

Figure 9:
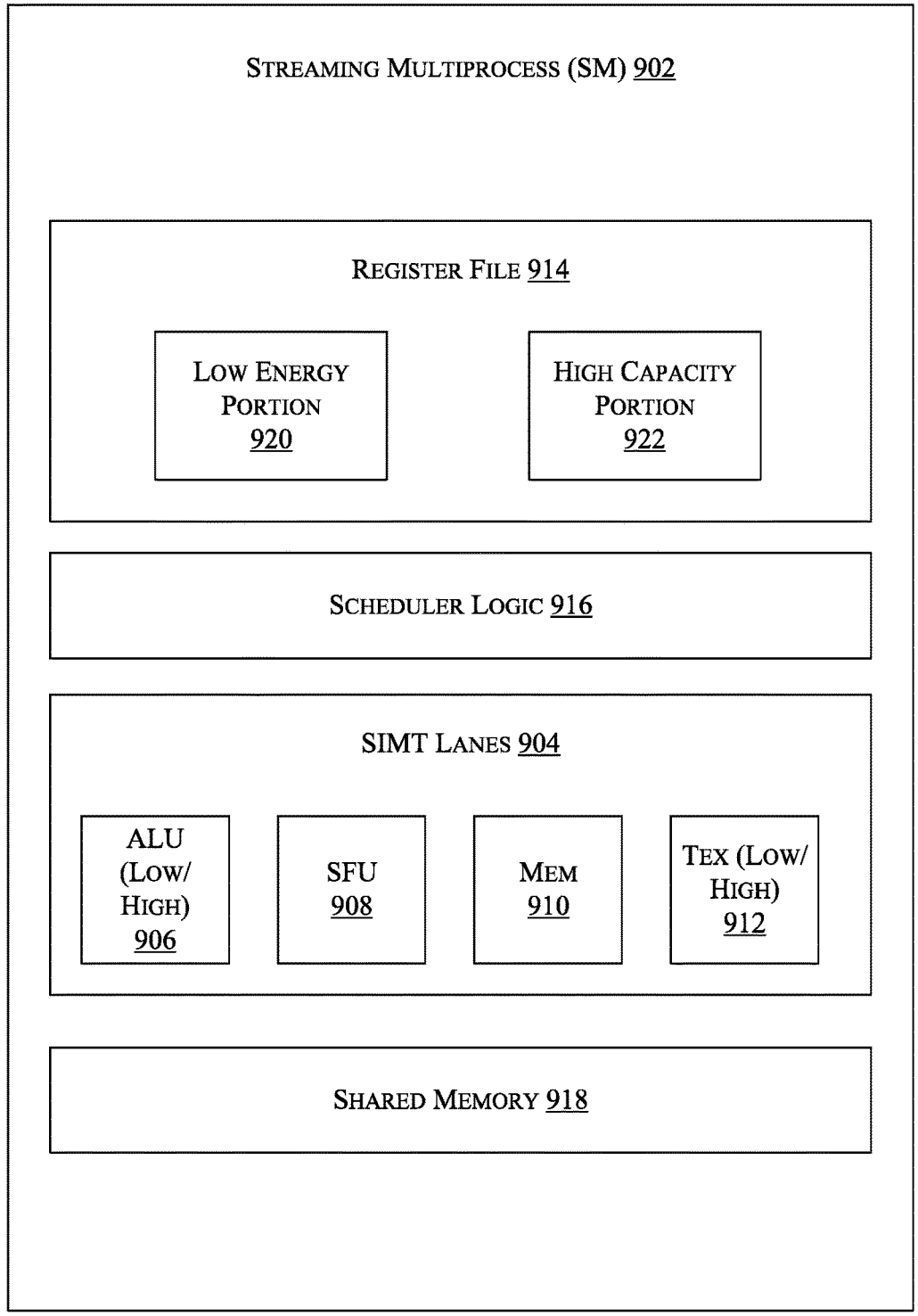
FIG. 9 is a block diagram of a system including a streaming multiprocessor, in accordance with one or more embodiments.

FIG. 9 is a block diagram of a system 900 including a streaming multiprocessor 902, in accordance with one or more embodiments. The streaming multiprocessor may include 32 Single-Instruction, Multiple Thread (SIMT) lanes 904 that are capable of collectively issuing up to 32 instructions per clock cycle, e.g., one from each of 32 threads. More or less lanes may be present depending on the implementation such as 64, 128, 256, etc. The SIMT lanes 904 may in turn include one or more: Arithmetic Logic Units (ALUs) 906, Special Function Units (SFUs) 908, memory units (MEM) 910, and/or texture units (TEX) 912.

In some embodiments, one or more of ALU(s) 906 and/or TEX unit(s) 912 may be low energy or high capacity, e.g., such as discussed with reference to items 920 and 922. For example, the system may map 100% of the register addresses for threads 0-30 to the low energy portion and 100% of the register addresses for threads 31-127 to the high capacity portion. As another example, the system may map 20% of each thread's registers to the low energy portion and to map 80% of each thread's registers to the high capacity portion. Moreover, the system may determine the number of entries allocated per thread based on runtime information.

As illustrated in FIG. 9, the streaming multiprocessor 902 also include a register file 914, a scheduler logic 916 (e.g., for scheduling threads or thread groups, or both), and shared memory 918, e.g., local scratch storage. As discussed herein, a "thread group" refers to a plurality of threads that are grouped with ordered (e.g., sequential or consecutive) thread indexes. Generally, a register file refers to an array of registers accessed by components of a processor (including a graphics processor) such as those discussed herein. The register file 914 includes a low energy portion or structure 920 and a high capacity portion or structure 922. The streaming multiprocessor 902 may be configured to address the register file 914 using a single logical namespace for both the low energy portion and the high capacity portion.

In some embodiments, the system may include a number of physical registers which can be shared by the simultaneously running threads on the system. This allows the system to use a single namespace to implement a flexible register mapping scheme. A compiler may then allocate register live ranges to register addresses, and the compiler may use a register allocation mechanism to minimize or reduce the number of registers used per thread. Multiple live ranges can be allocated to the same register address as long as the live ranges do not overlap in an embodiment. This allows for determination, e.g., at runtime and after instructions have been compiled, of how many entries per thread will be allocated in the low energy portion versus the high capacity portion. For example, the system may map 100% of the register addresses for threads 0-30 to the low energy portion and 100% of the register addresses for threads 31-127 to the high capacity portion. As another example, the system may map 20% of each thread's registers to the low energy portion and to map 80% of each thread's registers to the high capacity portion. The system may determine the number of entries allocated per thread based on runtime information, e.g., regarding the number of thread groups executing and the marginal benefit from launching more thread groups or allocating a smaller number of thread groups more space in the low energy portion.

Figure 10:
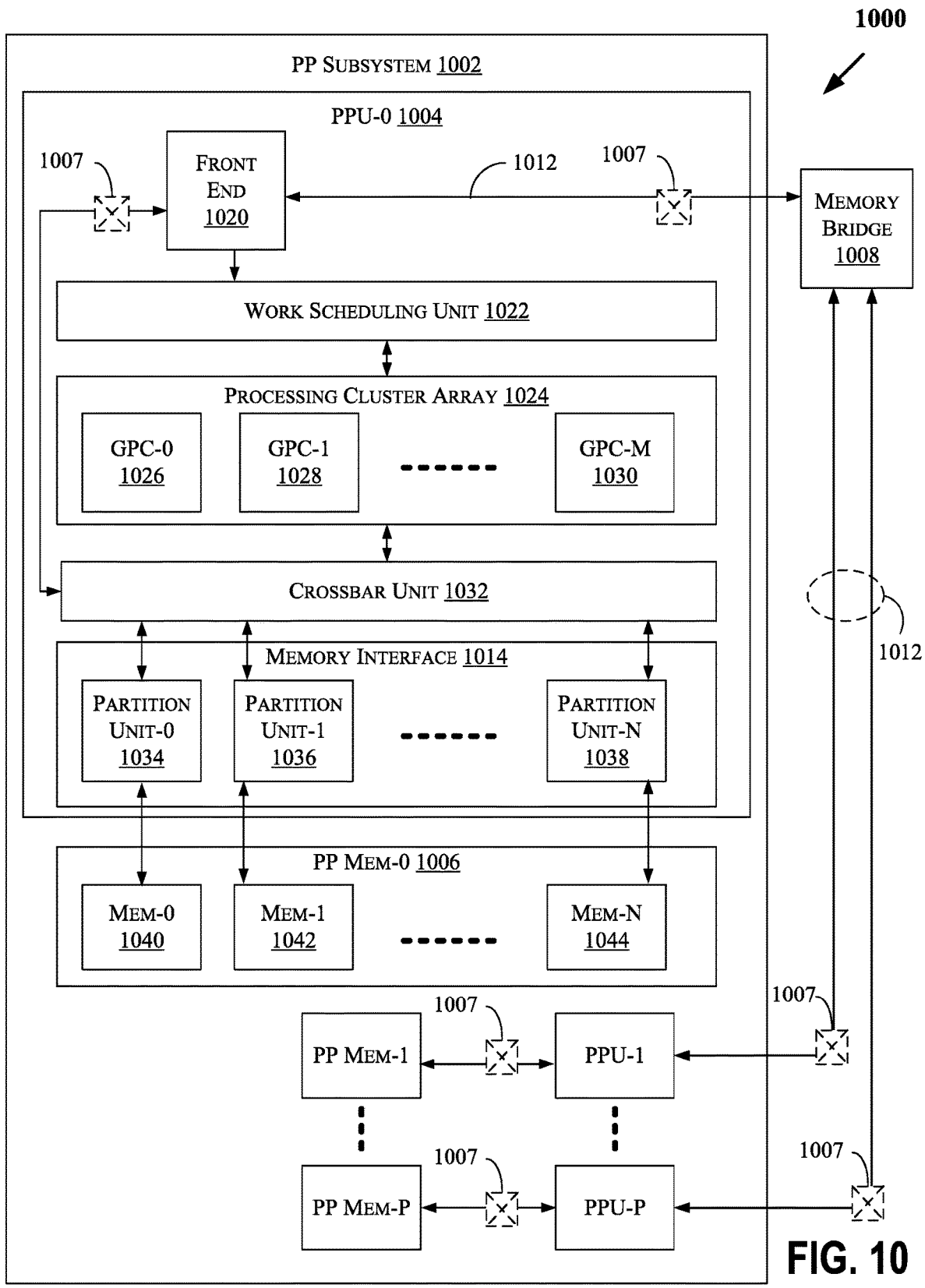
FIG. 10 is a block diagram of a parallel processing system, according to one embodiment.

FIG. 10 illustrates a block diagram of a parallel processing system 1000, according to one embodiment. System 1000 includes a Parallel Processing (Previously Presented) subsystem 1002 which in turn includes one or more Parallel Processing Units (PPUs) PPU-0 through PPU-P. Each PPU is coupled to a local Parallel Processing (PP) memory (e.g., Mem-0 through MEM-P, respectively). In some embodiments, the PP subsystem system 1002 may include P number of PPUs. PPU-0 1004 and parallel processing memories 1006 may be implemented using one or more integrated circuit devices, such as programmable processors, Application Specific Integrated Circuits (ASICs), or memory devices.

Referring to FIG. 10. several optional switch or connections 1007 are shown that may be used in system 1000 to manage power. While several switches 1007 are shown, embodiments are not limited to the specifically shown switches and more or less switches may be utilized depending on the implementation. These connections/switches 1007 may be utilized for clock gating or general power gating. Hence, items 1007 may include one or more of a power transistor, on-die switch, power plane connections, or the like. In an embodiment, prior to shutting power to a portion of system 1000 via switches/connections 1007, logic (e.g., a microcontroller, digital signal processor, firmware, etc.) may ensure the results of operation are committed (e.g., to memory) or finalized to maintain correctness.

Further, in some embodiments, one or more of PPUs in parallel processing subsystem 1002 are graphics processors with rendering pipelines that may be configured to perform various tasks such as those discussed herein with respect to other Figures. The graphics information/data may be communicated via memory bridge 1008 with other components of a computing system (including components of system 1000). The data may be communicated via a shared bus and/or one or more interconnect(s) 1010 (including, for example, one or more direct or point-to-point links). PPU-0 1004 may access its local parallel processing memory 1014 (which may be used as graphics memory including, e.g., a frame buffer) to store and update pixel data, delivering pixel data to a display device (such as those discussed herein), etc. In some embodiments, the parallel processing subsystem 1002 may include one or more PPUs that operate as graphics processors and one or more other PPUs that operate to perform general-purpose computations. The PPUs may be identical or different, and each PPU may have access to its own dedicated parallel processing memory device(s), no dedicated parallel processing memory device(s), or a shared memory device or cache.

In an embodiment, operations performed by PPUs may be controlled by another processor (or one of the PPUs) generally referred to as a master processor or processor core. In one embodiment, the master processor/core may write a stream of commands for each PPU to a push buffer in various locations such as a main system memory, a cache, or other memory such as those discussed herein with reference to other figures. The written commands may then be read by each PPU and executed asynchronously relative to the operation of master processor/core.

Furthermore, as shown in FIG. 10, PPU-0 includes a front-end logic 1020 which may include an Input/Output (I/O or IO) unit (e.g., to communicate with other components of system 1000 through the memory bridge 1008) and/or a host interface (e.g., which receives commands related to processing tasks). The front end 1020 may receive commands read by the host interface (for example from the push buffer)). The front end 1020 in turn provides the commands to a work scheduling unit 1022 that schedules and allocates operation(s)/task(s) associated with the commands to a processing cluster array or arithmetic subsystem 1024 for execution.

As shown in FIG. 10, the processing cluster array 1024 may include one or more General Processing Cluster (GPC) units (e.g., GPC-0 1026, GPC-1 1028, through GPC-M 1030). Each GPC may be capable of executing a large number (e.g., hundreds or thousands) of threads concurrently, where each thread is an instance of a program. In various applications, different GPCs may be allocated for processing different types of programs or for performing different types of computations. For example, in a graphics application, a first set of GPCs (e.g., including one or more GPC units) may be allocated to perform tessellation operations and to produce primitive topologies for patches, and a second set of GPCs (e.g., including one or more GPC units) may be allocated to perform tessellation shading to evaluate patch parameters for the primitive topologies and to determine vertex positions and other per-vertex attributes. The allocation of GPCs may vary depending on the workload arising for each type of program or computation.

Additionally, processing tasks that are assigned by the work scheduling unit 1022 may include indices of data to be processed, such surface/patch data, primitive data, vertex data, pixel data, and/or state parameters and commands defining how the data is to be processed (e.g., what program is to be executed). The work scheduling unit 1022 may be configured to fetch the indices corresponding to the tasks, or may receive the indices from front end 1020. Front end 1020 may also ensure that GPCs are configured to a valid state before the processing specified by the push buffers is initiated.

In one embodiment, the communication path 1012 is a Peripheral Component Interface (PCI) express (or PCI-e) link, in which dedicated lanes may be allocated to each PPU. Other communication paths may also be used. For example, commands related to processing tasks may be directed to the host interface 1018, while commands related to memory operations (e.g., reading from or writing to parallel processing memory 1014) may be directed to a memory crossbar unit 1032.

In some embodiments, parallel processing subsystem 1002 may be implemented as an add-in card that is inserted into an expansion slot of computer system or server (such as a blade server). In other embodiments, a PPU may be integrated on a single chip with a bus bridge, such as memory bridge 1008, an I/O bridge, etc. In still other embodiments, some or all components of PPU may be integrated on a single integrated circuit chip with one or more other processor cores, memory devices, caches, etc.

Referring to FIG. 10, memory interface 1014 includes N partition units (e.g., Unit-0 1034, Unit-1 1036, through Unit-N 10-38) that are each directly coupled to a corresponding portion of parallel processing memory 1006 (such as Mem-0 1040, Mem-1 1042, through Mem-N 1044). The number of partition units may generally be equal to the number of Previously Presented memory (or N as shown). The Previously Presented memory may be implemented with volatile memory such as Dynamic Random Access Memory (DRAM) or other types of volatile memory such as those discussed herein. In other embodiments, the number of partition units may not equal the number of memory devices. Graphics data (such as render targets, frame buffers, or texture maps) may be stored across Previously Presented memory devices, allowing partition units to write portions of graphics data in parallel to efficiently use the available bandwidth of the parallel processing memory 1006.

Furthermore, any one of GPCs may process data to be written to any of the partition units within the parallel processing memory. Crossbar unit 1032 may be implemented as an interconnect that is configured to route the output of each GPC to the input of any partition unit or to another GPC for further processing. Hence, GPCs 1026 to 1030 may communicate with memory interface 1014 through crossbar unit 1032 to read from or write to various other (or external) memory devices. As shown, crossbar unit 1032 may directly communicate with the front end 1020, as well as having a coupling (direct or indirect) to local memory 1006, to allow the processing cores within the different GPCs to communicate with system memory and/or other memory that is not local to PPU. Furthermore, the crossbar unit 1032 may utilize virtual channels to organize traffic streams between the GPCs and partition units.

System Overview

Figure 11:
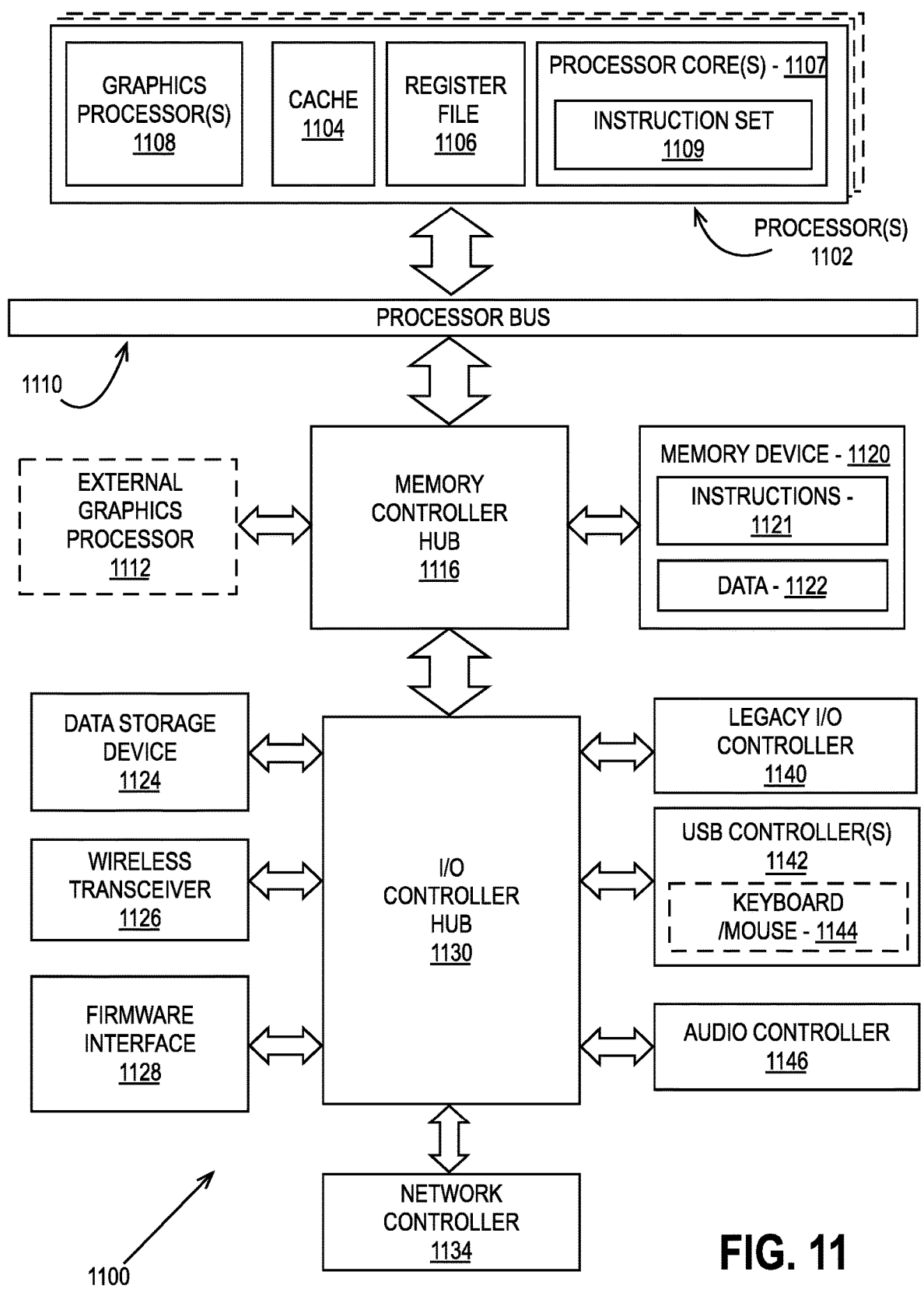
FIG. 11 is a block diagram of a processing system, according to an embodiment.

FIG. 11 is a block diagram of a processing system 1100, according to an embodiment. In various embodiments, the system 1100 includes one or more processors 1102 and one or more graphics processors 1108, and may be a single processor desktop system, a multiprocessor workstation system, or a server system having a large number of processors 1102 or processor cores 1107. In one embodiment, the system 1100 is a processing platform incorporated within a system-on-a-chip (SoC) integrated circuit for use in mobile, handheld, or embedded devices.

An embodiment of system 1100 can include, or be incorporated within a server-based gaming platform, a game console, including a game and media console, a mobile gaming console, a handheld game console, or an online game console. In some embodiments system 1100 is a mobile phone, smart phone, tablet computing device or mobile Internet device. Data processing system 1100 can also include, couple with, or be integrated within a wearable device, such as a smart watch wearable device, smart eyewear device, augmented reality device, or virtual reality device. In some embodiments, data processing system 1100 is a television or set top box device having one or more processors 1102 and a graphical interface generated by one or more graphics processors 1108.

In some embodiments, the one or more processors 1102 each include one or more processor cores 1107 to process instructions which, when executed, perform operations for system and user software. In some embodiments, each of the one or more processor cores 1107 is configured to process a specific instruction set 1109. In some embodiments, instruction set 1109 may facilitate Complex Instruction Set Computing (CISC), Reduced Instruction Set Computing (RISC), or computing via a Very Long Instruction Word (VLIW). Multiple processor cores 1107 may each process a different instruction set 1109, which may include instructions to facilitate the emulation of other instruction sets. Processor core 1107 may also include other processing devices, such a Digital Signal Processor (DSP).

In some embodiments, the processor 1102 includes cache memory 1104. Depending on the architecture, the processor 1102 can have a single internal cache or multiple levels of internal cache. In some embodiments, the cache memory is shared among various components of the processor 1102. In some embodiments, the processor 1102 also uses an external cache (e.g., a Level-3 (L3) cache or Last Level Cache (LLC)) (not shown), which may be shared among processor cores 1107 using known cache coherency techniques. A register file 1106 is additionally included in processor 1102 which may include different types of registers for storing different types of data (e.g., integer registers, floating point registers, status registers, and an instruction pointer register). Some registers may be general-purpose registers, while other registers may be specific to the design of the processor 1102.

In some embodiments, processor 1102 is coupled with a processor bus 1110 to transmit communication signals such as address, data, or control signals between processor 1102 and other components in system 1100. In one embodiment, the system 1100 uses an exemplary 'hub' system architecture, including a memory controller hub 1116 and an Input Output (I/O) controller hub 1130. A memory controller hub 1116 facilitates communication between a memory device and other components of system 1100, while an I/O Controller Hub (ICH) 1130 provides connections to I/O devices via a local I/O bus. In one embodiment, the logic of the memory controller hub 1116 is integrated within the processor.

Memory device 1120 can be a dynamic random access memory (DRAM) device, a static random access memory (SRAM) device, flash memory device, phase-change memory device, or some other memory device having suitable performance to serve as process memory. In one embodiment, the memory device 1120 can operate as system memory for the system 1100, to store data 1122 and instructions 1121 for use when the one or more processors 1102 executes an application or process. Memory controller hub 1116 also couples with an optional external graphics processor 1112, which may communicate with the one or more graphics processors 1108 in processors 1102 to perform graphics and media operations.

In some embodiments, ICH 1130 enables peripherals to connect to memory device 1120 and processor 1102 via a high-speed I/O bus. The I/O peripherals include, but are not limited to, an audio controller 1146, a firmware interface 1128, a wireless transceiver 1126 (e.g., Wi-Fi, Bluetooth), a data storage device 1124 (e.g., hard disk drive, flash memory, etc.), and a legacy I/O controller 1140 for coupling legacy (e.g., Personal System 2 (PS/2)) devices to the system. One or more Universal Serial Bus (USB) controllers 1142 connect input devices, such as keyboard and mouse 1144 combinations. A network controller 1134 may also couple with ICH 1130. In some embodiments, a high-performance network controller (not shown) couples with processor bus 1110. It will be appreciated that the system 1100 shown is exemplary and not limiting, as other types of data processing systems that are differently configured may also be used. For example, the I/O controller hub 1130 may be integrated within the one or more processor 1102, or the memory controller hub 1116 and I/O controller hub 1130 may be integrated into a discreet external graphics processor, such as the external graphics processor 1112.

Figure 12:
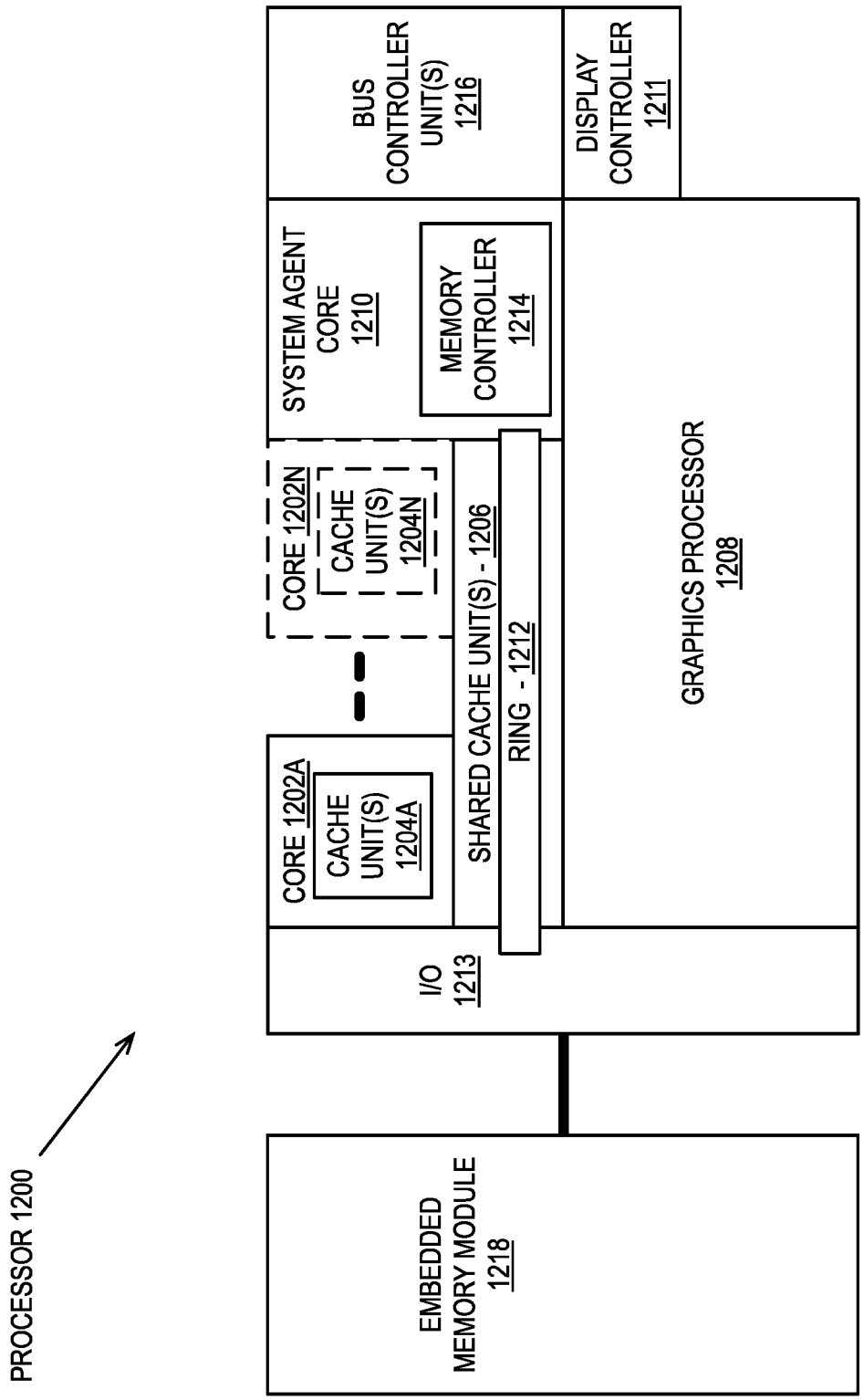
FIG. 12 is a block diagram of a processor according to an embodiment.

FIG. 12 is a block diagram of an embodiment of a processor 1200 having one or more processor cores 1202A-1202N, an integrated memory controller 1214, and an integrated graphics processor 1208. Those elements of FIG. 12 having the same reference numbers (or names) as the elements of any other figure herein can operate or function in any manner similar to that described elsewhere herein, but are not limited to such. Processor 1200 can include additional cores up to and including additional core 1202N represented by the dashed lined boxes. Each of processor cores 1202A-1202N includes one or more internal cache units 1204A-1204N. In some embodiments, each processor core also has access to one or more shared cached units 1206.

The internal cache units 1204A-1204N and shared cache units 1206 represent a cache memory hierarchy within the processor 1200. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 1206 and 1204A-1204N.

In some embodiments, processor 1200 may also include a set of one or more bus controller units 1216 and a system agent core 1210. The one or more bus controller units 1216 manage a set of peripheral buses, such as one or more Peripheral Component Interconnect buses (e.g., PCI, PCI Express). System agent core 1210 provides management functionality for the various processor components. In some embodiments, system agent core 1210 includes one or more integrated memory controllers 1214 to manage access to various external memory devices (not shown).

In some embodiments, one or more of the processor cores 1202A-1202N include support for simultaneous multi-threading. In such embodiment, the system agent core 1210 includes components for coordinating and operating cores 1202A-1202N during multi-threaded processing. System agent core 1210 may additionally include a power control unit (PCU), which includes logic and components to regulate the power state of processor cores 1202A-1202N and graphics processor 1208.

In some embodiments, processor 1200 additionally includes graphics processor 1208 to execute graphics processing operations. In some embodiments, the graphics processor 1208 couples with the set of shared cache units 1206, and the system agent core 1210, including the one or more integrated memory controllers 1214. In some embodiments, a display controller 1211 is coupled with the graphics processor 1208 to drive graphics processor output to one or more coupled displays. In some embodiments, display controller 1211 may be a separate module coupled with the graphics processor via at least one interconnect, or may be integrated within the graphics processor 1208 or system agent core 1210.

In some embodiments, a ring based interconnect unit 1212 is used to couple the internal components of the processor 1200. However, an alternative interconnect unit may be used, such as a point-to-point interconnect, a switched interconnect, or other techniques, including techniques well known in the art. In some embodiments, graphics processor 1208 couples with the ring interconnect 1212 via an I/O link 1213.

The exemplary I/O link 1213 represents at least one of multiple varieties of I/O interconnects, including an on-package I/O interconnect which facilitates communication between various processor components and a high-performance embedded memory module 1218, such as an eDRAM module. In some embodiments, each of the processor cores 1202A-1202N and graphics processor 1208 use embedded memory modules 1218 as a shared Last Level Cache.

In some embodiments, processor cores 1202A-1202N are homogenous cores executing the same instruction set architecture. In another embodiment, processor cores 1202A-1202N are heterogeneous in terms of instruction set architecture (ISA), where one or more of processor cores 1202A-1202N execute a first instruction set, while at least one of the other cores executes a subset of the first instruction set or a different instruction set. In one embodiment processor cores 1202A-1202N are heterogeneous in terms of microarchitecture, where one or more cores having a relatively higher power consumption couple with one or more power cores having a lower power consumption. Additionally, processor 1200 can be implemented on one or more chips or as an SoC integrated circuit having the illustrated components, in addition to other components.

Figure 13:
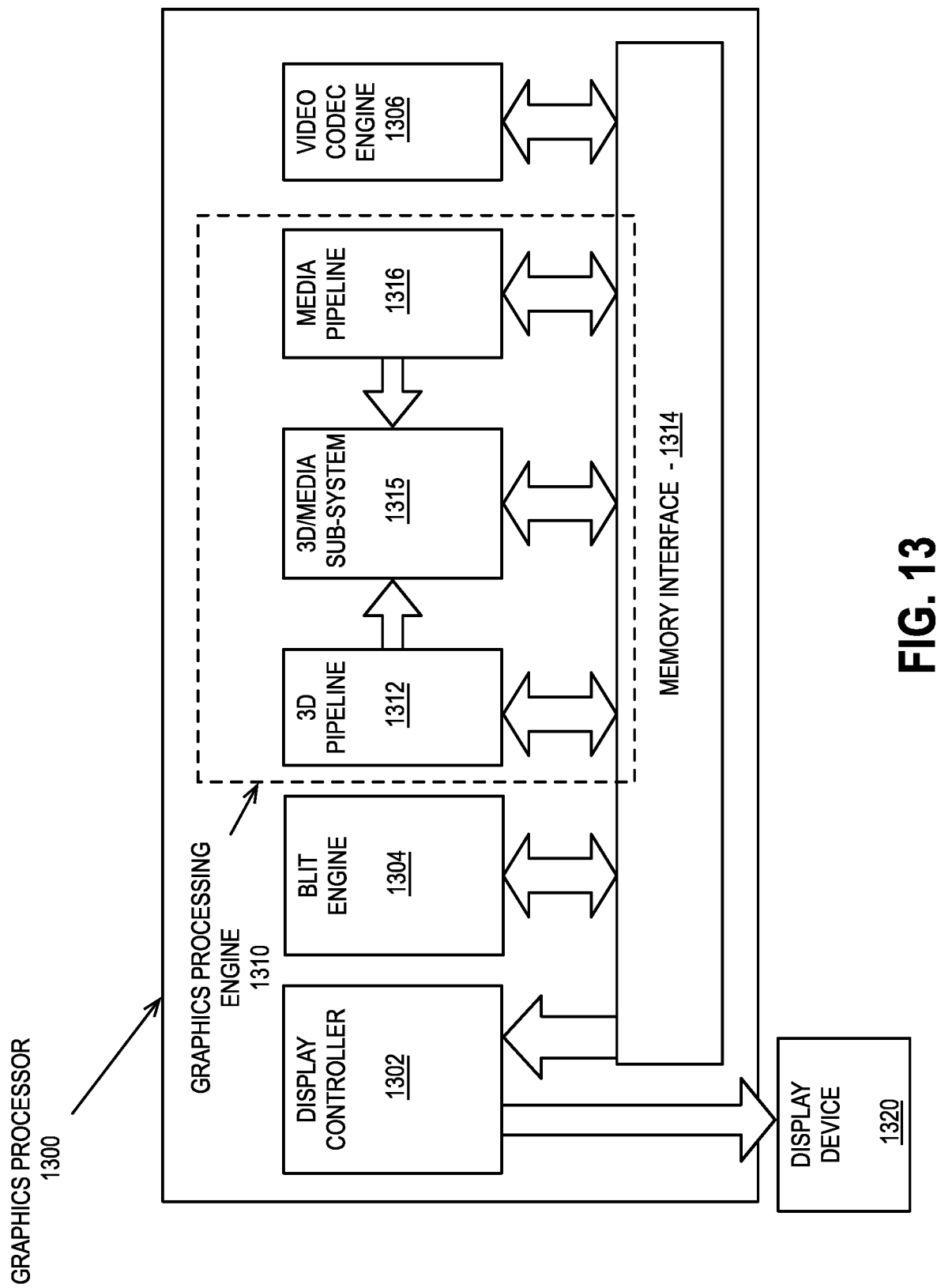
FIG. 13 is a block diagram of a graphics processor, according to an embodiment.

FIG. 13 is a block diagram of a graphics processor 1300, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 1300 includes a memory interface 1314 to access memory. Memory interface 1314 can be an interface to local memory, one or more internal caches, one or more shared external caches, and/or to system memory.

In some embodiments, graphics processor 1300 also includes a display controller 1302 to drive display output data to a display device 1320. Display controller 1302 includes hardware for one or more overlay planes for the display and composition of multiple layers of video or user interface elements. In some embodiments, graphics processor 1300 includes a video codec engine 1306 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 1300 includes a block image transfer (BLIT) engine 1304 to perform two-dimensional (2D) rasterizer operations including, for example, bit-boundary block transfers. However, in one embodiment, 2D graphics operations are performed using one or more components of graphics processing engine (GPE) 1310. In some embodiments, GPE 1310 is a compute engine for performing graphics operations, including three-dimensional (3D) graphics operations and media operations.

In some embodiments, GPE 310 includes a 3D pipeline 1312 for performing 3D operations, such as rendering three-dimensional images and scenes using processing functions that act upon 3D primitive shapes (e.g., rectangle, triangle, etc.). The 3D pipeline 1312 includes programmable and fixed function elements that perform various tasks within the element and/or spawn execution threads to a 3D/Media sub-system 1315. While 3D pipeline 1312 can be used to perform media operations, an embodiment of GPE 1310 also includes a media pipeline 1316 that is specifically used to perform media operations, such as video post-processing and image enhancement.

In some embodiments, media pipeline 1316 includes fixed function or programmable logic units to perform one or more specialized media operations, such as video decode acceleration, video de-interlacing, and video encode acceleration in place of, or on behalf of video codec engine 1306. In some embodiments, media pipeline 1316 additionally includes a thread spawning unit to spawn threads for execution on 3D/Media sub-system 1315. The spawned threads perform computations for the media operations on one or more graphics execution units included in 3D/Media sub-system 1315.

In some embodiments, 3D/Media subsystem 1315 includes logic for executing threads spawned by 3D pipeline 1312 and media pipeline 1316. In one embodiment, the pipelines send thread execution requests to 3D/Media sub-system 1315, which includes thread dispatch logic for arbitrating and dispatching the various requests to available thread execution resources. The execution resources include an array of graphics execution units to process the 3D and media threads. In some embodiments, 3D/Media subsystem 1315 includes one or more internal caches for thread instructions and data. In some embodiments, the subsystem also includes shared memory, including registers and addressable memory, to share data between threads and to store output data.

Graphics Processing Engine

Figure 14:
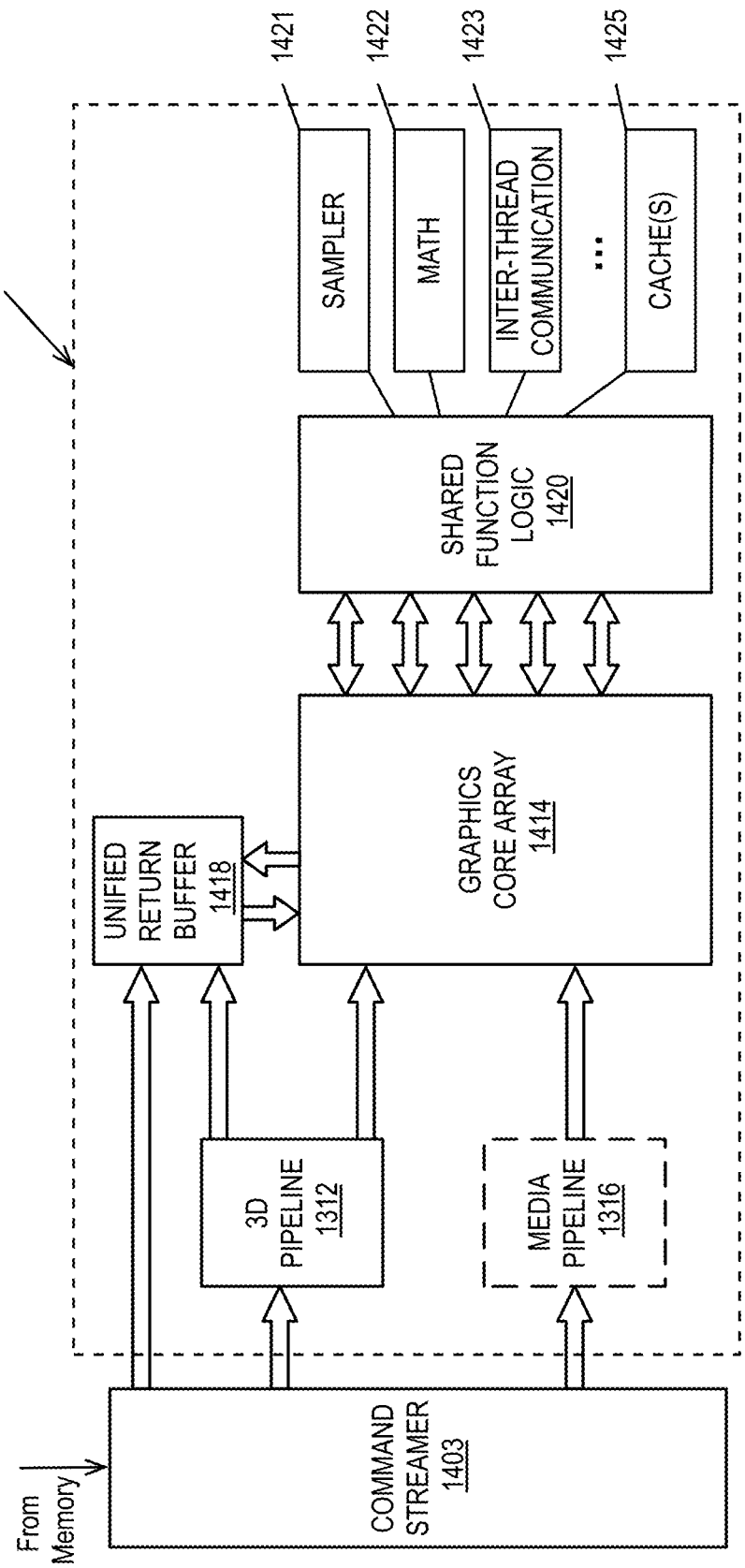
FIG. 14 is a block diagram of a graphics processing engine of a graphics processor in accordance with some embodiments.

FIG. 14 is a block diagram of a graphics processing engine 1410 of a graphics processor in accordance with some embodiments. In one embodiment, the graphics processing engine (GPE) 1410 is a version of the GPE 1310 shown in FIG. 13. Elements of FIG. 14 having the same reference numbers (or names) as the elements of any other figure herein can operate or function in any manner similar to that described elsewhere herein, but are not limited to such. For example, the 3D pipeline 1312 and media pipeline 1316 of FIG. 13 are illustrated. The media pipeline 1316 is optional in some embodiments of the GPE 1410 and may not be explicitly included within the GPE 1410. For example, and in at least one embodiment, a separate media and/or image processor is coupled to the GPE 1410.

In some embodiments, GPE 1410 couples with or includes a command streamer 1403, which provides a command stream to the 3D pipeline 1312 and/or media pipelines 1316. In some embodiments, command streamer 1403 is coupled with memory, which can be system memory, or one or more of internal cache memory and shared cache memory. In some embodiments, command streamer 1403 receives commands from the memory and sends the commands to 3D pipeline 1312 and/or media pipeline 1316. The commands are directives fetched from a ring buffer, which stores commands for the 3D pipeline 1312 and media pipeline 1316. In one embodiment, the ring buffer can additionally include batch command buffers storing batches of multiple commands. The commands for the 3D pipeline 1312 can also include references to data stored in memory, such as but not limited to vertex and geometry data for the 3D pipeline 1312 and/or image data and memory objects for the media pipeline 1316. The 3D pipeline 1312 and media pipeline 1316 process the commands and data by performing operations via logic within the respective pipelines or by dispatching one or more execution threads to a graphics core array 1414.

In various embodiments, the 3D pipeline 1312 can execute one or more shader programs, such as vertex shaders, geometry shaders, pixel shaders, fragment shaders, compute shaders, or other shader programs, by processing the instructions and dispatching execution threads to the graphics core array 1414. The graphics core array 1414 provides a unified block of execution resources. Multi-purpose execution logic (e.g., execution units) within the graphic core array 1414 includes support for various 3D API shader languages and can execute multiple simultaneous execution threads associated with multiple shaders.

In some embodiments, the graphics core array 1414 also includes execution logic to perform media functions, such as video and/or image processing. In one embodiment, the execution units additionally include general-purpose logic that is programmable to perform parallel general purpose computational operations, in addition to graphics processing operations. The general-purpose logic can perform processing operations in parallel or in conjunction with general purpose logic within the processor core(s) 107 of FIG. 1 or core 1202A-1202N as in FIG. 12.

Output data generated by threads executing on the graphics core array 1414 can output data to memory in a unified return buffer (URB) 1418. The URB 1418 can store data for multiple threads. In some embodiments, the URB 1418 may be used to send data between different threads executing on the graphics core array 1414. In some embodiments, the URB 1418 may additionally be used for synchronization between threads on the graphics core array and fixed function logic within the shared function logic 1420.

In some embodiments, graphics core array 1414 is scalable, such that the array includes a variable number of graphics cores, each having a variable number of execution units based on the target power and performance level of GPE 1410. In one embodiment, the execution resources are dynamically scalable, such that execution resources may be enabled or disabled as needed.

The graphics core array 1414 couples with shared function logic 1420 that includes multiple resources that are shared between the graphics cores in the graphics core array. The shared functions within the shared function logic 1420 are hardware logic units that provide specialized supplemental functionality to the graphics core array 1414. In various embodiments, shared function logic 1420 includes but is not limited to sampler 1421, math 1422, and inter-thread communication (ITC) 1423 logic. Additionally, some embodiments implement one or more cache(s) 1425 within the shared function logic 1420. A shared function is implemented where the demand for a given specialized function is insufficient for inclusion within the graphics core array 1414. Instead a single instantiation of that specialized function is implemented as a stand-alone entity in the shared function logic 1420 and shared among the execution resources within the graphics core array 1414. The precise set of functions that are shared between the graphics core array 1414 and included within the graphics core array 1414 varies between embodiments.

Figure 15:
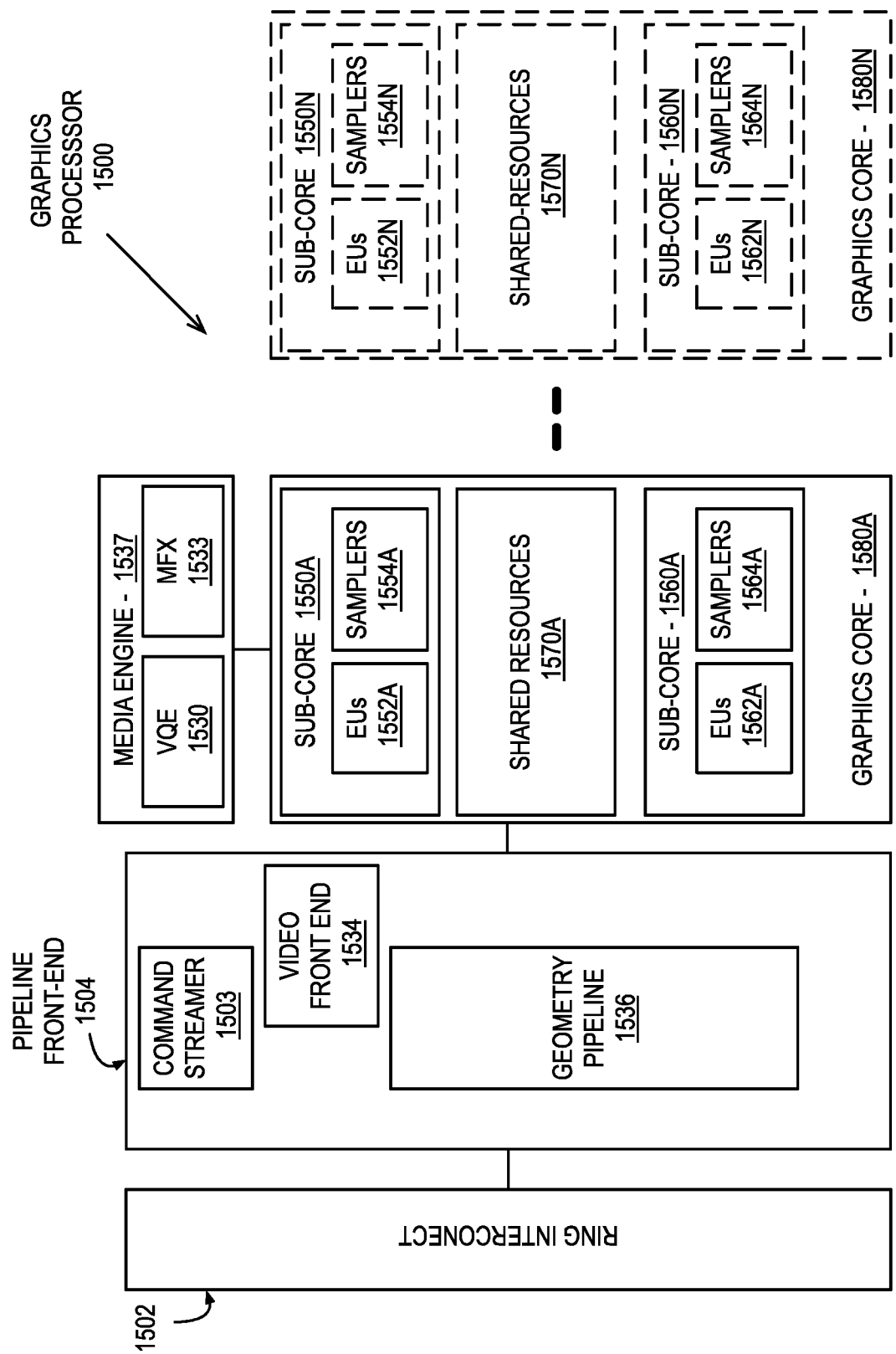
FIG. 15 is a block diagram of a graphics processor provided by an additional embodiment.

FIG. 15 is a block diagram of another embodiment of a graphics processor 1500. Elements of FIG. 15 having the same reference numbers (or names) as the elements of any other figure herein can operate or function in any manner similar to that described elsewhere herein, but are not limited to such.

In some embodiments, graphics processor 1500 includes a ring interconnect 1502, a pipeline front-end 1504, a media engine 1537, and graphics cores 1580A-1580N. In some embodiments, ring interconnect 1502 couples the graphics processor to other processing units, including other graphics processors or one or more general-purpose processor cores. In some embodiments, the graphics processor is one of many processors integrated within a multi-core processing system.

In some embodiments, graphics processor 1500 receives batches of commands via ring interconnect 1502. The incoming commands are interpreted by a command streamer 1503 in the pipeline front-end 1504. In some embodiments, graphics processor 1500 includes scalable execution logic to perform 3D geometry processing and media processing via the graphics core(s) 1580A-1580N. For 3D geometry processing commands, command streamer 1503 supplies commands to geometry pipeline 1536. For at least some media processing commands, command streamer 1503 supplies the commands to a video front end 1534, which couples with a media engine 1537. In some embodiments, media engine 1537 includes a Video Quality Engine (VQE) 1530 for video and image post-processing and a multi-format encode/decode (MFX) 1533 engine to provide hardware-accelerated media data encode and decode. In some embodiments, geometry pipeline 1536 and media engine 1537 each generate execution threads for the thread execution resources provided by at least one graphics core 1580A.

In some embodiments, graphics processor 1500 includes scalable thread execution resources featuring modular cores 1580A-1580N (sometimes referred to as core slices), each having multiple sub-cores 1550A-550N, 1560A-1560N (sometimes referred to as core sub-slices). In some embodiments, graphics processor 1500 can have any number of graphics cores 1580A through 1580N. In some embodiments, graphics processor 1500 includes a graphics core 1580A having at least a first sub-core 1550A and a second sub-core 1560A. In other embodiments, the graphics processor is a low power processor with a single sub-core (e.g., 1550A). In some embodiments, graphics processor 1500 includes multiple graphics cores 1580A-1580N, each including a set of first sub-cores 1550A-1550N and a set of second sub-cores 1560A-1560N. Each sub-core in the set of first sub-cores 1550A-1550N includes at least a first set of execution units 1552A-1552N and media/texture samplers 1554A-1554N. Each sub-core in the set of second sub-cores 1560A-1560N includes at least a second set of execution units 1562A-1562N and samplers 1564A-1564N. In some embodiments, each sub-core 1550A-1550N, 1560A-1560N shares a set of shared resources 1570A-1570N. In some embodiments, the shared resources include shared cache memory and pixel operation logic. Other shared resources may also be included in the various embodiments of the graphics processor.

Execution Units

Figure 16:
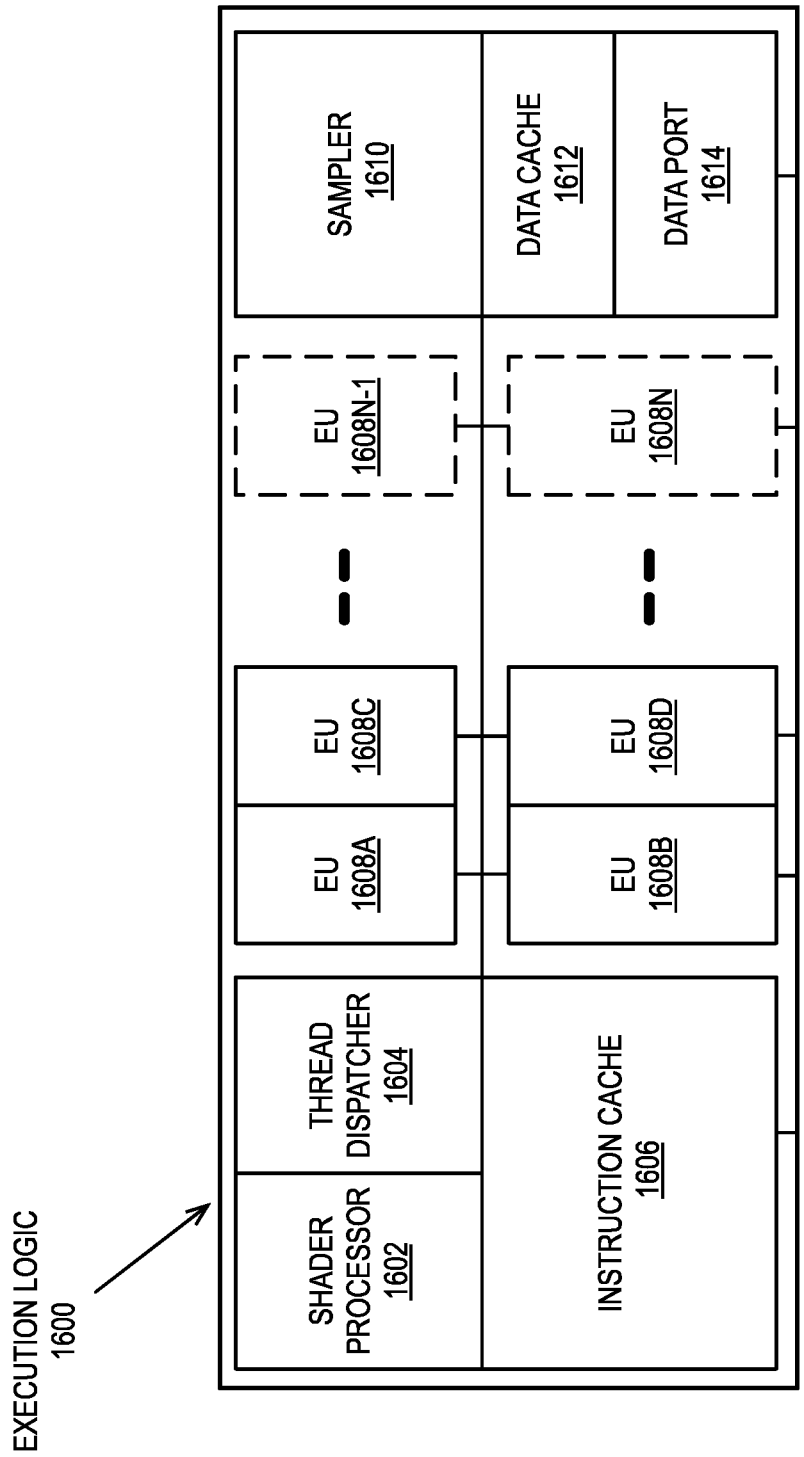
FIG. 16 illustrates thread execution logic including an array of processing elements employed in some embodiments.

FIG. 16 illustrates thread execution logic 1600 including an array of processing elements employed in some embodiments of a GPE. Elements of FIG. 16 having the same reference numbers (or names) as the elements of any other figure herein can operate or function in any manner similar to that described elsewhere herein, but are not limited to such.

In some embodiments, thread execution logic 1600 includes a shader processor 1602, a thread dispatcher 1604, instruction cache 1606, a scalable execution unit array including a plurality of execution units 1608A-1608N, a sampler 1610, a data cache 1612, and a data port 1614. In one embodiment, the scalable execution unit array can dynamically scale by enabling or disabling one or more execution units (e.g., any of execution unit 1608A, 1608B, 1608C, 1608D, through 1608N-1 and 1608N) based on the computational requirements of a workload. In one embodiment, the included components are interconnected via an interconnect fabric that links to each of the components. In some embodiments, thread execution logic 1600 includes one or more connections to memory, such as system memory or cache memory, through one or more of instruction cache 1606, data port 1614, sampler 1610, and execution units 1608A-1608N. In some embodiments, each execution unit (e.g. 1608A) is a stand-alone programmable general purpose computational unit that is capable of executing multiple simultaneous hardware threads while processing multiple data elements in parallel for each thread. In various embodiments, the array of execution units 1608A-1608N is scalable to include any number individual execution units.

In some embodiments, the execution units 1608A-1608N are primarily used to execute shader programs. A shader processor 1602 can process the various shader programs and dispatch execution threads associated with the shader programs via a thread dispatcher 1604. In one embodiment, the thread dispatcher includes logic to arbitrate thread initiation requests from the graphics and media pipelines and instantiate the requested threads on one or more execution unit in the execution units 1608A-1608N. For example, the geometry pipeline (e.g., 1536 of FIG. 15) can dispatch vertex, tessellation, or geometry shaders to the thread execution logic 1600 (FIG. 16) for processing. In some embodiments, thread dispatcher 1604 can also process runtime thread spawning requests from the executing shader programs.

In some embodiments, the execution units 1608A-1608N support an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders). Each of the execution units 1608A-1608N is capable of multi-issue single instruction multiple data (SIMD) execution and multi-threaded operation enables an efficient execution environment in the face of higher latency memory accesses. Each hardware thread within each execution unit has a dedicated high-bandwidth register file and associated independent thread-state. Execution is multi-issue per clock to pipelines capable of integer, single and double precision floating point operations, SIMD branch capability, logical operations, transcendental operations, and other miscellaneous operations. While waiting for data from memory or one of the shared functions, dependency logic within the execution units 1608A-1608N causes a waiting thread to sleep until the requested data has been returned. While the waiting thread is sleeping, hardware resources may be devoted to processing other threads. For example, during a delay associated with a vertex shader operation, an execution unit can perform operations for a pixel shader, fragment shader, or another type of shader program, including a different vertex shader.

Each execution unit in execution units 1608A-1608N operates on arrays of data elements. The number of data elements is the "execution size," or the number of channels for the instruction. An execution channel is a logical unit of execution for data element access, masking, and flow control within instructions. The number of channels may be independent of the number of physical Arithmetic Logic Units (ALUs) or Floating Point Units (FPUs) for a particular graphics processor. In some embodiments, execution units 1608A-1608N support integer and floating-point data types.

The execution unit instruction set includes SIMD instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible.

One or more internal instruction caches (e.g., 1606) are included in the thread execution logic 1600 to cache thread instructions for the execution units. In some embodiments, one or more data caches (e.g., 1612) are included to cache thread data during thread execution. In some embodiments, a sampler 1610 is included to provide texture sampling for 3D operations and media sampling for media operations. In some embodiments, sampler 1610 includes specialized texture or media sampling functionality to process texture or media data during the sampling process before providing the sampled data to an execution unit.

During execution, the graphics and media pipelines send thread initiation requests to thread execution logic 1600 via thread spawning and dispatch logic. Once a group of geometric objects has been processed and rasterized into pixel data, pixel processor logic (e.g., pixel shader logic, fragment shader logic, etc.) within the shader processor 1602 is invoked to further compute output information and cause results to be written to output surfaces (e.g., color buffers, depth buffers, stencil buffers, etc.). In some embodiments, a pixel shader or fragment shader calculates the values of the various vertex attributes that are to be interpolated across the rasterized object. In some embodiments, pixel processor logic within the shader processor 1602 then executes an application programming interface (API)-supplied pixel or fragment shader program. To execute the shader program, the shader processor 1602 dispatches threads to an execution unit (e.g., 1608A) via thread dispatcher 1604. In some embodiments, pixel shader 1602 uses texture sampling logic in the sampler 1610 to access texture data in texture maps stored in memory. Arithmetic operations on the texture data and the input geometry data compute pixel color data for each geometric fragment, or discards one or more pixels from further processing.

In some embodiments, the data port 1614 provides a memory access mechanism for the thread execution logic 1600 output processed data to memory for processing on a graphics processor output pipeline. In some embodiments, the data port 1614 includes or couples to one or more cache memories (e.g., data cache 1612) to cache data for memory access via the data port.

FIG. 17 is a block diagram illustrating a graphics processor instruction formats 1700 according to some embodiments. In one or more embodiment, the graphics processor execution units support an instruction set having instructions in multiple formats. The solid lined boxes illustrate the components that are generally included in an execution unit instruction, while the dashed lines include components that are optional or that are only included in a sub-set of the instructions. In some embodiments, instruction format 1700 described and illustrated are macro-instructions, in that they are instructions supplied to the execution unit, as opposed to micro-operations resulting from instruction decode once the instruction is processed.

In some embodiments, the graphics processor execution units natively support instructions in a 128-bit instruction format 1710. A 64-bit compacted instruction format 1730 is available for some instructions based on the selected instruction, instruction options, and number of operands. The native 128-bit instruction format 710 provides access to all instruction options, while some options and operations are restricted in the 64-bit format 1730. The native instructions available in the 64-bit format 1730 vary by embodiment. In some embodiments, the instruction is compacted in part using a set of index values in an index field 1713. The execution unit hardware references a set of compaction tables based on the index values and uses the compaction table outputs to reconstruct a native instruction in the 128-bit instruction format 1710.

For each format, instruction opcode 1712 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. In some embodiments, instruction control field 1714 enables control over certain execution options, such as channels selection (e.g., predication) and data channel order (e.g., swizzle). For instructions in the 128-bit instruction format 1710 an exec-size field 1716 limits the number of data channels that will be executed in parallel. In some embodiments, exec-size field 1716 is not available for use in the 64-bit compact instruction format 1730.

Some execution unit instructions have up to three operands including two source operands, src0 1720, src1 1722, and one destination 1718. In some embodiments, the execution units support dual destination instructions, where one of the destinations is implied. Data manipulation instructions can have a third source operand (e.g., SRC2 1724), where the instruction opcode 1712 determines the number of source operands. An instruction's last source operand can be an immediate (e.g., hard-coded) value passed with the instruction.

In some embodiments, the 128-bit instruction format 1710 includes an access/address mode field 1726 specifying, for example, whether direct register addressing mode or indirect register addressing mode is used. When direct register addressing mode is used, the register address of one or more operands is directly provided by bits in the instruction.

In some embodiments, the 128-bit instruction format 1710 includes an access/address mode field 1726, which specifies an address mode and/or an access mode for the instruction. In one embodiment, the access mode is used to define a data access alignment for the instruction. Some embodiments support access modes including a 16-byte aligned access mode and a 1-byte aligned access mode, where the byte alignment of the access mode determines the access alignment of the instruction operands. For example, when in a first mode, the instruction may use byte-aligned addressing for source and destination operands and when in a second mode, the instruction may use 16-byte-aligned addressing for all source and destination operands.

In one embodiment, the address mode portion of the access/address mode field 1726 determines whether the instruction is to use direct or indirect addressing. When direct register addressing mode is used bits in the instruction directly provide the register address of one or more operands. When indirect register addressing mode is used, the register address of one or more operands may be computed based on an address register value and an address immediate field in the instruction.

In some embodiments instructions are grouped based on opcode 1712 bit-fields to simplify Opcode decode 1740. For an 8-bit opcode, bits 4, 5, and 6 allow the execution unit to determine the type of opcode. The precise opcode grouping shown is merely an example. In some embodiments, a move and logic opcode group 1742 includes data movement and logic instructions (e.g., move (mov), compare (cmp)). In some embodiments, move and logic group 1742 shares the five most significant bits (MSB), where move (mov) instructions are in the form of 0000xxxxb and logic instructions are in the form of 0001xxxxb. A flow control instruction group 1744 (e.g., call, jump (jmp)) includes instructions in the form of 0010xxxxb (e.g., 0x20). A miscellaneous instruction group 1746 includes a mix of instructions, including synchronization instructions (e.g., wait, send) in the form of 0011xxxxb (e.g., 0x30). A parallel math instruction group 1748 includes component-wise arithmetic instructions (e.g., add, multiply (mul)) in the form of 0100xxxxb (e.g., 0x40). The parallel math group 1748 performs the arithmetic operations in parallel across data channels. The vector math group 1750 includes arithmetic instructions (e.g., dp4) in the form of 0101xxxxb (e.g., 0x50). The vector math group performs arithmetic such as dot product calculations on vector operands.

Graphics Pipeline

Figure 18:
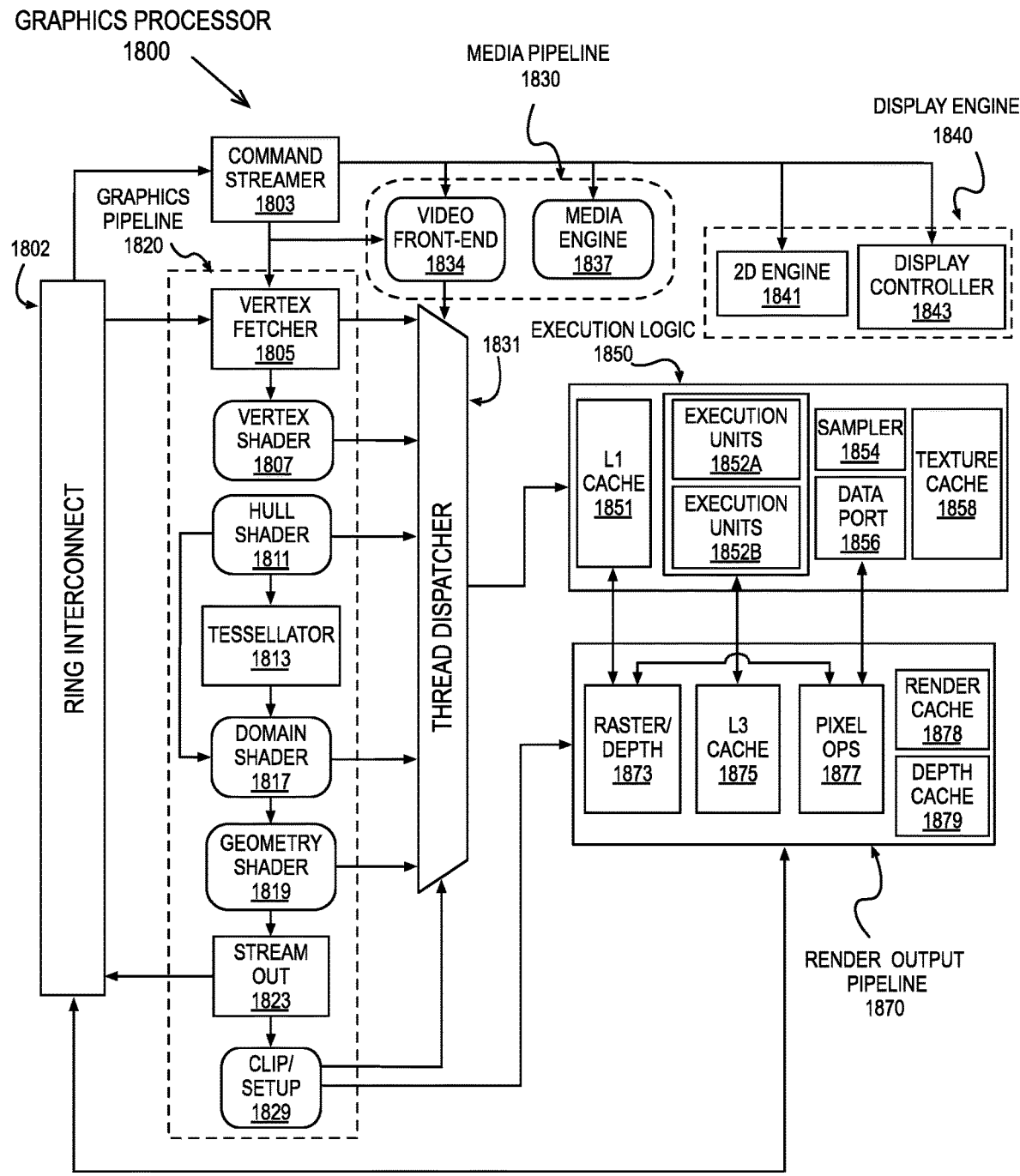
FIG. 18 is a block diagram of a graphics processor according to another embodiment.

FIG. 18 is a block diagram of another embodiment of a graphics processor 1800. Elements of FIG. 18 having the same reference numbers (or names) as the elements of any other figure herein can operate or function in any manner similar to that described elsewhere herein, but are not limited to such.

In some embodiments, graphics processor 1800 includes a graphics pipeline 1820, a media pipeline 1830, a display engine 1840, thread execution logic 1850, and a render output pipeline 1870. In some embodiments, graphics processor 1800 is a graphics processor within a multi-core processing system that includes one or more general purpose processing cores. The graphics processor is controlled by register writes to one or more control registers (not shown) or via commands issued to graphics processor 1800 via a ring interconnect 1802. In some embodiments, ring interconnect 1802 couples graphics processor 1800 to other processing components, such as other graphics processors or general-purpose processors. Commands from ring interconnect 1802 are interpreted by a command streamer 1803, which supplies instructions to individual components of graphics pipeline 1820 or media pipeline 1830.

In some embodiments, command streamer 1803 directs the operation of a vertex fetcher 1805 that reads vertex data from memory and executes vertex-processing commands provided by command streamer 1803. In some embodiments, vertex fetcher 1805 provides vertex data to a vertex shader 1807, which performs coordinate space transformation and lighting operations to each vertex. In some embodiments, vertex fetcher 1805 and vertex shader 1807 execute vertex-processing instructions by dispatching execution threads to execution units 1852A-1852B via a thread dispatcher 1831.

In some embodiments, execution units 1852A-1852B are an array of vector processors having an instruction set for performing graphics and media operations. In some embodiments, execution units 1852A-1852B have an attached L1 cache 1851 that is specific for each array or shared between the arrays. The cache can be configured as a data cache, an instruction cache, or a single cache that is partitioned to contain data and instructions in different partitions.

In some embodiments, graphics pipeline 1820 includes tessellation components to perform hardware-accelerated tessellation of 3D objects. In some embodiments, a programmable hull shader 811 configures the tessellation operations. A programmable domain shader 817 provides back-end evaluation of tessellation output. A tessellator 1813 operates at the direction of hull shader 1811 and contains special purpose logic to generate a set of detailed geometric objects based on a coarse geometric model that is provided as input to graphics pipeline 1820. In some embodiments, if tessellation is not used, tessellation components (e.g., hull shader 1811, tessellator 1813, and domain shader 1817) can be bypassed.

In some embodiments, complete geometric objects can be processed by a geometry shader 1819 via one or more threads dispatched to execution units 1852A-1852B, or can proceed directly to the clipper 1829. In some embodiments, the geometry shader operates on entire geometric objects, rather than vertices or patches of vertices as in previous stages of the graphics pipeline. If the tessellation is disabled, the geometry shader 1819 receives input from the vertex shader 1807. In some embodiments, geometry shader 1819 is programmable by a geometry shader program to perform geometry tessellation if the tessellation units are disabled.

Before rasterization, a clipper 1829 processes vertex data. The clipper 1829 may be a fixed function clipper or a programmable clipper having clipping and geometry shader functions. In some embodiments, a rasterizer and depth test component 1873 in the render output pipeline 1870 dispatches pixel shaders to convert the geometric objects into their per pixel representations. In some embodiments, pixel shader logic is included in thread execution logic 1850. In some embodiments, an application can bypass the rasterizer and depth test component 1873 and access un-rasterized vertex data via a stream out unit 1823.

The graphics processor 1800 has an interconnect bus, interconnect fabric, or some other interconnect mechanism that allows data and message passing amongst the major components of the processor. In some embodiments, execution units 1852A-1852B and associated cache(s) 1851, texture and media sampler 1854, and texture/sampler cache 1858 interconnect via a data port 1856 to perform memory access and communicate with render output pipeline components of the processor. In some embodiments, sampler 1854, caches 1851, 1858 and execution units 1852A-1852B each have separate memory access paths.

In some embodiments, render output pipeline 1870 contains a rasterizer and depth test component 1873 that converts vertex-based objects into an associated pixel-based representation. In some embodiments, the rasterizer logic includes a windower/masker unit to perform fixed function triangle and line rasterization. An associated render cache 1878 and depth cache 1879 are also available in some embodiments. A pixel operations component 1877 performs pixel-based operations on the data, though in some instances, pixel operations associated with 2D operations (e.g. bit block image transfers with blending) are performed by the 2D engine 1841, or substituted at display time by the display controller 1843 using overlay display planes. In some embodiments, a shared L3 cache 1875 is available to all graphics components, allowing the sharing of data without the use of main system memory.

In some embodiments, graphics processor media pipeline 1830 includes a media engine 1837 and a video front end 1834. In some embodiments, video front end 1834 receives pipeline commands from the command streamer 1803. In some embodiments, media pipeline 1830 includes a separate command streamer. In some embodiments, video front-end 1834 processes media commands before sending the command to the media engine 1837. In some embodiments, media engine 1837 includes thread spawning functionality to spawn threads for dispatch to thread execution logic 1850 via thread dispatcher 1831.

In some embodiments, graphics processor 1800 includes a display engine 1840. In some embodiments, display engine 1840 is external to processor 1800 and couples with the graphics processor via the ring interconnect 1802, or some other interconnect bus or fabric. In some embodiments, display engine 1840 includes a 2D engine 1841 and a display controller 1843. In some embodiments, display engine 1840 contains special purpose logic capable of operating independently of the 3D pipeline. In some embodiments, display controller 1843 couples with a display device (not shown), which may be a system integrated display device, as in a laptop computer, or an external display device attached via a display device connector.

In some embodiments, graphics pipeline 1820 and media pipeline 1830 are configurable to perform operations based on multiple graphics and media programming interfaces and are not specific to any one application programming interface (API). In some embodiments, driver software for the graphics processor translates API calls that are specific to a particular graphics or media library into commands that can be processed by the graphics processor. In some embodiments, support is provided for the Open Graphics Library (OpenGL), Open Computing Language (OpenCL), and/or Vulkan graphics and compute API, all from the Khronos Group. In some embodiments, support may also be provided for the Direct3D library from the Microsoft Corporation. In some embodiments, a combination of these libraries may be supported. Support may also be provided for the Open Source Computer Vision Library (OpenCV). A future API with a compatible 3D pipeline would also be supported if a mapping can be made from the pipeline of the future API to the pipeline of the graphics processor.

Graphics Pipeline Programming

Figure 19A:
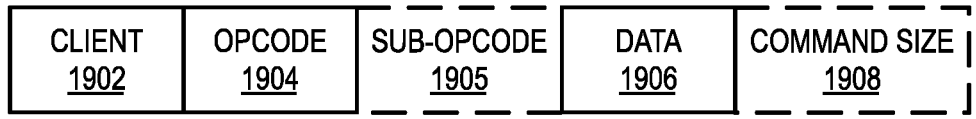
FIGS. 19A-19B illustrate a graphics processor command format and command sequence, according to some embodiments.
Figure 19B:
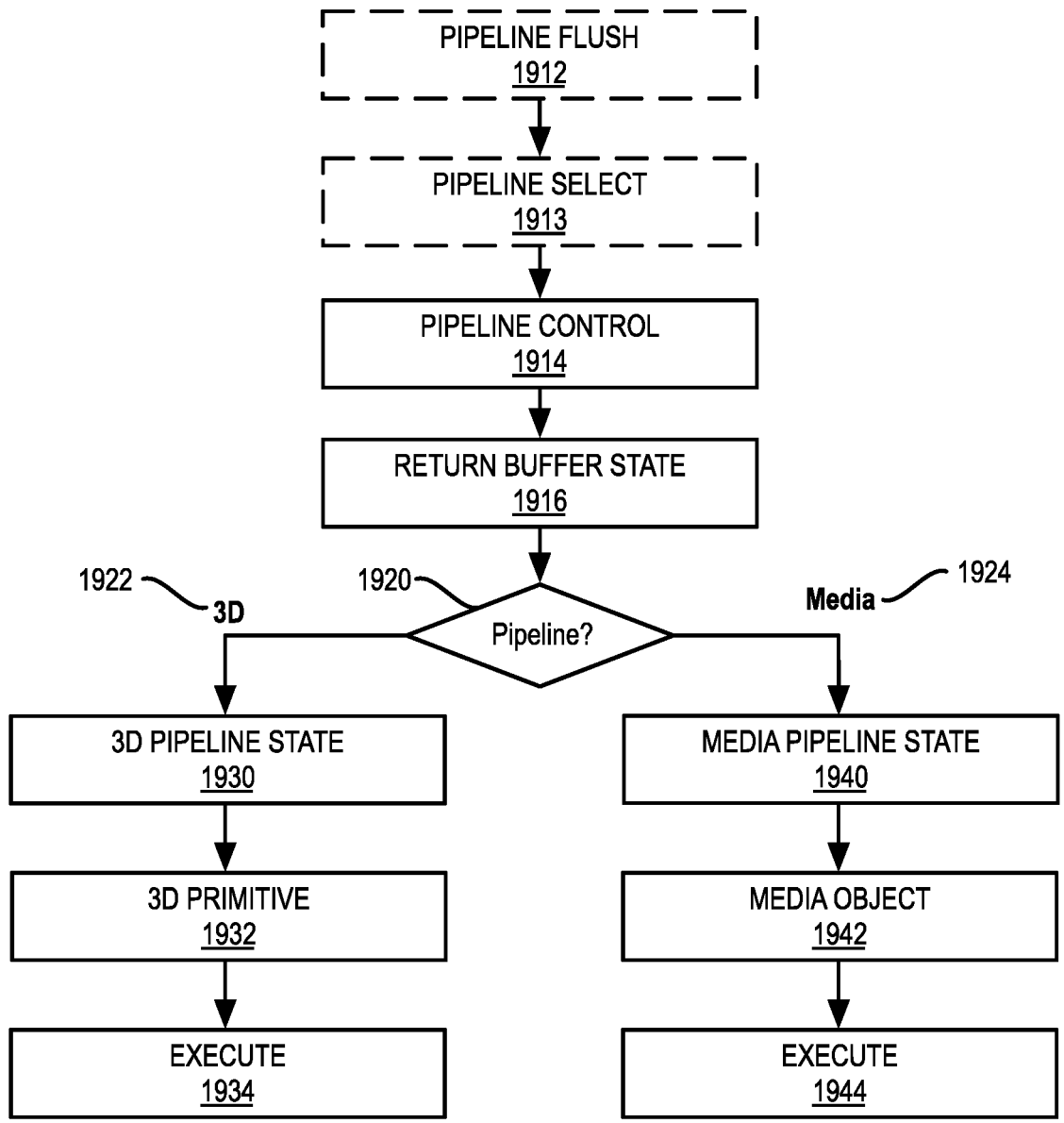

FIG. 19A is a block diagram illustrating a graphics processor command format 1900 according to some embodiments. FIG. 19B is a block diagram illustrating a graphics processor command sequence 1910 according to an embodiment. The solid lined boxes in FIG. 19A illustrate the components that are generally included in a graphics command while the dashed lines include components that are optional or that are only included in a sub-set of the graphics commands. The exemplary graphics processor command format 1900 of FIG. 19A includes data fields to identify a target client 1902 of the command, a command operation code (opcode) 1904, and the relevant data 1906 for the command. A sub-opcode 1905 and a command size 1908 are also included in some commands.

In some embodiments, client 1902 specifies the client unit of the graphics device that processes the command data. In some embodiments, a graphics processor command parser examines the client field of each command to condition the further processing of the command and route the command data to the appropriate client unit. In some embodiments, the graphics processor client units include a memory interface unit, a render unit, a 2D unit, a 3D unit, and a media unit. Each client unit has a corresponding processing pipeline that processes the commands. Once the command is received by the client unit, the client unit reads the opcode 1904 and, if present, sub-opcode 1905 to determine the operation to perform. The client unit performs the command using information in data field 1906. For some commands an explicit command size 1908 is expected to specify the size of the command. In some embodiments, the command parser automatically determines the size of at least some of the commands based on the command opcode. In some embodiments commands are aligned via multiples of a double word.

The flow diagram in FIG. 19B shows an exemplary graphics processor command sequence 1910. In some embodiments, software or firmware of a data processing system that features an embodiment of a graphics processor uses a version of the command sequence shown to set up, execute, and terminate a set of graphics operations. A sample command sequence is shown and described for purposes of example only as embodiments are not limited to these specific commands or to this command sequence. Moreover, the commands may be issued as batch of commands in a command sequence, such that the graphics processor will process the sequence of commands in at least partially concurrence.

In some embodiments, the graphics processor command sequence 1910 may begin with a pipeline flush command 1912 to cause any active graphics pipeline to complete the currently pending commands for the pipeline. In some embodiments, the 3D pipeline 1922 and the media pipeline 1924 do not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. In some embodiments, pipeline flush command 1912 can be used for pipeline synchronization or before placing the graphics processor into a low power state.

In some embodiments, a pipeline select command 1913 is used when a command sequence requires the graphics processor to explicitly switch between pipelines. In some embodiments, a pipeline select command 1913 is required only once within an execution context before issuing pipeline commands unless the context is to issue commands for both pipelines. In some embodiments, a pipeline flush command 1912 is required immediately before a pipeline switch via the pipeline select command 1913.

In some embodiments, a pipeline control command 1914 configures a graphics pipeline for operation and is used to program the 3D pipeline 1922 and the media pipeline 1924. In some embodiments, pipeline control command 1914 configures the pipeline state for the active pipeline. In one embodiment, the pipeline control command 1914 is used for pipeline synchronization and to clear data from one or more cache memories within the active pipeline before processing a batch of commands.

In some embodiments, return buffer state commands 1916 are used to configure a set of return buffers for the respective pipelines to write data. Some pipeline operations require the allocation, selection, or configuration of one or more return buffers into which the operations write intermediate data during processing. In some embodiments, the graphics processor also uses one or more return buffers to store output data and to perform cross thread communication. In some embodiments, the return buffer state 1916 includes selecting the size and number of return buffers to use for a set of pipeline operations.

The remaining commands in the command sequence differ based on the active pipeline for operations. Based on a pipeline determination 1920, the command sequence is tailored to the 3D pipeline 1922 beginning with the 3D pipeline state 1930 or the media pipeline 1924 beginning at the media pipeline state 1940.

The commands to configure the 3D pipeline state 1930 include 3D state setting commands for vertex buffer state, vertex element state, constant color state, depth buffer state, and other state variables that are to be configured before 3D primitive commands are processed. The values of these commands are determined at least in part based on the particular 3D API in use. In some embodiments, 3D pipeline state 1930 commands are also able to selectively disable or bypass certain pipeline elements if those elements will not be used.

In some embodiments, 3D primitive 1932 command is used to submit 3D primitives to be processed by the 3D pipeline. Commands and associated parameters that are passed to the graphics processor via the 3D primitive 1932 command are forwarded to the vertex fetch function in the graphics pipeline. The vertex fetch function uses the 3D primitive 1932 command data to generate vertex data structures. The vertex data structures are stored in one or more return buffers. In some embodiments, 3D primitive 1932 command is used to perform vertex operations on 3D primitives via vertex shaders. To process vertex shaders, 3D pipeline 1922 dispatches shader execution threads to graphics processor execution units.

In some embodiments, 3D pipeline 1922 is triggered via an execute 1934 command or event. In some embodiments, a register write triggers command execution. In some embodiments execution is triggered via a 'go' or 'kick' command in the command sequence. In one embodiment, command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

In some embodiments, the graphics processor command sequence 1910 follows the media pipeline 1924 path when performing media operations. In general, the specific use and manner of programming for the media pipeline 1924 depends on the media or compute operations to be performed. Specific media decode operations may be offloaded to the media pipeline during media decode. In some embodiments, the media pipeline can also be bypassed and media decode can be performed in whole or in part using resources provided by one or more general purpose processing cores. In one embodiment, the media pipeline also includes elements for general-purpose graphics processor unit (GPGPU) operations, where the graphics processor is used to perform SIMD vector operations using computational shader programs that are not explicitly related to the rendering of graphics primitives.

In some embodiments, media pipeline 1924 is configured in a similar manner as the 3D pipeline 1922. A set of commands to configure the media pipeline state 1940 are dispatched or placed into a command queue before the media object commands 1942. In some embodiments, media pipeline state commands 1940 include data to configure the media pipeline elements that will be used to process the media objects. This includes data to configure the video decode and video encode logic within the media pipeline, such as encode or decode format. In some embodiments, media pipeline state commands 1940 also support the use of one or more pointers to "indirect" state elements that contain a batch of state settings.

In some embodiments, media object commands 1942 supply pointers to media objects for processing by the media pipeline. The media objects include memory buffers containing video data to be processed. In some embodiments, all media pipeline states must be valid before issuing a media object command 1942. Once the pipeline state is configured and media object commands 1942 are queued, the media pipeline 1924 is triggered via an execute command 1944 or an equivalent execute event (e.g., register write). Output from media pipeline 1924 may then be post processed by operations provided by the 3D pipeline 1922 or the media pipeline 1924. In some embodiments, GPGPU operations are configured and executed in a similar manner as media operations.

Graphics Software Architecture

Figure 20:
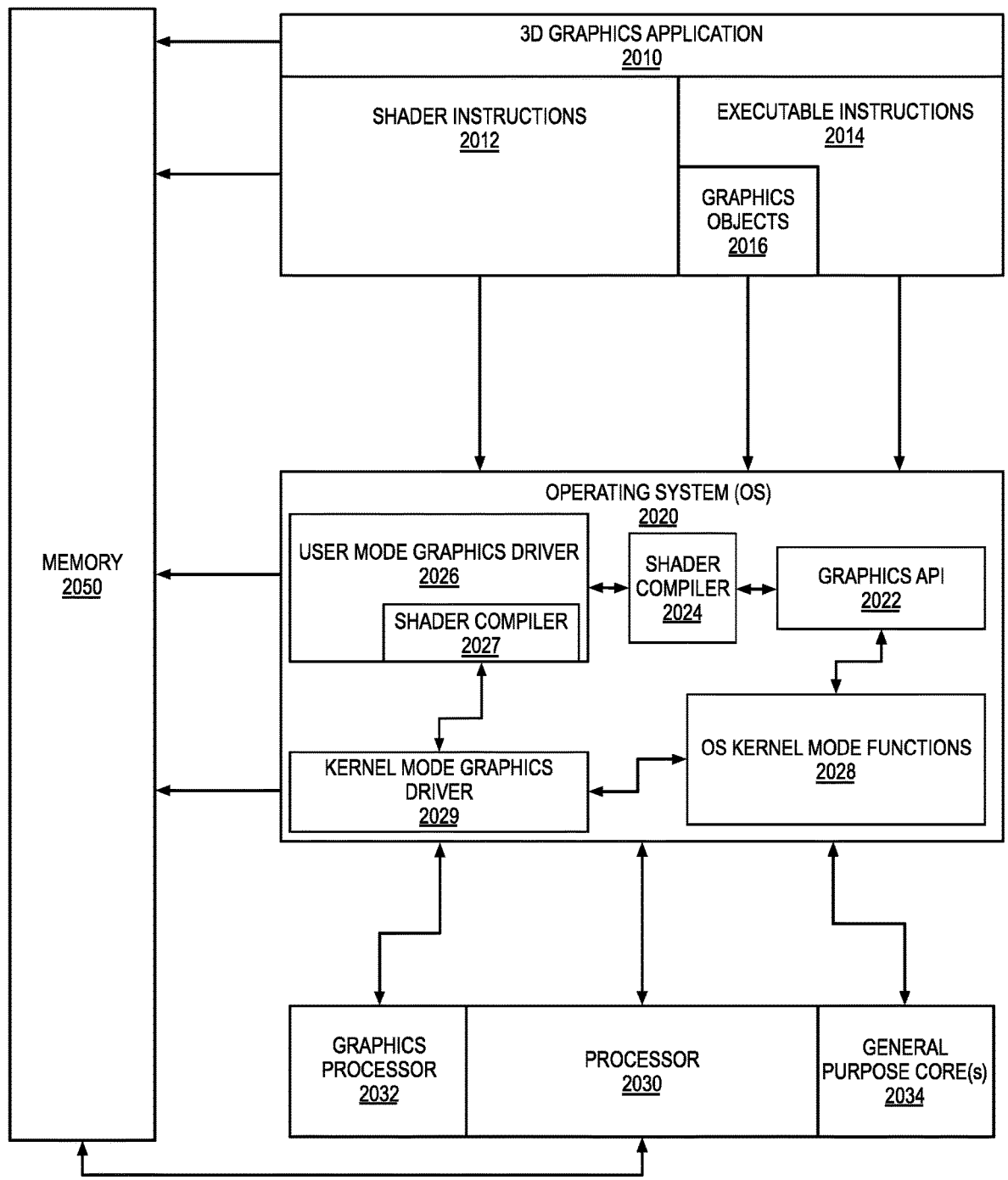
FIG. 20 illustrates exemplary graphics software architecture for a data processing system according to some embodiments.

FIG. 20 illustrates exemplary graphics software architecture for a data processing system 2000 according to some embodiments. In some embodiments, software architecture includes a 3D graphics application 2010, an operating system 2020, and at least one processor 2030. In some embodiments, processor 2030 includes a graphics processor 2032 and one or more general-purpose processor core(s) 2034. The graphics application 2010 and operating system 2020 each execute in the system memory 2050 of the data processing system.

In some embodiments, 3D graphics application 2010 contains one or more shader programs including shader instructions 2012. The shader language instructions may be in a high-level shader language, such as the High Level Shader Language (HLSL) or the OpenGL Shader Language (GLSL). The application also includes executable instructions 2014 in a machine language suitable for execution by the general-purpose processor core 2034. The application also includes graphics objects 2016 defined by vertex data.

In some embodiments, operating system 2020 is a Microsoft® Windows® operating system from the Microsoft Corporation, a proprietary UNIX-like operating system, or an open source UNIX-like operating system using a variant of the Linux kernel. The operating system 2020 can support a graphics API 2022 such as the Direct3D API, the OpenGL API, or the Vulkan API. When the Direct3D API is in use, the operating system 2020 uses a front-end shader compiler 2024 to compile any shader instructions 2012 in HLSL into a lower-level shader language. The compilation may be a just-in-time (JIT) compilation or the application can perform shader pre-compilation. In some embodiments, high-level shaders are compiled into low-level shaders during the compilation of the 3D graphics application 2010. In some embodiments, the shader instructions 2012 are provided in an intermediate form, such as a version of the Standard Portable Intermediate Representation (SPIR) used by the Vulkan API.

In some embodiments, user mode graphics driver 2026 contains a back-end shader compiler 2027 to convert the shader instructions 2012 into a hardware specific representation. When the OpenGL API is in use, shader instructions 2012 in the GLSL high-level language are passed to a user mode graphics driver 2026 for compilation. In some embodiments, user mode graphics driver 2026 uses operating system kernel mode functions 2028 to communicate with a kernel mode graphics driver 2029. In some embodiments, kernel mode graphics driver 2029 communicates with graphics processor 2032 to dispatch commands and instructions.

IP Core Implementations

One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 21:
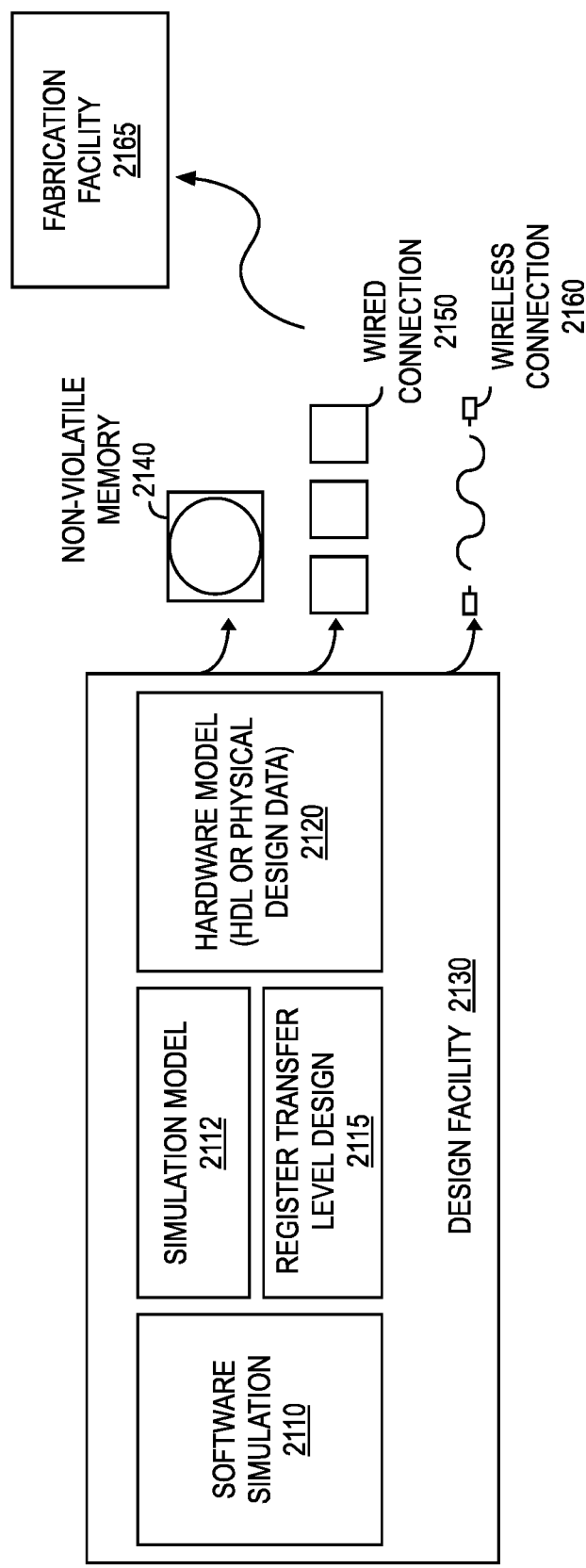
FIG. 21 is a block diagram illustrating an IP core development system, according to an embodiment.

FIG. 21 is a block diagram illustrating an IP core development system 2100 that may be used to manufacture an integrated circuit to perform operations according to an embodiment. The IP core development system 2100 may be used to generate modular, re-usable designs that can be incorporated into a larger design or used to construct an entire integrated circuit (e.g., an SOC integrated circuit). A design facility 2130 can generate a software simulation 2110 of an IP core design in a high level programming language (e.g., C/C++). The software simulation 2110 can be used to design, test, and verify the behavior of the IP core using a simulation model 2112. The simulation model 2112 may include functional, behavioral, and/or timing simulations. A register transfer level (RTL) design 2115 can then be created or synthesized from the simulation model 2112. The RTL design 2115 is an abstraction of the behavior of the integrated circuit that models the flow of digital signals between hardware registers, including the associated logic performed using the modeled digital signals. In addition to an RTL design 2115, lower-level designs at the logic level or transistor level may also be created, designed, or synthesized. Thus, the particular details of the initial design and simulation may vary.

The RTL design 2115 or equivalent may be further synthesized by the design facility into a hardware model 2120, which may be in a hardware description language (HDL), or some other representation of physical design data. The HDL may be further simulated or tested to verify the IP core design. The IP core design can be stored for delivery to a $3^{rd}$ party fabrication facility 2165 using non-volatile memory 2140 (e.g., hard disk, flash memory, or any non-volatile storage medium). Alternatively, the IP core design may be transmitted (e.g., via the Internet) over a wired connection 2150 or wireless connection 2160. The fabrication facility 2165 may then fabricate an integrated circuit that is based at least in part on the IP core design. The fabricated integrated circuit can be configured to perform operations in accordance with at least one embodiment described herein.

Exemplary System on a Chip Integrated Circuit

Figure 22:
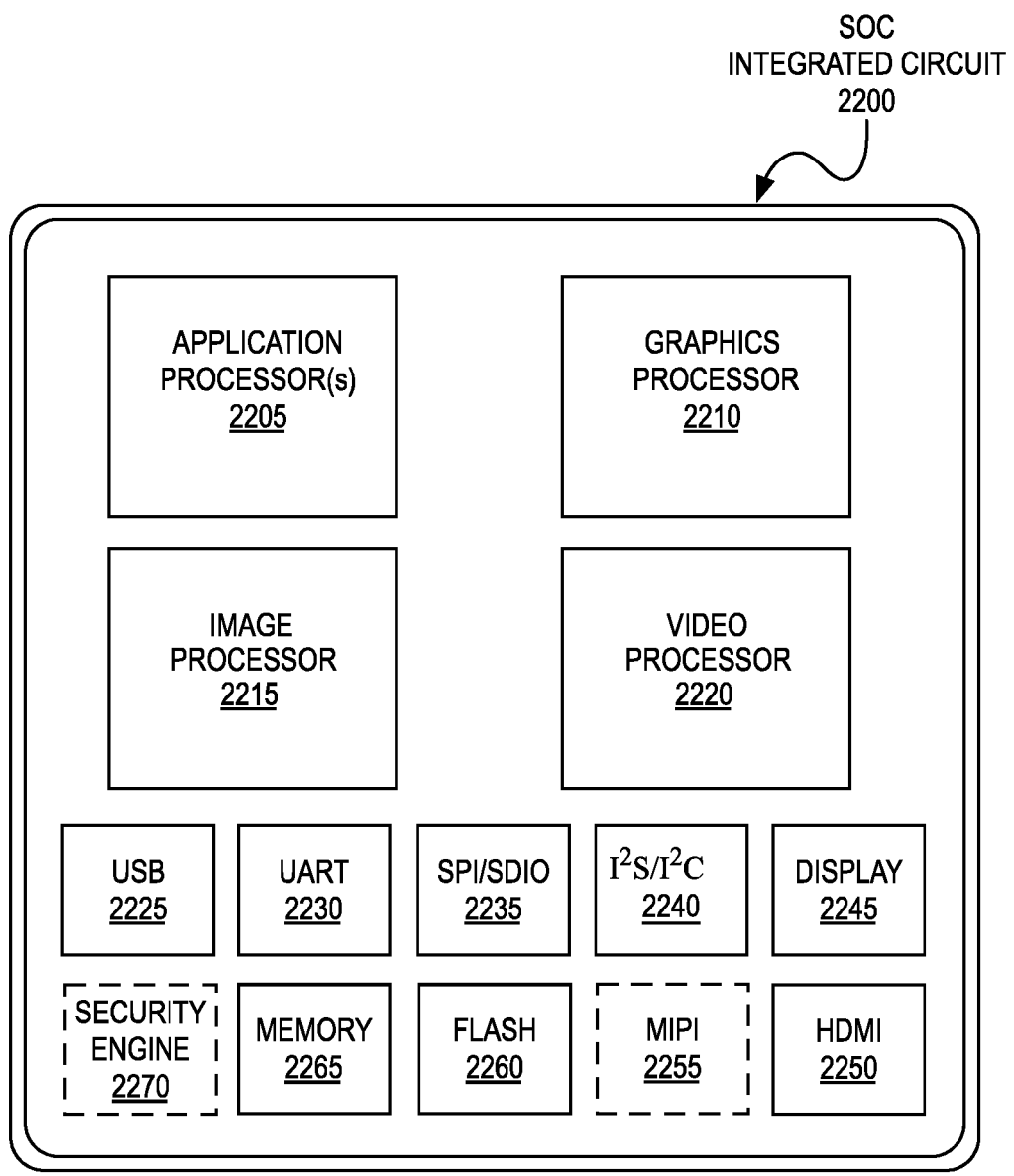
FIG. 22 is a block diagram illustrating an exemplary system on a chip integrated circuit, according to an embodiment.
Figure 23:
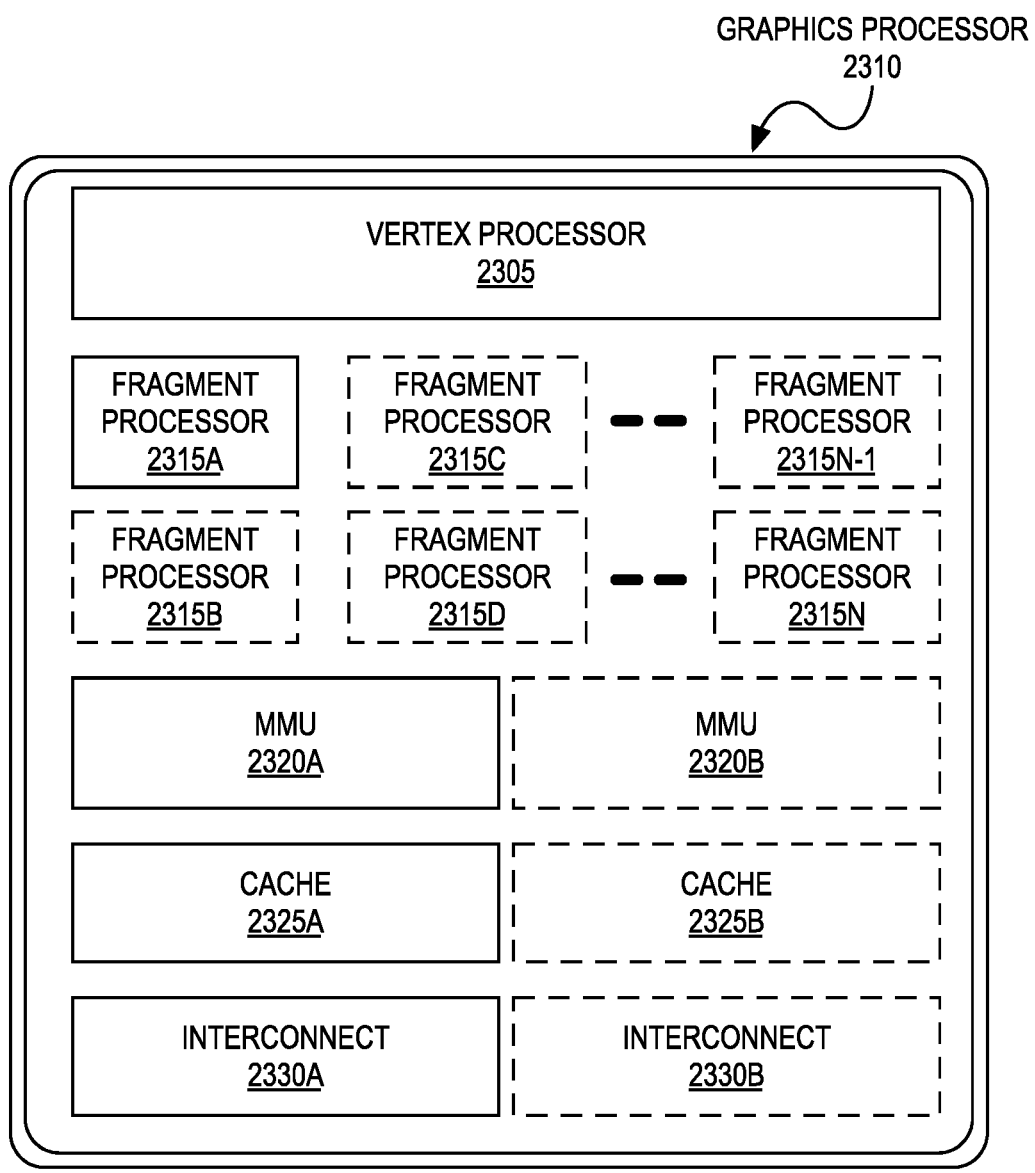
FIG. 23 is a block diagram illustrating an additional exemplary graphics processor.
Figure 24:
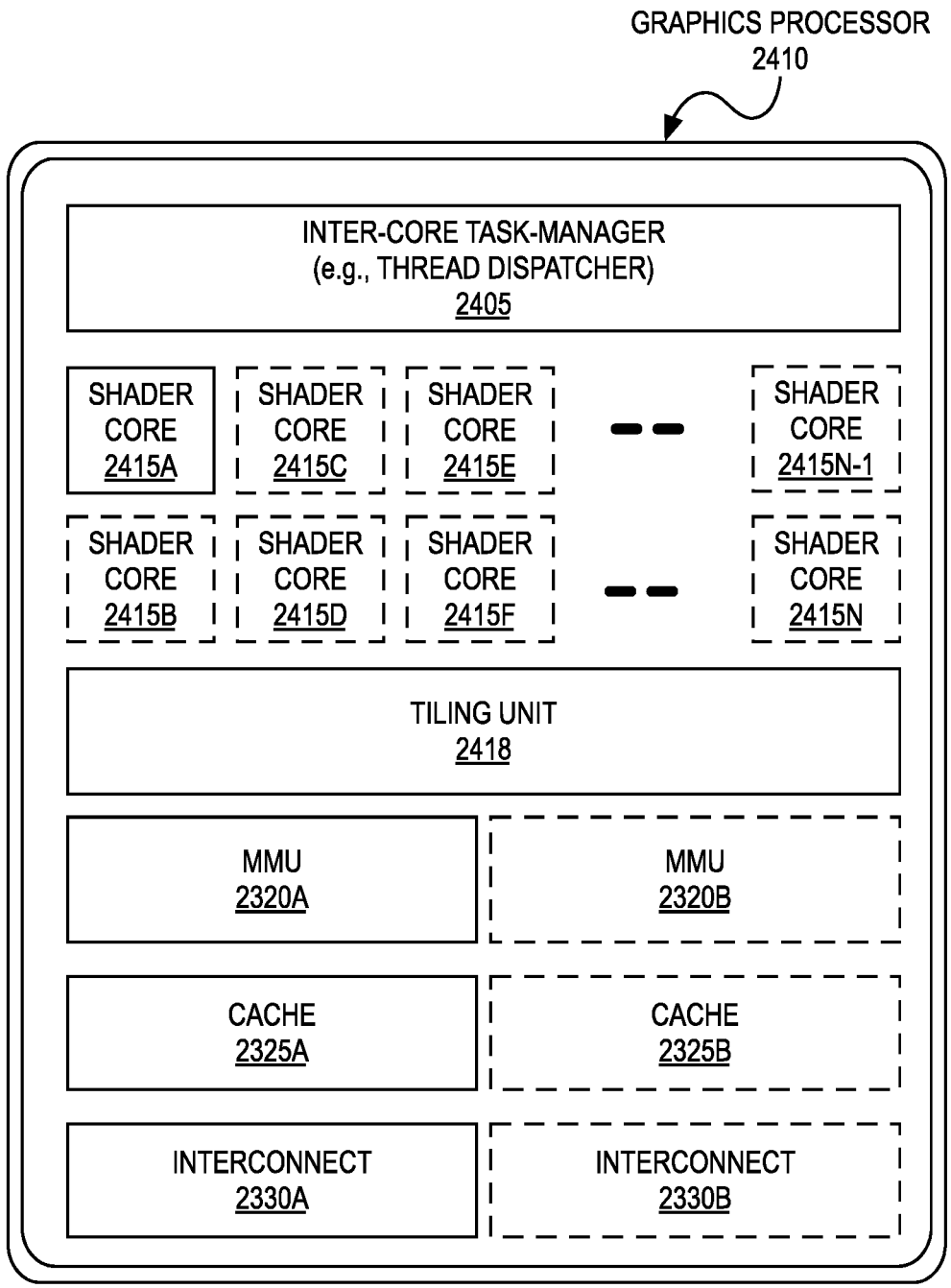
FIG. 24 is a block diagram illustrating an additional exemplary graphics processor of a system on a chip integrated circuit, according to an embodiment.

FIGS. 22-24 illustrated exemplary integrated circuits and associated graphics processors that may be fabricated using one or more IP cores, according to various embodiments described herein. In addition to what is illustrated, other logic and circuits may be included, including additional graphics processors/cores, peripheral interface controllers, or general purpose processor cores.

FIG. 22 is a block diagram illustrating an exemplary system on a chip integrated circuit 2200 that may be fabricated using one or more IP cores, according to an embodiment. Exemplary integrated circuit 2200 includes one or more application processor(s) 2205 (e.g., CPUs), at least one graphics processor 2210, and may additionally include an image processor 2215 and/or a video processor 2220, any of which may be a modular IP core from the same or multiple different design facilities. Integrated circuit 2200 includes peripheral or bus logic including a USB controller 2225, UART controller 2230, an SPI/SDIO controller 2235, and an $I^2S/I^2C$ controller 2240. Additionally, the integrated circuit can include a display device 2245 coupled to one or more of a high-definition multimedia interface (HDMI) controller 2250 and a mobile industry processor interface (MIPI) display interface 2255. Storage may be provided by a flash memory subsystem 2260 including flash memory and a flash memory controller. Memory interface may be provided via a memory controller 2265 for access to SDRAM or SRAM memory devices. Some integrated circuits additionally include an embedded security engine 2270.

FIG. 23 is a block diagram illustrating an exemplary graphics processor 2310 of a system on a chip integrated circuit that may be fabricated using one or more IP cores, according to an embodiment. Graphics processor 2310 can be a variant of the graphics processor 2210 of FIG. 22. Graphics processor 2310 includes a vertex processor 2305 and one or more fragment processor(s) 2315A-2315N (e.g., 2315A, 2315B, 2315C, 2315D, through 2315N-1, and 2315N). Graphics processor 2310 can execute different shader programs via separate logic, such that the vertex processor 2305 is optimized to execute operations for vertex shader programs, while the one or more fragment processor(s) 2315A-2315N execute fragment (e.g., pixel) shading operations for fragment or pixel shader programs. The vertex processor 2305 performs the vertex processing stage of the 3D graphics pipeline and generates primitives and vertex data. The fragment processor(s) 2315A-2315N use the primitive and vertex data generated by the vertex processor 2305 to produce a framebuffer that is displayed on a display device. In one embodiment, the fragment processor(s) 2315A-2315N are optimized to execute fragment shader programs as provided for in the OpenGL API, which may be used to perform similar operations as a pixel shader program as provided for in the Direct 3D API.

Graphics processor 2310 additionally includes one or more memory management units (MMUs) 2320A-2320B, cache(s) 2325A-2325B, and circuit interconnect(s) 2330A-2330B. The one or more MMU(s) 2320A-2320B provide for virtual to physical address mapping for integrated circuit 2310, including for the vertex processor 2305 and/or fragment processor(s) 2315A-2315N, which may reference vertex or image/texture data stored in memory, in addition to vertex or image/texture data stored in the one or more cache(s) 2325A-2325B. In one embodiment, the one or more MMU(s) 2325A-2325B may be synchronized with other MMUs within the system, including one or more MMUs associated with the one or more application processor(s) 2205, image processor 2215, and/or video processor 2220 of FIG. 22, such that each processor 2205-2220 can participate in a shared or unified virtual memory system. The one or more circuit interconnect(s) 2330A-2330B enable graphics processor 2310 to interface with other IP cores within the SoC, either via an internal bus of the SoC or via a direct connection, according to embodiments.

FIG. 24 is a block diagram illustrating an additional exemplary graphics processor 2410 of a system on a chip integrated circuit that may be fabricated using one or more IP cores, according to an embodiment. Graphics processor 2410 can be a variant of the graphics processor 2210 of FIG. 22. Graphics processor 2410 includes the one or more MMU(s) 2320A-2320B, caches 2325A-2325B, and circuit interconnects 2330A-2330B of the integrated circuit 2300 of FIG. 23.

Graphics processor 2410 includes one or more shader core(s) 2415A-2415N (e.g., 2415A, 2415B, 2415C, 2415D, 2415E, 2415F, through 2415N-1, and 2415N), which provides for a unified shader core architecture in which a single core or type or core can execute all types of programmable shader code, including shader program code to implement vertex shaders, fragment shaders, and/or compute shaders. The exact number of shader cores present can vary among embodiments and implementations. Additionally, graphics processor 2410 includes an inter-core task manager 2405, which acts as a thread dispatcher to dispatch execution threads to one or more shader cores 2415A-2415N and a tiling unit 2418 to accelerate tiling operations for tile-based rendering, in which rendering operations for a scene are subdivided in image space, for example to exploit local spatial coherence within a scene or to optimize use of internal caches.

The following examples pertain to further embodiments. Example one may be directed to an apparatus comprising a memory comprising one or more physical memory chips, and a processor to implement a working set monitor to monitor a working set resident in the one or more physical memory chips, wherein, the working set monitor is to adjust a number of the physical memory chips that are powered on based on a size of the working set. Example two may include the subject matter of example one or any other example herein, wherein the working set monitor is to power down one or more of the physical memory chips if the size of the working set may be reduced to a smaller number of the physical memory chips. Example three may include the subject matter of example one or any other example herein, wherein the working set monitor is to copy contents from a physical memory chip to be powered down to a physical memory chip to remain powered after reduction of the size of the working set. Example four may include the subject matter of example one or any other example herein, wherein the working set monitor is to power up one or more of the physical memory chips if the size of the working set is to be increased to a larger number of the physical memory chips. Example five may include the subject matter of example one or any other example herein, wherein the working set monitor is to evaluate memory usage of the application when the application starts up. Example six may include the subject matter of example one or any other example herein, wherein the working set monitor is to evaluate the memory usage of the application during a profiling pass. Example seven may include the subject matter of example one or any other example herein, wherein the working set monitor is to reevaluate memory usage of the application periodically. Example eight may include the subject matter of example one or any other example herein, wherein the working set monitor is to put one or more of the physical memory chips that are not needed for the working set into self-refresh mode. Example nine may include the subject matter of example one or any other example herein, wherein the working set monitor is to move active pages of the working set into a subset of the one or more physical memory chips, and to put another subset of the one or more physical memory chips into self-refresh mode. Example ten may include the subject matter of example one or any other example herein, wherein the processor is to comprise one or more of: a Graphics Processing Unit (GPU) or a processor core, or a combination thereof.

Example eleven is directed to a method comprising monitoring a working set resident in one or more physical memory chips, and adjusting a number of the physical memory chips that are powered on based on a size of the working set. Example twelve may include the subject matter of example eleven or any other example herein, wherein said adjusting comprises powering down one or more of the physical memory chips if the size of the working set may be reduced to a smaller number of the physical memory chips. Example thirteen may include the subject matter of example eleven or any other example herein, wherein said adjusting comprises copying contents from a physical memory chip to be powered down to a physical memory chip to remain powered after reduction of the size of the working set. Example fourteen may include the subject matter of example eleven or any other example herein, wherein said adjusting comprises powering up one or more of the physical memory chips if the size of the working set is to be increased to a larger number of the physical memory chips. Example fifteen may include the subject matter of example eleven or any other example herein, further comprising evaluating memory usage of the application when the application starts up. Example sixteen may include the subject matter of example eleven or any other example herein, further comprising evaluating the memory usage of the application during a profiling pass. Example seventeen may include the subject matter of example eleven or any other example herein, further comprising reevaluating memory usage of the application periodically. Example eighteen may include the subject matter of example eleven or any other example herein, wherein said adjusting comprises putting one or more of the physical memory chips that are not needed for the working set into self-refresh mode. Example nineteen may include the subject matter of example eleven or any other example herein, wherein said adjusting comprises moving active pages of the working set into a subset of the one or more physical memory chips, and putting another subset of the one or more physical memory chips into self-refresh mode.

Example twenty is directed to one or more computer-readable media comprising one or more instructions that, if executed on at least one processor, configure the at least one processor to perform one or more operations to monitor a working set resident in one or more physical memory chips, and adjust a number of the physical memory chips that are powered on based on a size of the working set. Example twenty-one may include the subject matter of example twenty or any other example herein, wherein the instructions, if executed, further configure the at least one processor to perform one or more operations to power down one or more of the physical memory chips if the size of the working set may be reduced to a smaller number of the physical memory chips. Example twenty-two may include the subject matter of example twenty or any other example herein, wherein the instructions, if executed, further configure the at least one processor to perform one or more operations to copy contents from a physical memory chip to be powered down to a physical memory chip to remain powered after reduction of the size of the working set. Example twenty-three may include the subject matter of example twenty or any other example herein, wherein the instructions, if executed, further configure the at least one processor to perform one or more operations to power up one or more of the physical memory chips if the size of the working set is to be increased to a larger number of the physical memory chips. Example twenty-four may include the subject matter of example twenty or any other example herein, wherein the instructions, if executed, further configure the at least one processor to perform one or more operations to evaluate memory usage of the application when the application starts up. Example twenty-five may include the subject matter of example twenty or any other example herein, wherein the instructions, if executed, further configure the at least one processor to perform one or more operations to evaluate the memory usage of the application during a profiling pass. Example twenty-six may include the subject matter of example twenty or any other example herein, wherein the instructions, if executed, further configure the at least one processor to perform one or more operations to reevaluate memory usage of the application periodically. Example twenty-seven may include the subject matter of example twenty or any other example herein, wherein the instructions, if executed, further configure the at least one processor to perform one or more operations to put one or more of the physical memory chips that are not needed for the working set into self-refresh mode. Example twenty-eight may include the subject matter of example twenty or any other example herein, wherein the instructions, if executed, further configure the at least one processor to perform one or more operations to move active pages of the working set into a subset of the one or more physical memory chips, and to put another subset of the one or more physical memory chips into self-refresh mode.

Example twenty-nine is directed to an apparatus comprising means for monitoring a working set resident in one or more physical memory chips, and means for adjusting a number of the physical memory chips that are powered on based on a size of the working set. Example thirty may include the subject matter of example twenty-nine or any other example herein, wherein said means for adjusting comprises means for powering down one or more of the physical memory chips if the size of the working set may be reduced to a smaller number of the physical memory chips. Example thirty-one may include the subject matter of example twenty-nine or any other example herein, wherein said means for adjusting comprises means for copying contents from a physical memory chip to be powered down to a physical memory chip to remain powered after reduction of the size of the working set. Example thirty-two may include the subject matter of example twenty-nine or any other example herein, wherein said means for adjusting comprises means for powering up one or more of the physical memory chips if the size of the working set is to be increased to a larger number of the physical memory chips. Example thirty-three may include the subject matter of example twenty-nine or any other example herein, further comprising means for evaluating memory usage of the application when the application starts up. Example thirty-four may include the subject matter of example twenty-nine or any other example herein, further comprising means for evaluating the memory usage of the application during a profiling pass. Example thirty-five may include the subject matter of example twenty-nine or any other example herein, further comprising means for reevaluating memory usage of the application periodically. Example thirty-six may include the subject matter of example twenty-nine or any other example herein, wherein said means for adjusting comprises means for putting one or more of the physical memory chips that are not needed for the working set into self-refresh mode. Example thirty-seven may include the subject matter of example twenty-nine or any other example herein, wherein said means for adjusting comprises means for moving active pages of the working set into a subset of the one or more physical memory chips, and means for putting another subset of the one or more physical memory chips into self-refresh mode.

Example thirty-eight is directed to a machine-readable medium including code, when executed, to cause a machine to perform the method of any one of the examples herein. Example thirty-nine is directed to an apparatus comprising means to perform a method as recited any of the examples herein. Example forty is directed to machine-readable storage including machine-readable instructions, when executed, to implement a method or realize an apparatus as recited in any of the examples herein.

In various embodiments, the operations discussed herein, e.g., with reference to figures herein, may be implemented as hardware (e.g., logic circuitry), software, firmware, or combinations thereof, which may be provided as a computer program product, e.g., including one or more tangible (e.g., non-transitory) machine-readable or computer-readable medium having stored thereon instructions (or software procedures) used to program a computer to perform a process discussed herein. The machine-readable medium may include a storage device such as those discussed with respect to figures herein.

Additionally, such computer-readable media may be downloaded as a computer program product, wherein the program may be transferred from a remote computer (e.g., a server) to a requesting computer (e.g., a client) by way of data signals provided in a carrier wave or other propagation medium via a communication link (e.g., a bus, a modem, or a network connection).

Reference in the specification to "one embodiment" or "an embodiment" means that a particular feature, structure, and/or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The foregoing description and drawings are to be regarded in an illustrative rather than a restrictive sense. Persons skilled in the art will understand that various modifications and changes may be made to the embodiments described herein without departing from the broader spirit and scope of the invention as set forth in the appended claims.

What is claimed is:

1. An apparatus comprising:
   a memory comprising one or more physical memory chips; and
   memory monitor logic circuitry to monitor a working set resident in the one or more physical memory chips, wherein the working set includes physical data stored in the one or more physical memory chips,
   wherein, the memory monitor logic circuitry is to adjust a number of the physical memory chips that are powered on based at least in part on a size of the working set, wherein the number of the physical memory chips that are powered on is to be evaluated on a periodic basis during active execution of a graphics application according to a comparison between a memory requirement of a first frame of work and a memory requirement of a second frame of work.

2. The apparatus of claim 1, wherein the memory monitor logic circuitry is to cause at least one of the one or more physical memory chips to power down in response to reduction of the size of the working set.

3. The apparatus of claim 2, wherein the memory monitor logic circuitry is to cause copying of contents from a first physical memory chip from the one or more physical memory chips that is to be powered down to a second physical memory chip from the one or more physical memory chips that is to remain powered after reduction of the size of the working set.

4. The apparatus of claim 1, wherein the memory monitor logic circuitry is to cause one or more of the physical memory chips to power up in response to and increase the size of the working set.

5. The apparatus of claim 1, wherein the memory monitor logic circuitry is to evaluate memory usage of the graphics application after the application starts up.

6. The apparatus of claim 1, wherein the memory monitor logic circuitry is to evaluate the memory usage of the graphics application during a profiling pass.

7. The apparatus of claim 1, wherein the memory monitor logic circuitry is to reevaluate memory usage of the graphics application periodically.

8. The apparatus of claim 1, wherein the memory monitor logic circuitry is to cause one or more of the physical memory chips that are not needed for the working set to enter into self-refresh mode.

9. The apparatus of claim 1, wherein the memory monitor logic circuitry is to move active pages of the working set into a subset of the one or more physical memory chips, and to cause entry of another subset of the one or more physical memory chips into self-refresh mode.

10. The apparatus of claim 1, wherein a processor comprises the memory monitor logic circuitry.

11. The apparatus of claim 10, wherein the processor comprises one or more of: a Graphics Processing Unit (GPU), at least one processor core, or a combination thereof.

12. A computing system comprising:
    a memory comprising one or more physical memory chips;
    a processor, coupled to the memory, to access at least one of the one or more physical memory chips; and
    memory monitor logic circuitry to monitor a working set resident in the one or more physical memory chips, wherein the working set includes physical data stored in the one or more physical memory chips,
    wherein, the memory monitor logic circuitry is to adjust a number of the physical memory chips that are powered on based at least in part on a size of the working set, wherein the number of the physical memory chips that are powered on is to be evaluated on a periodic basis during active execution of a graphics application according to a comparison between a memory requirement of a first frame of work and a memory requirement of a second frame of work.

13. The computing system of claim 12, wherein the memory monitor logic circuitry is to cause at least one of the one or more physical memory chips to power down in response to reduction of the size of the working set.

14. The computing system of claim 13, wherein the memory monitor logic circuitry is to cause copying of contents from a first physical memory chip from the one or more physical memory chips that is to be powered down to a second physical memory chip from the one or more physical memory chips that is to remain powered after reduction of the size of the working set.

15. The computing system of claim 12, wherein the memory monitor logic circuitry is to cause one or more of the physical memory chips to power up in response to and increase the size of the working set.

16. One or more non-transitory computer-readable media comprising one or more instructions that when executed on a processor configure the processor to perform one or more operations to:
  cause memory monitor logic to monitor a working set resident in one or more physical memory chips, wherein the working set includes physical data stored in the one or more physical memory chips,
  wherein, the memory monitor logic is to adjust a number of the physical memory chips that are powered on based at least in part on a size of the working set, wherein the number of the physical memory chips that are powered on is to be evaluated on a periodic basis during active execution of a graphics application according to a comparison between a memory requirement of a first frame of work and a memory requirement of a second frame of work.

17. The one or more computer-readable media of claim 16, further comprising one or more instructions that when executed on the at least one processor configure the at least one processor to perform one or more operations to cause at least one of the one or more physical memory chips to power down in response to reduction of the size of the working set.

18. The one or more computer-readable media of claim 17, further comprising one or more instructions that when executed on the at least one processor configure the at least one processor to perform one or more operations to cause copying of contents from a first physical memory chip from the one or more physical memory chips that is to be powered down to a second physical memory chip from the one or more physical memory chips that is to remain powered after reduction of the size of the working set.

19. The one or more computer-readable media of claim 16, further comprising one or more instructions that when executed on the at least one processor configure the at least one processor to perform one or more operations to cause one or more of the physical memory chips to power up in response to and increase the size of the working set.

20. The one or more computer-readable media of claim 16, further comprising one or more instructions that when executed on the at least one processor configure the at least one processor to perform one or more operations to evaluate the memory usage of the graphics application during a profiling pass.

* * * * *